(12) United States Patent
Volz et al.

(10) Patent No.: US 9,917,270 B1
(45) Date of Patent: Mar. 13, 2018

(54) ORGANIC ELECTROLUMINESCENT DEVICE HAVING AN EXCITON QUENCHING LAYER

(71) Applicant: CYNORA GMBH, Bruchsal (DE)

(72) Inventors: Daniel Volz, Karlsruhe (DE); Harald Flugge, Karlsruhe (DE); Patrick Pingel, Potsdam (DE); Georgios Liaptsis, Mannheim (DE)

(73) Assignee: CYNORA GMBH (DE)

( * ) Notice: Subject to any disclaimer, the term of this patent is extended or adjusted under 35 U.S.C. 154(b) by 0 days.

(21) Appl. No.: 15/588,961

(22) Filed: May 8, 2017

(51) Int. Cl.
 *H01L 51/50* (2006.01)
 *H01L 51/52* (2006.01)
 *H01L 51/00* (2006.01)

(52) U.S. Cl.
 CPC ...... *H01L 51/5008* (2013.01); *H01L 51/5004* (2013.01); *H01L 51/5012* (2013.01); *H01L 51/5016* (2013.01); *H01L 51/5032* (2013.01); *H01L 51/5072* (2013.01); *H01L 51/5206* (2013.01); *H01L 51/5221* (2013.01); *H01L 51/5296* (2013.01); *H01L 51/0055* (2013.01); *H01L 51/0058* (2013.01); *H01L 51/0061* (2013.01); *H01L 51/0067* (2013.01); *H01L 51/0072* (2013.01); *H01L 51/0077* (2013.01); *H01L 2251/552* (2013.01); *H01L 2251/558* (2013.01)

(58) Field of Classification Search
 CPC ............. H01L 51/0056; H01L 51/0061; H01L 51/0067; H01L 51/0072; H01L 51/0077; H01L 51/50; H01L 51/5004; H01L 51/5008; H01L 51/5072; H01L 51/5206; H01L 51/5221; H01L 2251/552
 See application file for complete search history.

(56) References Cited

U.S. PATENT DOCUMENTS

2017/0229671 A1* 8/2017 Adamovich ........ H01L 51/5028

* cited by examiner

*Primary Examiner* — Hoai V Pham
(74) *Attorney, Agent, or Firm* — J.A. Lindeman & Co., PLLC

(57) ABSTRACT

The present invention relates to a an organic electroluminescent device comprising an exciton quenching layer C located between the a light-emitting layer B and an electron-transport layer D, wherein the exciton quenching layer C comprises at least one emitter $E^C$ and at least 80% by weight of at least one electron transport material $ETM^D$.

19 Claims, No Drawings

ORGANIC ELECTROLUMINESCENT DEVICE HAVING AN EXCITON QUENCHING LAYER

The present invention relates to an organic electroluminescent device comprising an exciton quenching layer C located between the a light-emitting layer B and an electron-transport layer D, wherein the exciton quenching layer C comprises at least one emitter $E^C$ and at least 80% by weight of at least one electron transport material $ETM^D$.

Organic electroluminescent devices containing one or more light-emitting layers based on organics such as, e.g., organic light emitting diodes (OLEDs), light emitting electrochemical cells (LECs) and light-emitting transistors gain increasing importance. In particular, OLEDs are promising devices for electronic products such as, e.g., screens, displays and illumination devices. In contrast to most electroluminescent devices essentially based on inorganics, organic electroluminescent devices based on organics are often rather flexible and producible in particularly thin layers. The OLED-based screens and displays already available today bear particularly beneficial brilliant colors, contrasts and are comparably efficient with respect to their energy consumption.

A central element of an organic electroluminescent device for generating light is a light-emitting layer placed between an anode and a cathode. When a voltage (and current) is applied to an organic electroluminescent device, holes and electrons are injected from an anode and a cathode, respectively, to the light-emitting layer. Typically a hole transport layer is located between light-emitting layer and the anode, and an electron transport layer is located between light-emitting layer and the cathode. The different layers are sequentially disposed. Excitons of high energy are then generated by recombination of the holes and the electrons. The decay of such excited states (e.g., singlet states such as S1 and/or triplet states such as T1) to the ground state (S0) desirably leads to light emission. In order to enable efficient energy transport and emission, an organic electroluminescent device comprises one or more host compounds and one or more emitter compounds as dopants.

Often, organic electroluminescent devices comprise, between their anode layer and the cathode layer, a light-emitting layer comprising one or more emitter compounds and an electron-transport layer comprising electron transport material. In the emission spectrum, an undesired broadened emission peak is often found which is often due to the emission of the electron transport material. Thereby, the emission wavelength range of blue organic electroluminescent devices is partly shifted to shorter wavelengths thereby loosing quantum yield in the desired range.

Challenges when generating organic electroluminescent devices are thus the improvement of the illumination level of the devices (i.e., brightness per current), obtaining a desired light spectrum and achieving suitable lifespans. There is still a lack of efficient and stable OLEDs that emit in the deep-blue region of the visible light spectrum, which would be expressed by a small $CIE_y$ value Due to the imbalanced charge transport within the emitting layer, frequently emission form the adjacent electron transport layers (ETLs) is observed in emission spectra of OLEDs. This emission typically appears at non-desired (short) wavelengths and due to the low efficiency of the electron transport materials compared to the combined host/ emitter systems of the emission layer, efficiency losses occur due to the ETL emission. By incorporating hole blocking layer, this emission and thus efficiency losses can be avoided, but the lifetime of the devices is typically shortened significantly.

In devices typical in the art, charge carrier recombination and exciton formation occurs close to the interface between the electron transport layer and the light-emitting layer. Thereby, only part of the excitons are formed within the light-emitting layer (by electrons injected into the light-emitting layer), while another part of the excitons are formed within the electron transport layer (accumulated electrons at the electron transport layer side of the interface). This ratio is roughly determined by the ability of the electron transport layer to inject electrons into the light-emitting layer. Part of the excitons in the light-emitting layer can also be transferred to the electron transport material. Those excitons can either decay radiation-less (reducing internal quantum efficiency) or by light emission (usually a very fast fluorescent decay) which can often be observed as a short-wavelength shoulder in the emission spectra of organic electroluminescent devices. Exciton quenching by the electron transport material and exciton formation within the electron transport material thus effectively reduce the exciton and polaron densities, but also the device efficiency because typical electron transport materials bear rather small quantum yields. Also the lifetime of the organic electroluminescent devices may decrease.

Accordingly, there is still the unmet need for organic electroluminescent devices which have a long lifetime and high quantum yields, in particular in the blue range.

Surprisingly, it has been found that placing an exciton quenching layer between an organic electroluminescent device's light-emitting layer and its electron-transport layer provides an organic electroluminescent device having good lifetime and quantum yields.

SUMMARY OF THE INVENTION

Accordingly, an aspect of the present invention relates to an organic electroluminescent device comprising:
(A) an anode layer A;
(B) a light-emitting layer B comprising at least one host material $H^B$ and at least one emitter $E^B$, wherein the light-emitting layer B does not comprise more than 20% by weight of an electron transport material $ETM^D$;
(C) an exciton quenching layer C comprising at least one emitter $E^C$ and at least 80% by weight of at least one electron transport material $ETM^D$;
(D) an electron-transport layer D comprising at least one electron transport material $ETM^D$; and
(E) a cathode layer K,
wherein the layers are arranged in the sequential order in the following order (A)-(B)-(C)-(D)-(E), wherein optionally one or more additional layers may be present between the anode layer A and the light-emitting layer B, between electron-transport layer D and the cathode layer K, or each between the anode layer A and the light-emitting layer B and between electron-transport layer D and the cathode layer K, and
wherein the exciton quenching layer C is adjacent to both the light-emitting layer B and the electron-transport layer D.

In other words, the present invention relates to an organic electroluminescent device comprising an anode A; a cathode K; a light-emitting layer B located between anode A and cathode K comprising at least one host material $H^B$ and at least one emitter $E^B$ (said light-emitting layer B not comprising more than 20% by weight of an electron transport material $ETM^D$); a exciton quenching layer C (also (assisting) light-emitting layer C) comprising at least one emitter $E^C$; and an electron-transport layer D between the cathode K and the light-emitting layer B comprising at least one electron transport material $ETM^D$;

wherein the exciton quenching layer C is adjacent to both the light-emitting layer B and the electron-transport layer D, and wherein the exciton quenching layer C comprises at least 80% by weight of the at least one electron transport material $ETM^D$.

As used herein, the term "adjacent to" means that the exciton quenching layer C is in direct contact with the light-emitting layer B as well as the electron-transport layer D. This allows that electrons are transferred from the electron-transport layer D to the exciton quenching layer C and from the exciton quenching layer C to the light-emitting layer B.

Preferably, the (at least one) electron transport material $ETM^D$ as used in layers C and D and optionally B is each the same. The person skilled in the art understands what is meant by an electron transport material, i.e., a material that enables the efficient transport of electrons from the cathode (or hole injection layer) to the light-emitting layer B (in an organic electroluminescent device known in the art) and the exciton quenching layer C according to the present invention, respectively. Exemplarily, the layers C and D and optionally B comprise a single or a mixture of two or a mixture of three electron transport materials. In particular, layers C and D and optionally B, each comprise a single electron transport material $ETM^D$ that is the same in layers C and D and, if present, B.

Preferably, layer B the light-emitting layer B does not comprise more than 15% by weight, more preferably not more than 15% by weight, even more preferably not more than 10% by weight, even more preferably not more than 5% by weight, of an electron transport material $ETM^D$, in particular does (essentially) not comprise any electron transport material $ETM^D$.

According to the invention the exciton quenching layer C is located adjacent to both the light-emitting layer B and the electron-transport layer D, and the exciton quenching layer C comprises at least 80% by weight of the at least one electron transport material $ETM^D$.

It was surprisingly found that introducing such exciton quenching layer C between the a light-emitting layer B and the electron-transport layer D may reduce the undesired emission of the at least one electron transport material and thereby narrows the emission spectrum of the organic luminescent device and thereby increases quantum yield in the visible range of the emission spectrum. In particular, this may lead to an increase in quantum yield in the blue range. Furthermore, stability and lifetime of the device may be improved.

It will be understood that the organic electroluminescent device according to the present invention may optionally further comprise additionally layers such as those selected from the group consisting of, e.g., a hole-transport layer (HTL) located between the anode layer A, and/or an electron injection layer (EIL) located between the electron transport layer (ETL) D and the cathode layer K.

According to a preferred embodiment of the present invention, said organic electroluminescent device is a device selected from the group consisting of an organic light emitting diode (OLED), a light emitting electrochemical cell (LEC), and a light-emitting transistor.

According to a preferred embodiment of the present invention, the at least one emitter compound $E^B$ is a thermally activated delayed fluorescence (TADF) emitter.

According to a preferred embodiment of the present invention, the at least one emitter compound $E^C$ is a fluorescence emitter.

In a preferred embodiment of the present invention, the exciton quenching layer C comprises 90-99.95% by weight, more preferably 95-99% by weight, in particular 97-98% by weight, of the at least one electron transport material $ETM^D$.

In a preferred embodiment of the present invention, the exciton quenching layer C comprises 0.05-10% by weight, more preferably 1-5% by weight, in particular 2-3% by weight, of the at least one emitter compound $E^C$.

According to a more preferred embodiment of the present invention, the exciton quenching layer C comprises (or (essentially) consists of):

(i) 90-99.95% by weight, preferably 95-99% by weight, in particular 97-98% by weight, of the at least one electron transport material $ETM^D$; and (ii) 0.05-10% by weight, preferably 1-5% by weight, in particular 2-3% by weight, of the at least one emitter compound $E^C$.

According the exciton quenching layer C preferably comprises (or (essentially) consists of):

95-99% by weight of the at least one electron transport material $ETM^D$; and 1-5% by weight of the at least one emitter compound $E^C$.

Particularly preferably, the exciton quenching layer C comprises (or (essentially) consists of):

97-98% by weight of the at least one electron transport material $ETM^D$; and 2-3% by weight of the at least one emitter compound $E^C$.

In a preferred embodiment, the light-emitting layer B comprises 5-99% by weight, more preferably 10-94.9% by weight, in particular 15-89% by weight, of at least one host compound $H^B$. In another preferred embodiment of the present invention, the light-emitting layer B comprises 5-99% by weight, more preferably 30-94.9% by weight, in particular 40-89% by weight, of at least one host compound $H^B$.

In a preferred embodiment, the light-emitting layer B comprises 1-50% by weight, more preferably 5-40% by weight, in particular 10-30% by weight, of at least one emitter compound $E^B$. In another preferred embodiment of the present invention, the light-emitting layer B comprises 1-50% by weight, more preferably 5-40% by weight, in particular 10-30% by weight, of at least one emitter compound $E^B$.

Optionally, the light-emitting layer B further comprises up 94% by weight of at least one further host compound $H^{B2}$ differing from $H^B$. In a preferred embodiment, the light-emitting layer B comprises 0.1-85% by weight, in particular 1-75% by weight, of at least one further host compound $H^{B2}$ differing from $H^B$. In another referred embodiment of the present invention, the light-emitting layer B further comprises 0.1-65% by weight, in particular 1-50% by weight, of at least one further host compound $H^{B2}$ differing from $H^B$.

Optionally, the light-emitting layer B further comprises up to 65% by weight, in particular 0-50% by weight, of one or more solvents.

According, in a preferred embodiment, the light-emitting layer B comprises (or (essentially) consists of):

(i) 5-99% by weight, preferably 10-94.9% by weight, in particular 15-89% by weight, of at least one host compound $H^B$;

(ii) 1-50% by weight, preferably 5-40% by weight, in particular 10-30% by weight, of at least one emitter compound $E^B$; and optionally
(iii) 0-94% by weight, preferably 0.1-85% by weight, in particular 1-75% by weight, of at least one or more further host compounds $H^{B2}$ differing from $H^B$; and optionally
(iv) 0-94 by weight, preferably 0-65% by weight, in particular 0-50% by weight, of one or more solvents.

Accordingly, in a more preferred embodiment of the present invention, the light-emitting layer B comprises (or (essentially) consists of):
(i) 10-94.9 by weight of at least one host compound $H^B$;
(ii) 5-40% by weight of at least one emitter compound $E^B$; and optionally
(iii) 0.1-85% by weight of at least one further host compound $H^{B2}$ differing from $H^B$; and optionally
(iv) 0-65% by weight of one or more solvents.

According to a highly preferred embodiment of the present invention, the light-emitting layer B comprises (or (essentially) consists of):
(i) 5-89% by weight of at least one host compound $H^B$;
(ii) 10-30% by weight of at least one emitter compound $E^B$; and optionally
(iii) 1-85% by weight of at least one further host compound $H^{B2}$ differing from $H^B$; and optionally
(iv) 0-65% by weight of one or more solvents.

According to another preferred embodiment of the present invention, the light-emitting layer B comprises (or (essentially) consists of): 5-99% by weight of at least one host compound $H^B$; 1-50% by weight, of at least one emitter compound $E^B$; and optionally 0-94% by weight of one or more further host compounds $H^{B2}$ differing from $H^B$; and optionally 0-94% of one or more solvents.

Accordingly, the light-emitting layer B preferably comprises (or (essentially) consists of):
30-94.9% by weight of at least one host compound $H^B$;
5-40% by weight of at least one emitter compound $E^B$; and
0.1-65% of at least one further host compound $H^{B2}$ differing from $H^B$; and
optionally by weight, preferably 0-65% by weight of one or more solvents.

The light-emitting layer B may also comprise (or (essentially) consist of):
40-89% by weight of at least one host compound $H^B$;
10-30% by weight, of at least one emitter compound $E^B$; and
1-50% by weight of at least one further host compound $H^{B2}$ differing from $H^B$; and
optionally 0-50% by weight of one or more solvents.

According to an alternative preferred embodiment, the emission layer B comprises (or (essentially) consists of):
(i) 10-45% by weight of at least one host compound $H^B$;
(ii) 5-40% by weight of the at least one emitter compound $E^B$; and
(ii) 50-85% by weight at least one further host compound $H^{B2}$ differing from $H^B$.

According to a more preferred alternative preferred embodiment, the emission layer B comprises (or (essentially) consists of):
(i) 15-30% by weight, of at least one host compound $H^B$;
(ii) 10-30% by weight of the at least one emitter compound $E^B$; and
(ii) 60-75% by weight of at least one further host compound $H^{B2}$ differing from $H^B$.

According to a preferred embodiment of the present invention, the electron-transport layer D comprises more than 89.9% by weight, preferably more than 94.9% by weight, in particular more than 98.9% by weight, referred to the electron transporting components, of at least one electron transport material $ETM^D$.

The electron-transport layer D may optionally comprise 20 to 90% by weight, preferably 40 to 85% by weight, more preferably 60 to 80% by weight, in particular 70-89% by weight (e.g., (around) 75% by weight) of materials not suitable for transporting electrons such as, e.g., Liq (8-hydroxyquinolinolatolithium). Such materials may be used as filers to prevent the generation of fast transport channels of electrons and to provide a uniform electron transport through the whole electron-transport layer D.

According to a preferred embodiment of the present invention, the at least one emitter compound $E^B$ exhibits an emission with an emission maximum $\lambda_{max}(E^B)$ and a full width at half maximum $FWHM(E^B)$ and the at least one emitter compound $E^C$ exhibits an emission with an emission maximum $\lambda_{max}(E^C)$ and a full width at half maximum $FWHM(E^C)$, and $E^C$ exhibits an emission maximum $\lambda_{max}(E^C)$ at a shorter or equal wavelength than $E^B$ ($\lambda_{max}(E^B) \geq \lambda_{max}(E^C)$), more preferably $\lambda_{max}(E^B) > \lambda_{max}(E^C)$. In a further embodiment of the present invention, the emission $E^C$ exhibits an emission maximum $\lambda_{max}(E^C)$ at a shorter wavelength than $E^B$ and the difference between the $\lambda_{max}(E^B)$ and $\lambda_{max}(E^C)$ is smaller than the full width at half maximum of $E^B$ ($\lambda_{max}(E^B) \geq \lambda_{max}(E^C) \geq [\lambda_{max}(E^B)-FWHM(E^B)]$). In a further embodiment of the present invention, the emission $E^C$ exhibits an emission maximum $\lambda_{max}(E^C)$ at a shorter wavelength than $E^B$ and the difference between the $\lambda_{max}(E^B)$ and $\lambda_{max}(E^C)$ is smaller than half the full width at half maximum of $E^B$ ($\lambda_{max}(E^B) \geq \lambda_{max}(E^C) \geq [\lambda_{max}(E^B)-FWHM(E^B)/2]$).

According to a preferred embodiment of the present invention, the at least one emitter compound $E^C$ has a lowest unoccupied molecular orbital $LUMO(E^C)$ having an energy $E^{LUMO}(E^C)$ and the at least one electron transport material $ETM^D$ has a lowest unoccupied molecular orbital LUMO ($ETM^D$) having an energy $E^{LUMO}(ETM^D)$ and $LUMO(E^C)$ has an higher or equal energy compared to $LUMO(ETM^D)$ ($E^{LUMO}(E^C) \geq E^{LUMO}(ETM^D)$). In a further embodiment, $LUMO(E^C)$ is less than 0.3 eV or exactly 0.3 eV higher in energy than $LUMO(ETM^D)$ ($E^{LUMO}(E^C)-E^{LUMO}(ETM^D) \leq 0.3$ eV).

According to a preferred embodiment of the present invention, the at least one emitter compound $E^C$ has a highest occupied molecular orbital $HOMO(E^C)$ having an energy $E^{HOMO}(E^C)$ and the at least one electron transport material $ETM^D$ has a highest occupied molecular orbital $HOMO(ETM^D)$ having an energy $E^{HOMO}(ETM^D)$, and $HOMO(E^C)$ has an higher or equal energy compared to $HOMO(ETM^D)$ ($E^{HOMO}(E^C) \geq E^{HOMO}(ETM^D)$).

According to a preferred embodiment of the present invention, the at least one emitter compound $E^C$ has a highest occupied molecular orbital $HOMO(E^C)$ having an energy $E^{HOMO}(E^C)$) and the at least one emitter compound $E^B$ has a highest occupied molecular orbital $HOMO(E^B)$ having an energy $E^{HOMO}(E^B)$, and $HOMO(E^C)$ has an higher or equal energy compared to $HOMO(E^B)$ ($E^{HOMO}(E^C) \geq E^{HOMO}(E^B)$).

According to a preferred embodiment of the present invention, the at least one emitter compound $E^C$ has a lowest excited singlet state energy level $S1(E^C)$ and the at least one electron transport material $ETM^D$ has a lowest excited singlet state energy level $S1(ETM^D)$, and $S1(ETM^D)$ is higher or equal in energy compared to $S1(E^C)$ ($S1(ETM^D) \geq S1(E^C)$).

According to a preferred embodiment of the present invention, the at least one emitter compound $E^C$ has a lowest excited triplet state energy level $T1(E^C)$ and has a lowest excited singlet state energy level S1($E^C$) and the at least one electron transport material $ETM^D$ has a lowest excited triplet state energy level T1($ETM^D$), T1($ETM^D$) is higher or equal compared to T1($E^C$), and S1($E^C$) is higher compared to T1($E^C$), which is higher than half of S1($E^C$) (T1($ETM^D$)≥ T1($E^C$), and S1($E^C$)>T1($E^C$)≥S1($E^C$)/2).

According to a preferred embodiment of the present invention, the at least one electron transport material $ETM^D$ is NBPhen.

According to a preferred embodiment of the present invention, the light-emitting layer B has a thickness $d^B$ and the exciton quenching layer C has a thickness $d^C$ and B is thicker than C ($d^B > d^C$). According to a further embodiment of the present invention, the light-emitting layer B has a thickness between 180 nm and 5 nm and the exciton quenching layer C has a thickness between 4 nm and 0.5 nm

DETAILED DESCRIPTION OF THE EMBODIMENTS

As used herein, the terms organic electroluminescent device and opto-electronic light-emitting devices may be understood in the broadest sense as any device comprising a light-emitting layer B located between the anode A and the cathode K comprising at least one host material $H^B$ and at least one emitter $E^B$; an exciton quenching layer C comprising at least one emitter $E^C$; and an electron-transport layer D between the cathode K and the light-emitting layer B comprising at least one electron transport material $ETM^D$; wherein the exciton quenching layer C is adjacent to both the light-emitting layer B and the electron-transport layer D, and the exciton quenching layer C comprises at least 80% by weight of the at least one electron transport material $ETM^D$.

The term "layer" as used in the context of the present invention preferably is a body that bears an extensively planar geometry. The light-emitting layer B preferably bears a thickness of not more than 1 mm, more preferably not more than 0.1 mm, even more preferably not more than 10 μm, even more preferably not more than 1 μm, in particular not more than 0.1 μm.

In a particularly preferred embodiment, the at least one emitter compound $E^B$ is a thermally activated delayed fluorescence (TADF) emitter, preferably a sky-blue or even more preferably a blue TADF emitter.

Exemplarily, the at least one emitter compound $E^B$ is a thermally activated delayed fluorescence (TADF) is a blue TADF emitter selected from the group consisting of:

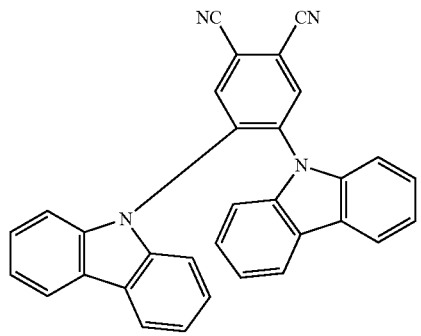

-continued

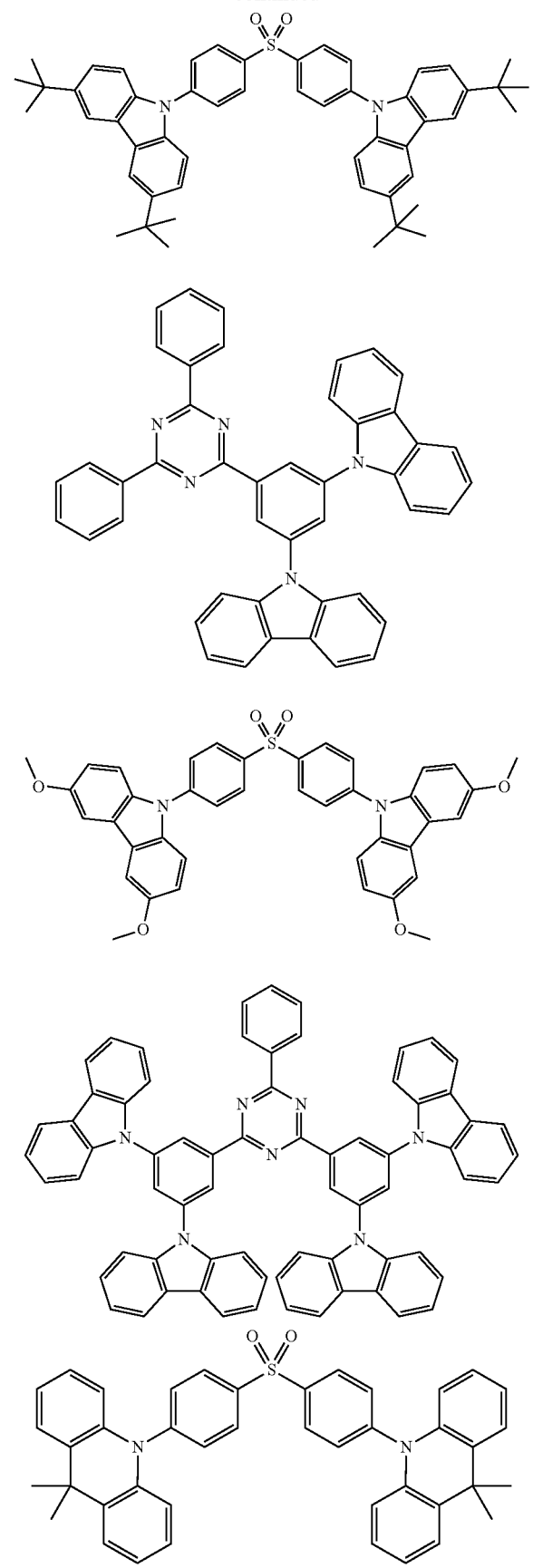

-continued
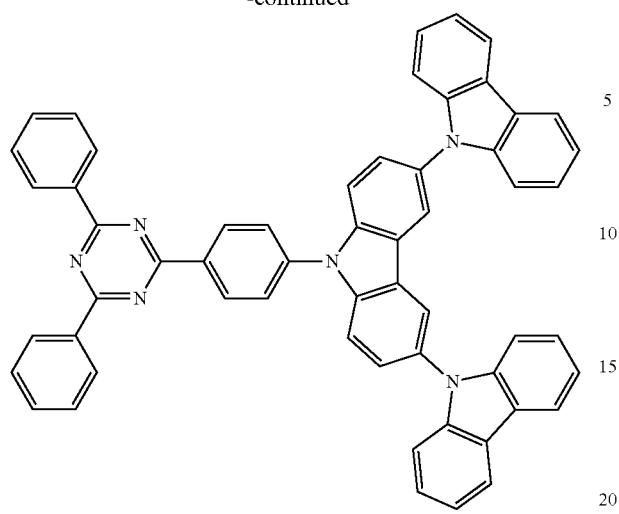
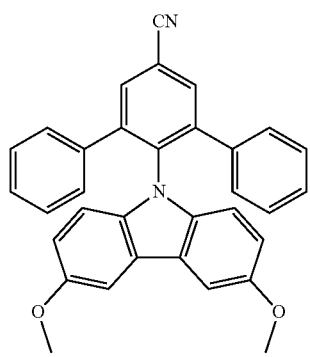
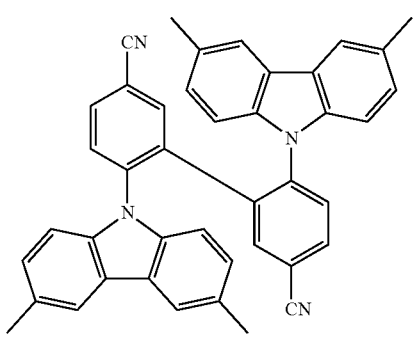
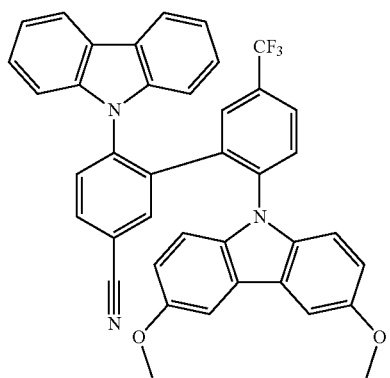
-continued
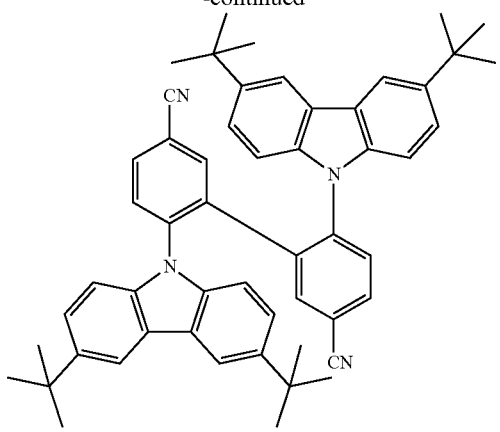
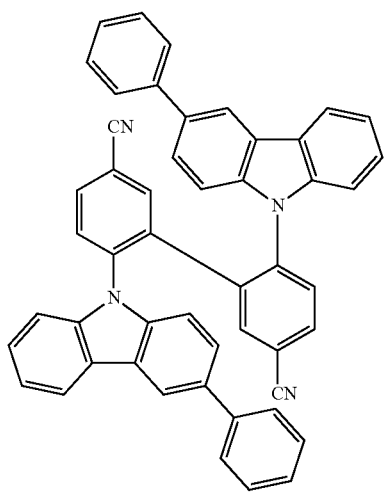
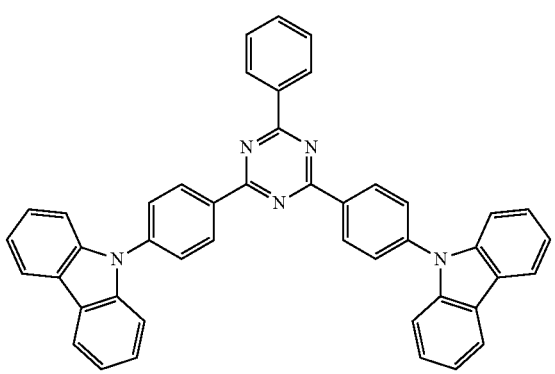
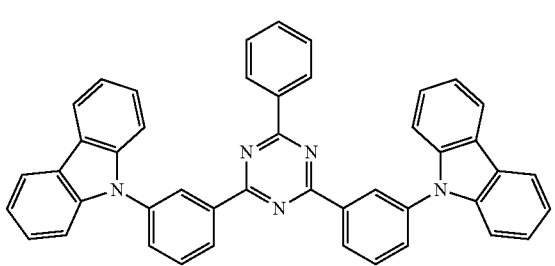

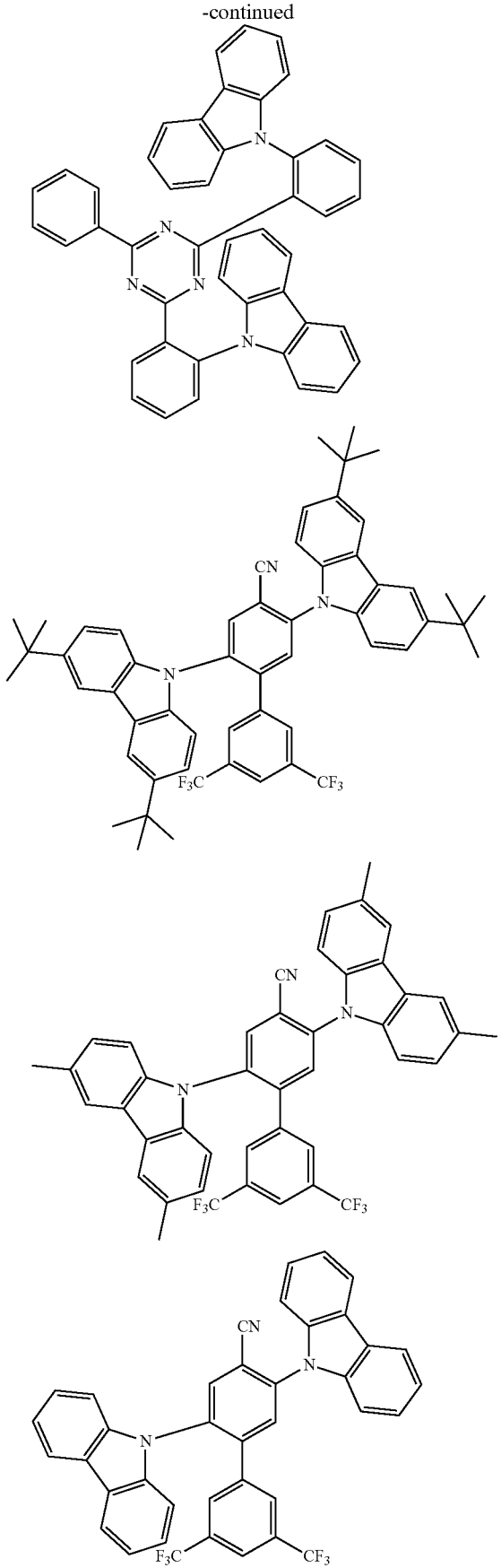
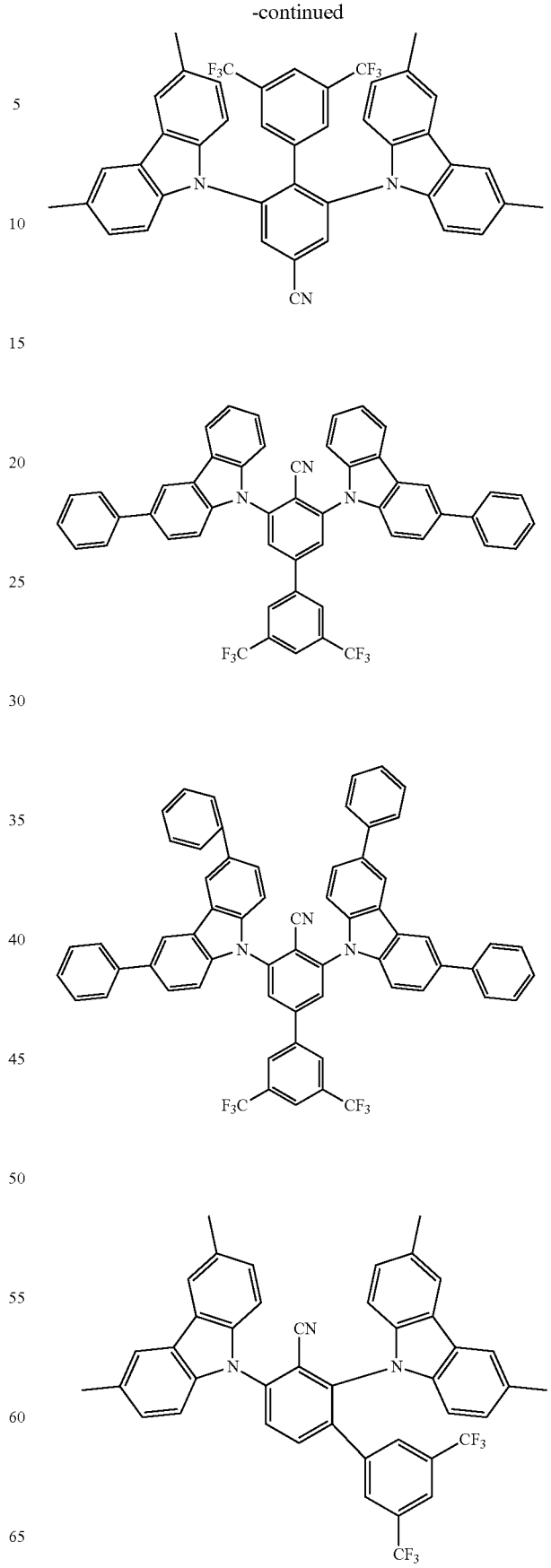

13
-continued
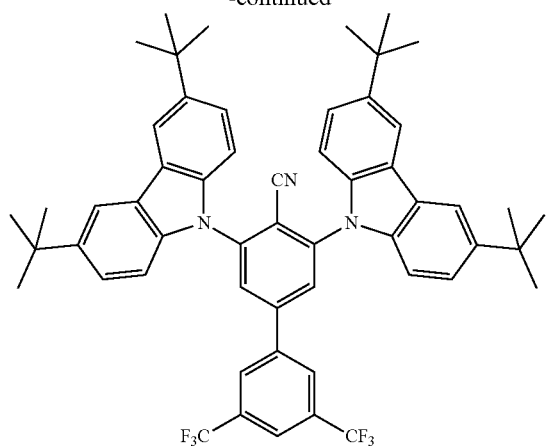
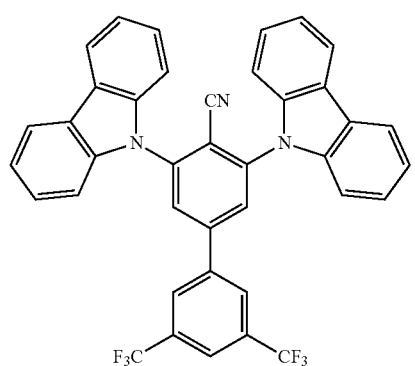
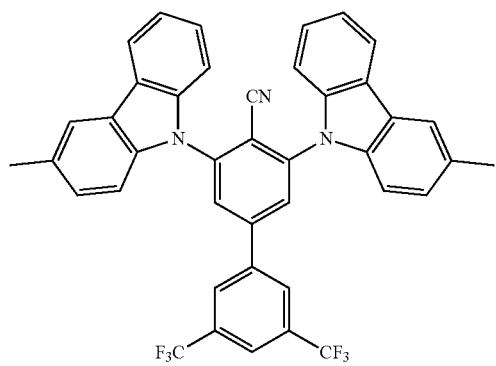
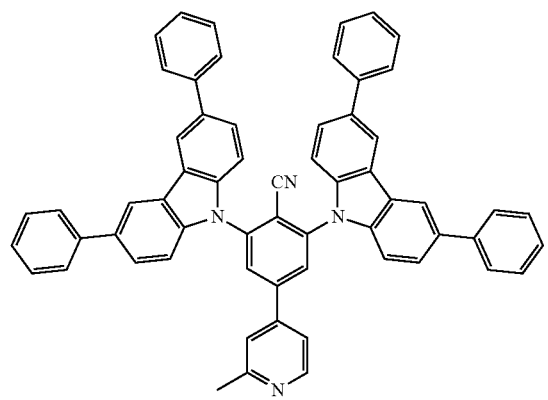
14
-continued
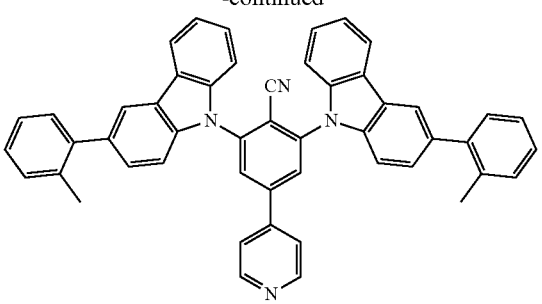
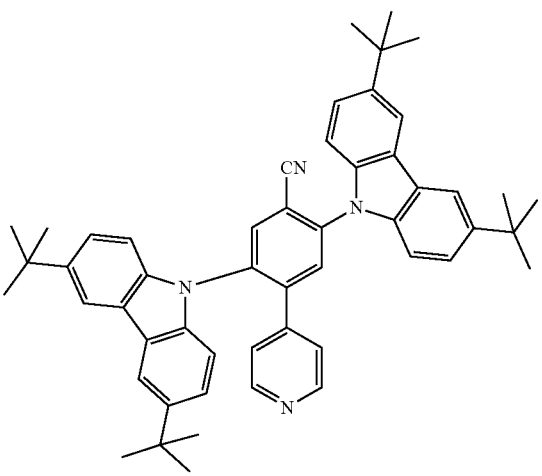
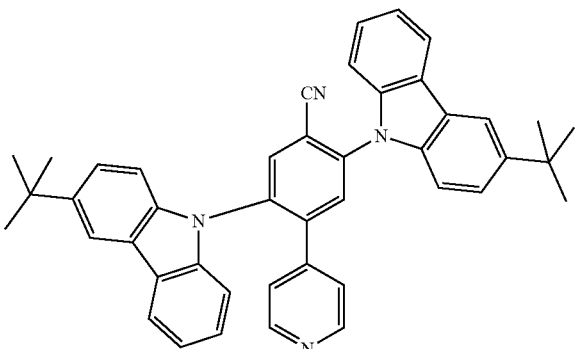
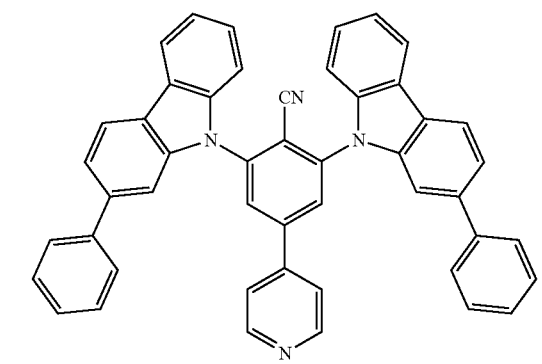

-continued
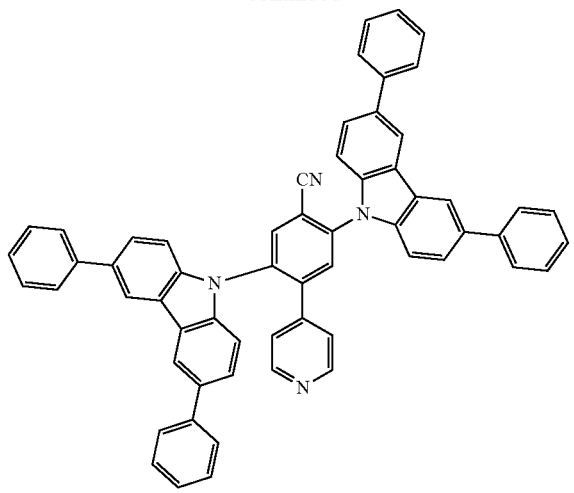
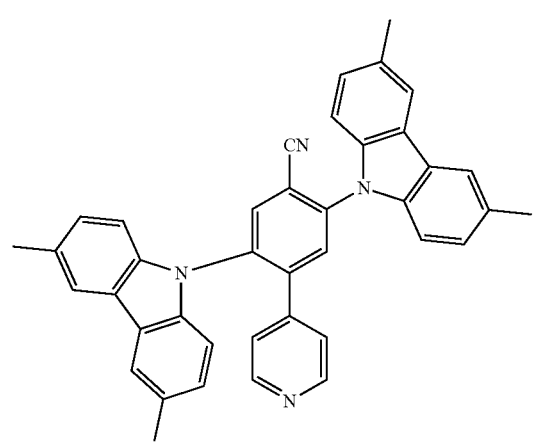
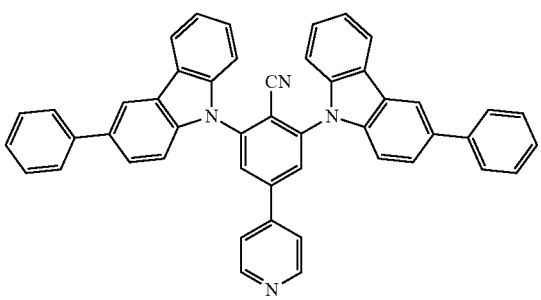
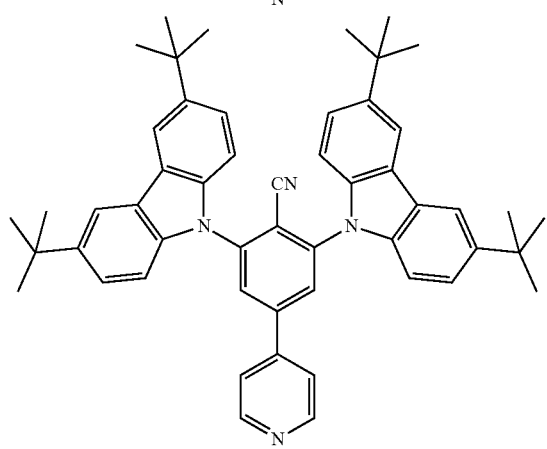
-continued
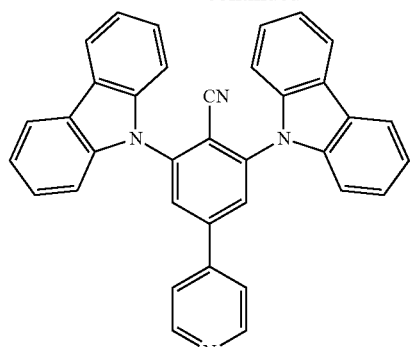
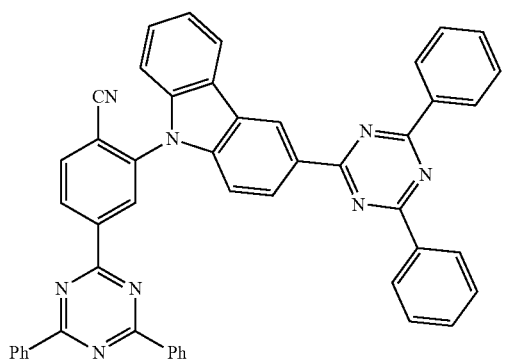
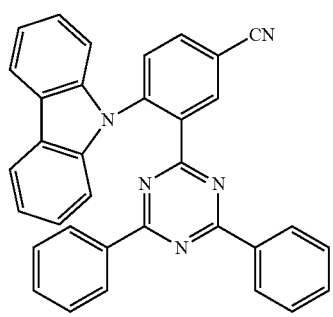
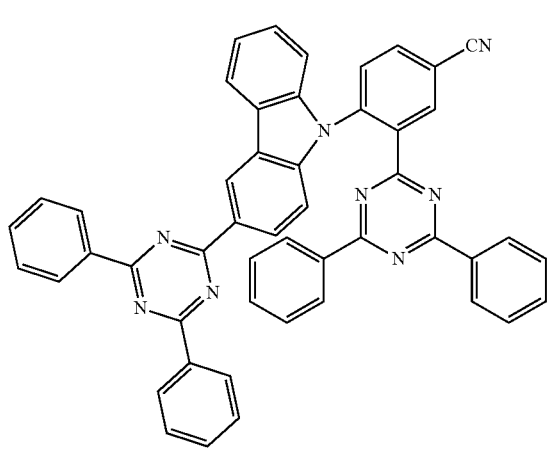

17
-continued
18
-continued
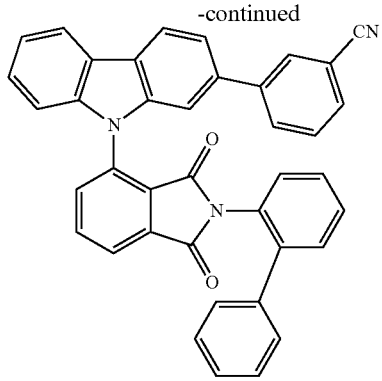
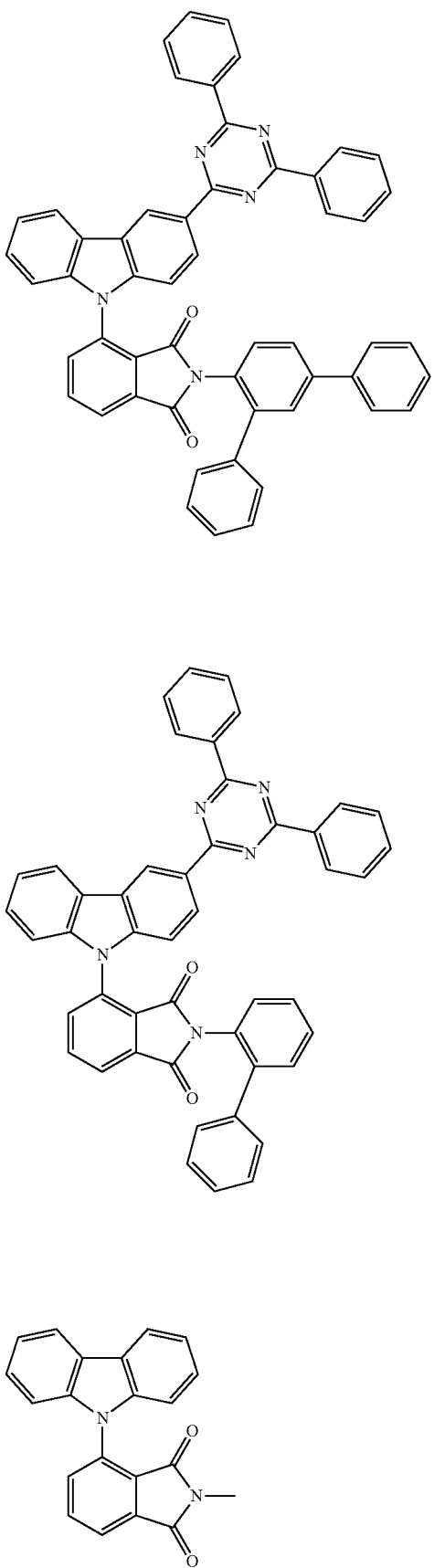

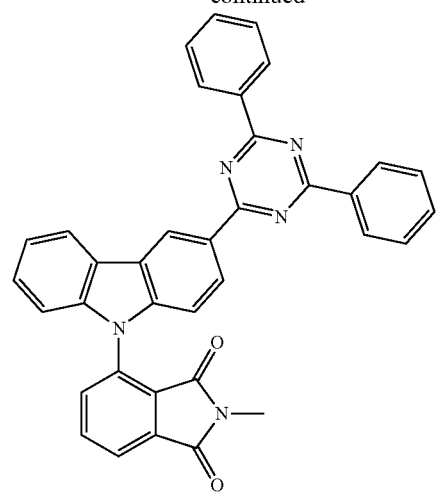
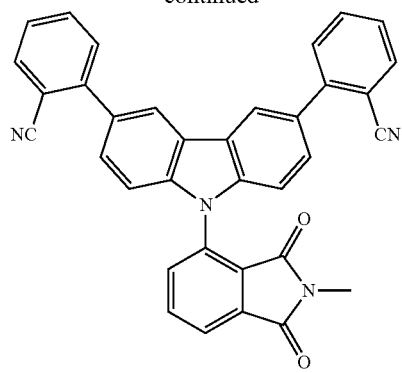
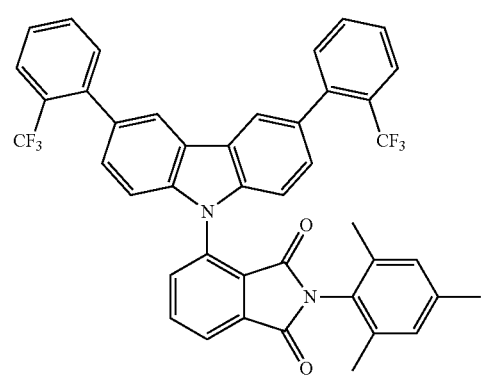
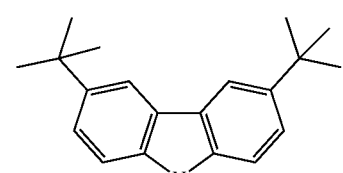
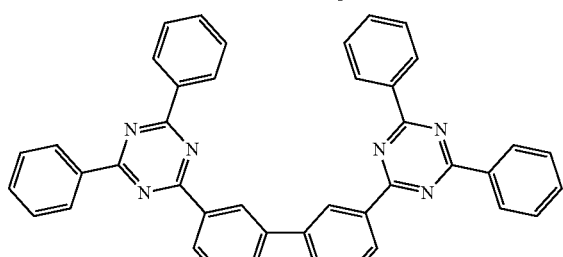
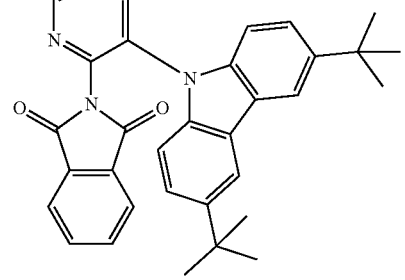
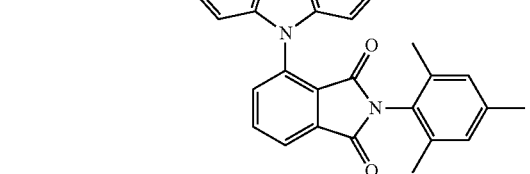
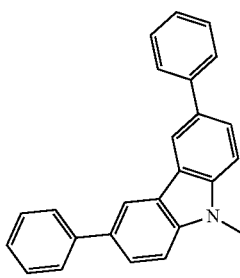
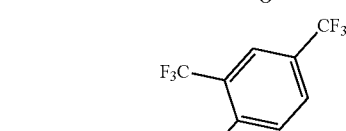
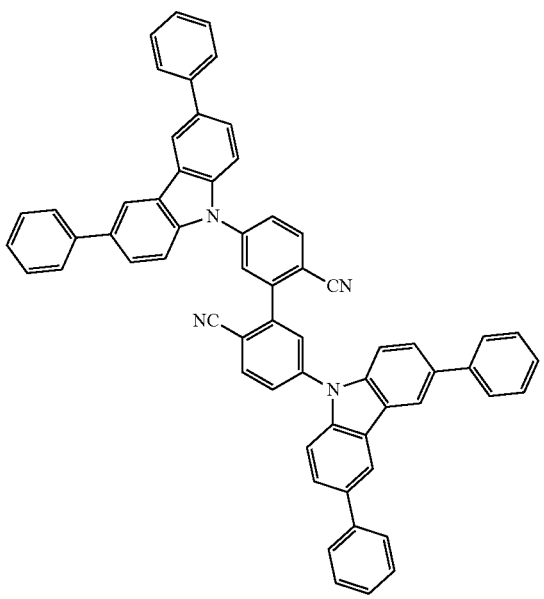

21
-continued
22
-continued
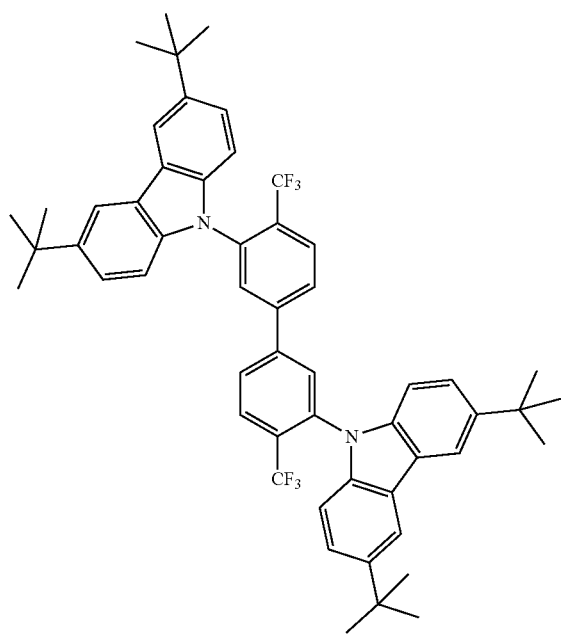
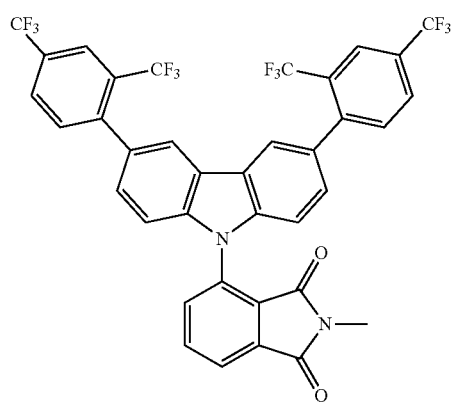
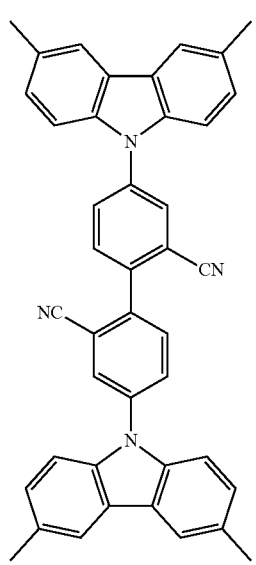
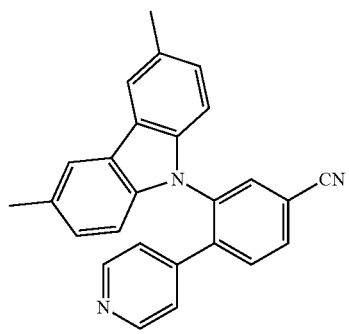
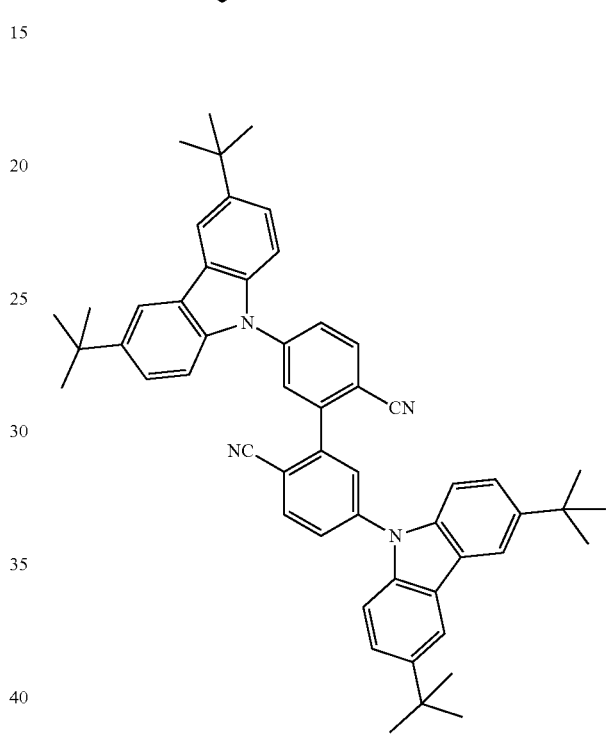
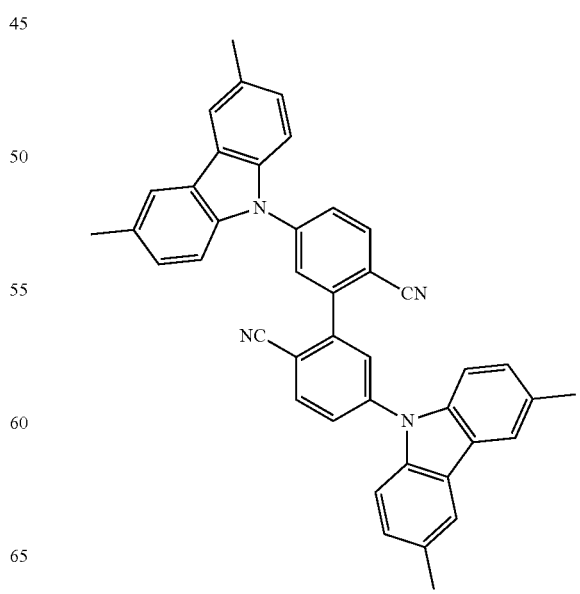

23
-continued
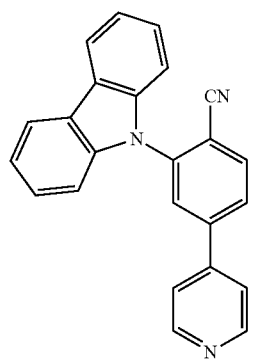
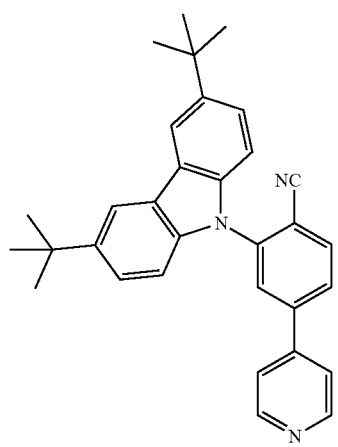
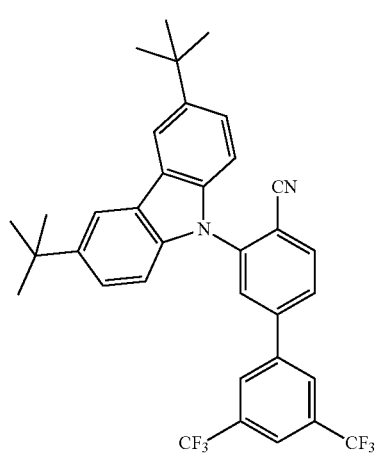
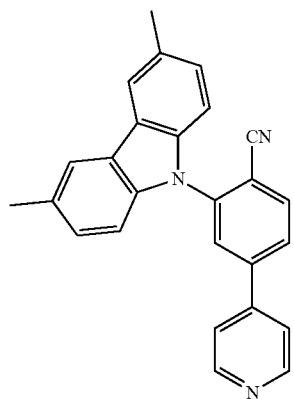
24
-continued
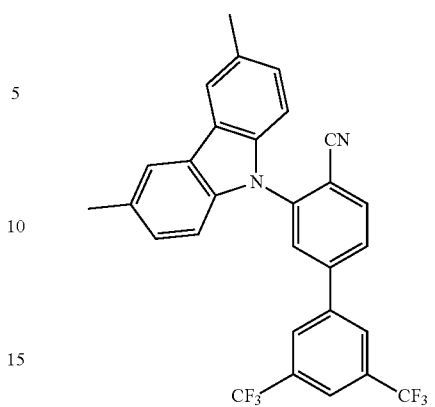
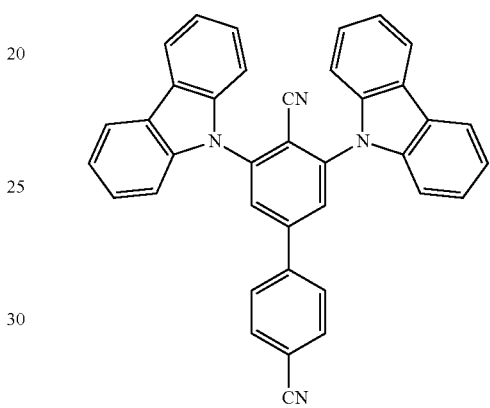
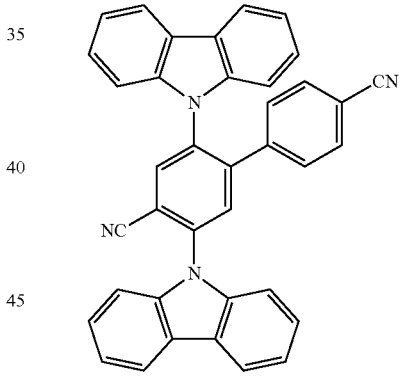
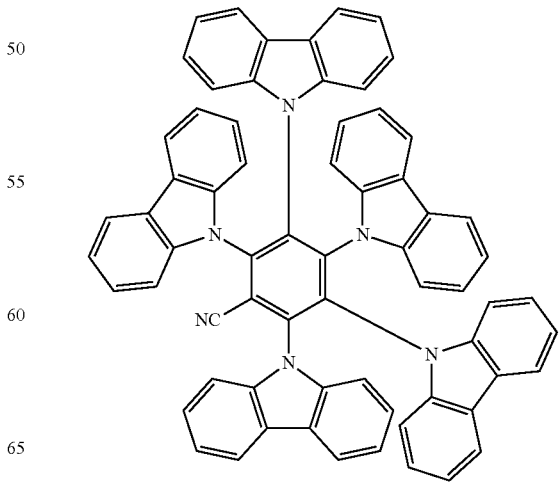

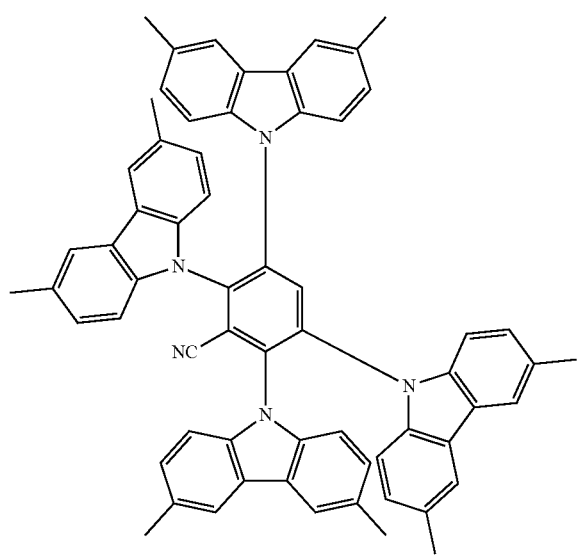
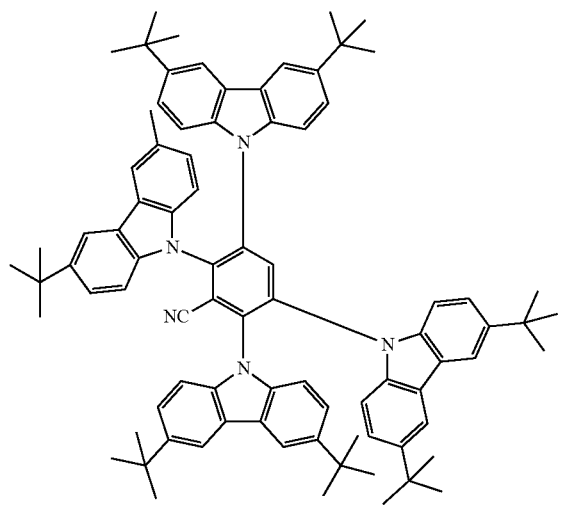
In a particularly preferred embodiment, the at least one emitter compound $E^C$ is a fluorescence emitter, preferably a blue fluorescence emitter. Exemplarily, $E^C$ is a blue fluorescence emitter selected from:
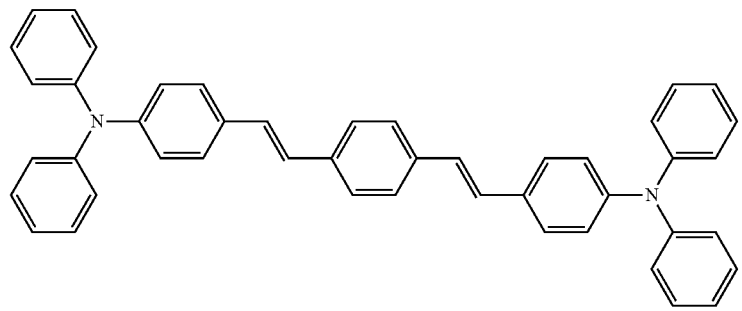
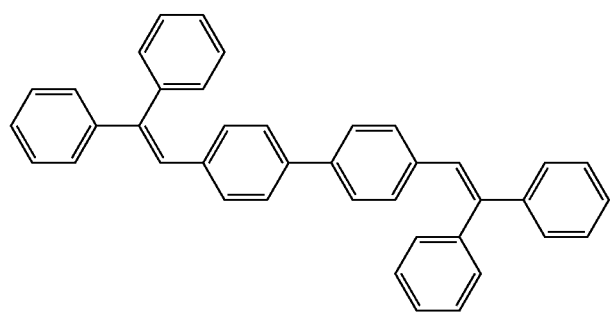
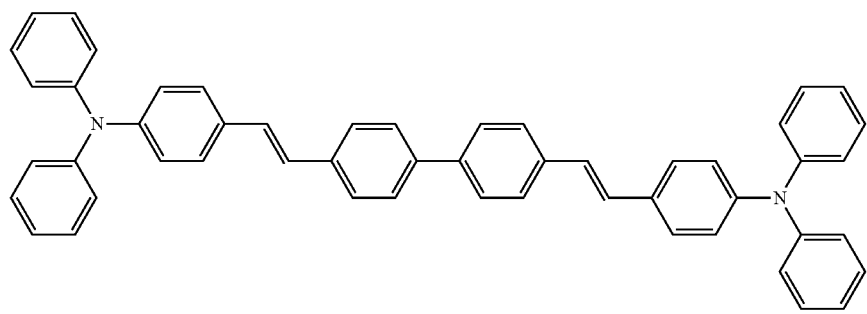

-continued
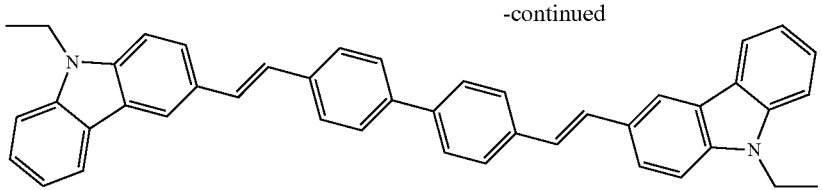
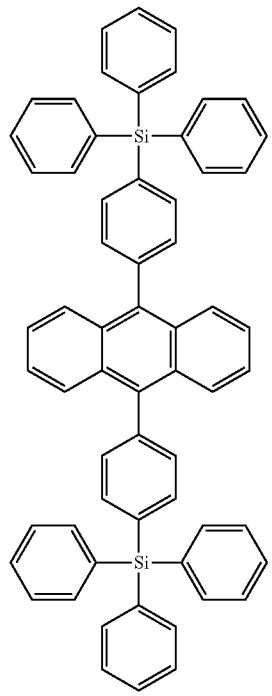
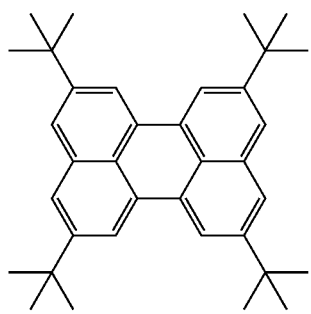
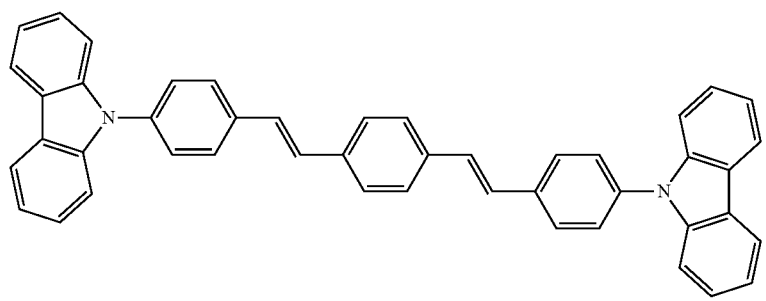
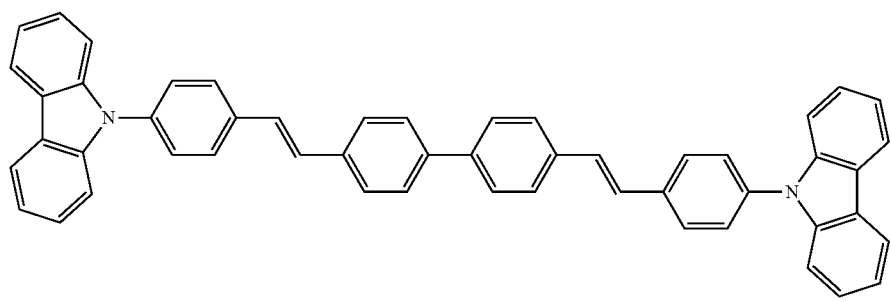

-continued
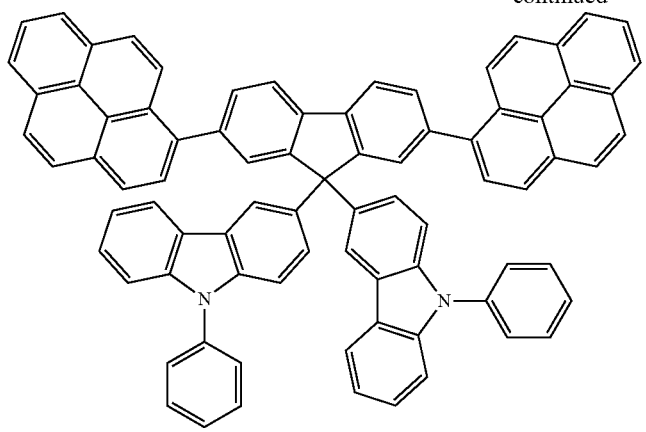
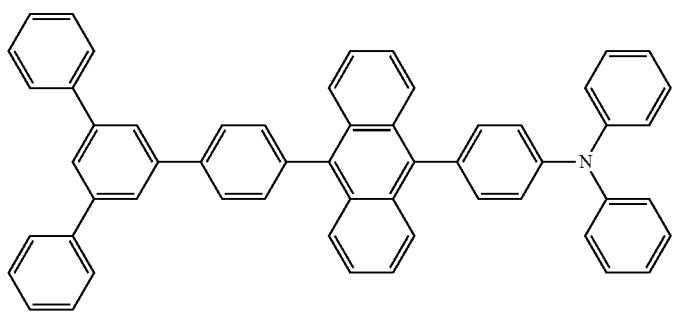
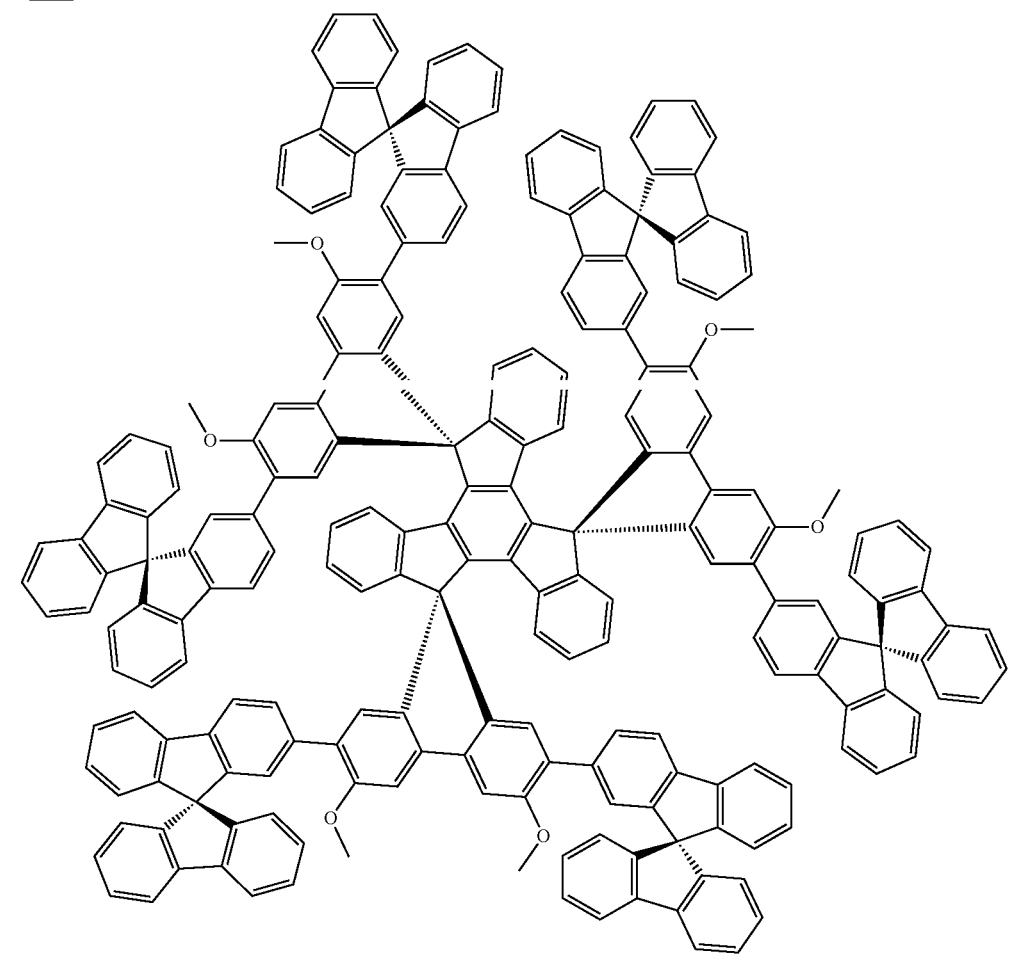

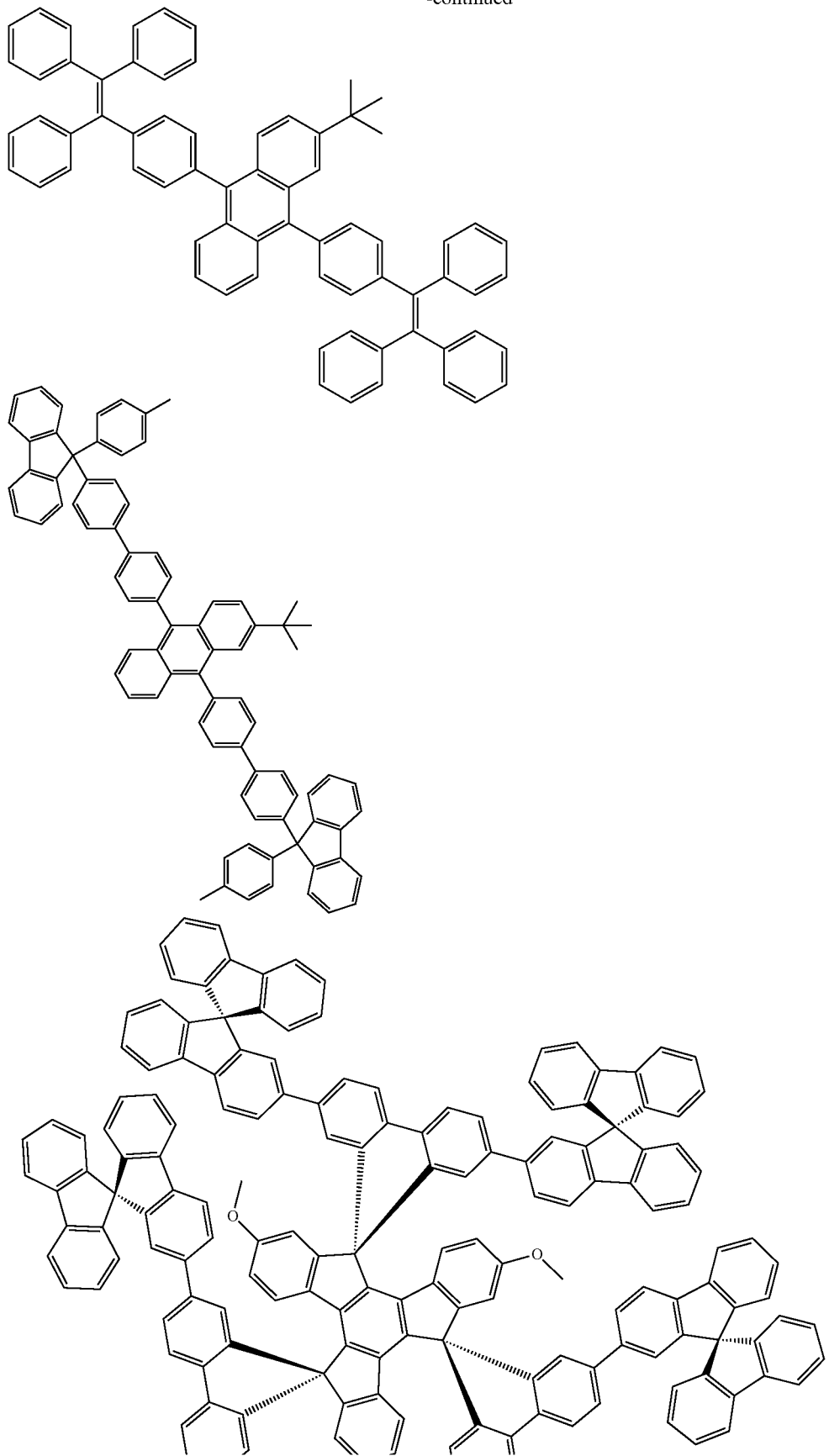

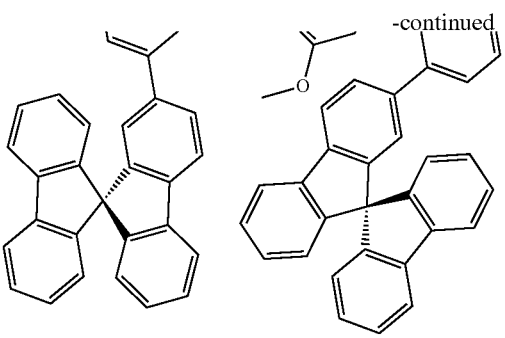
-continued
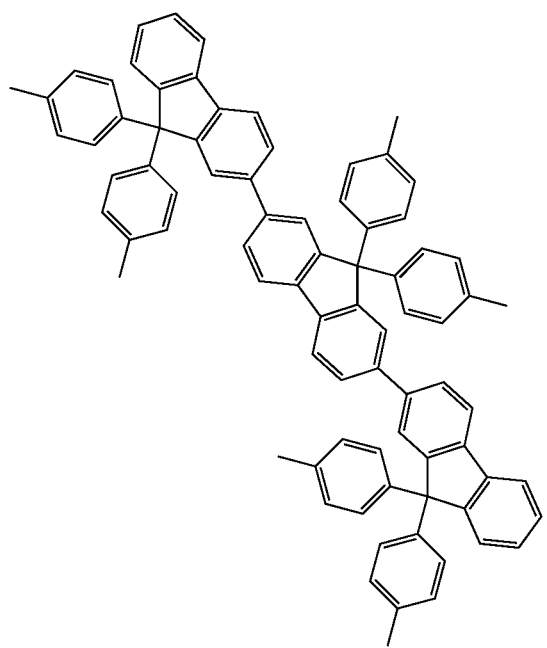
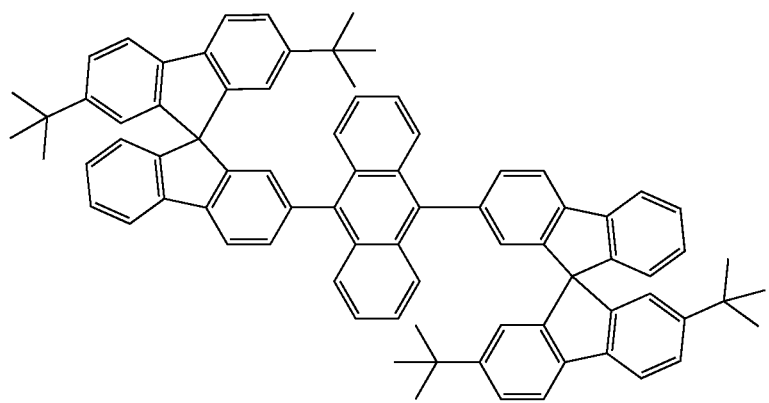

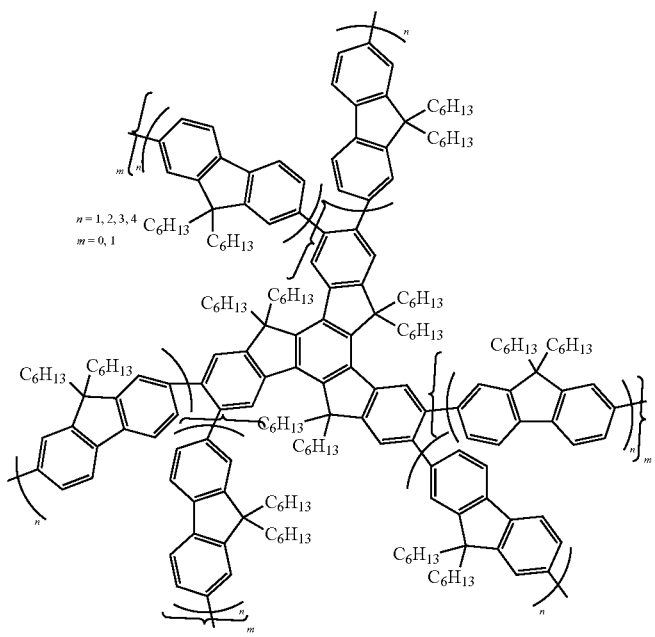
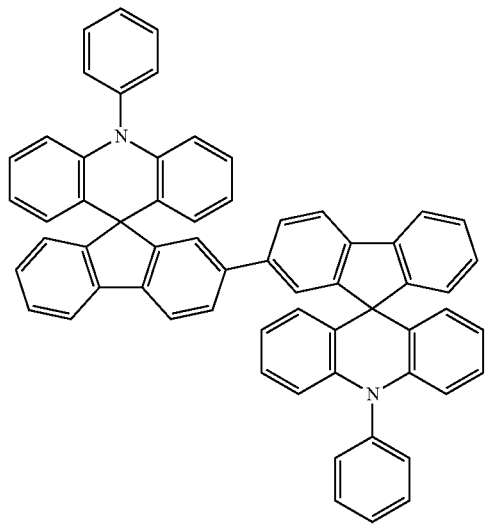
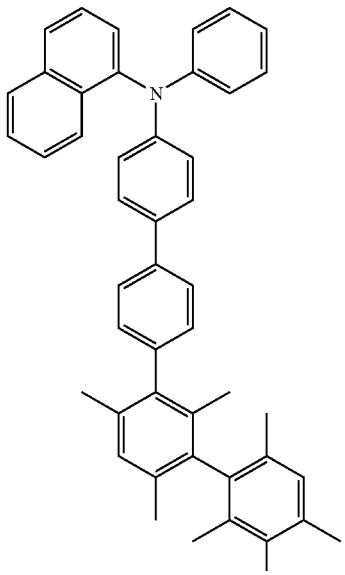
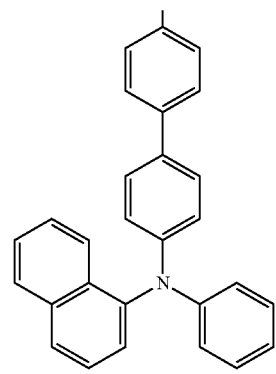

-continued
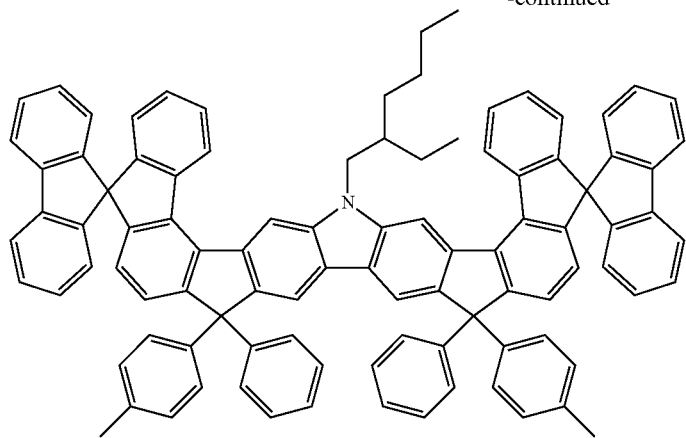
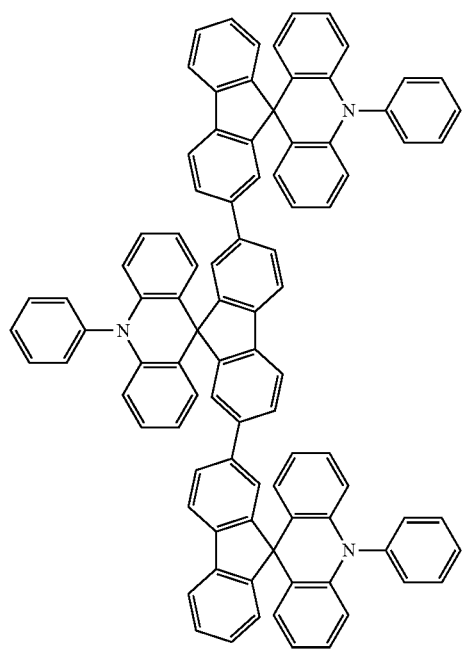
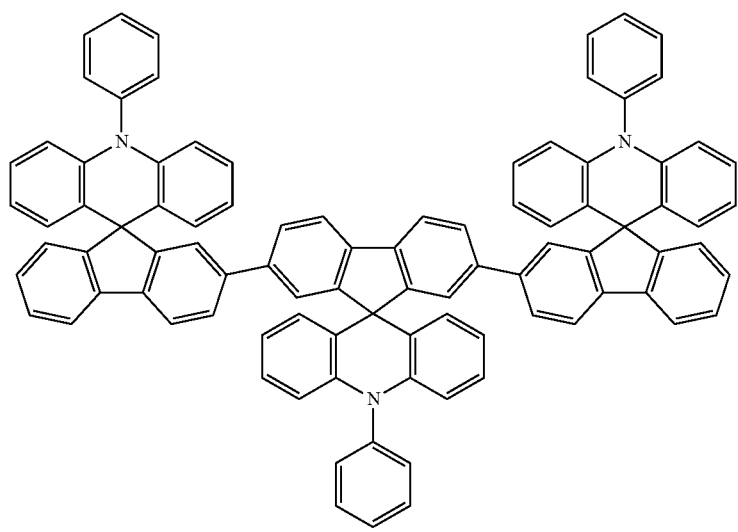

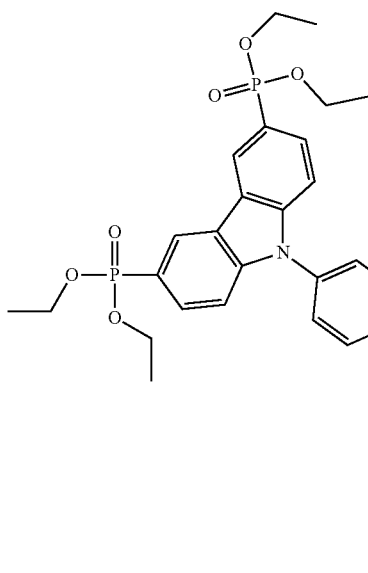
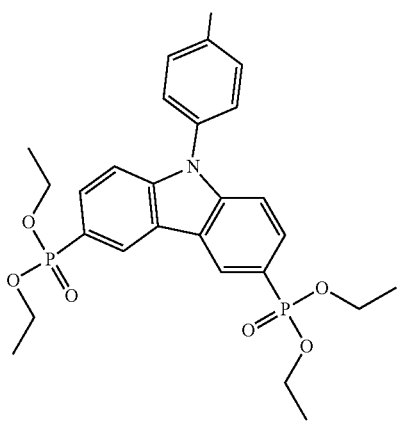
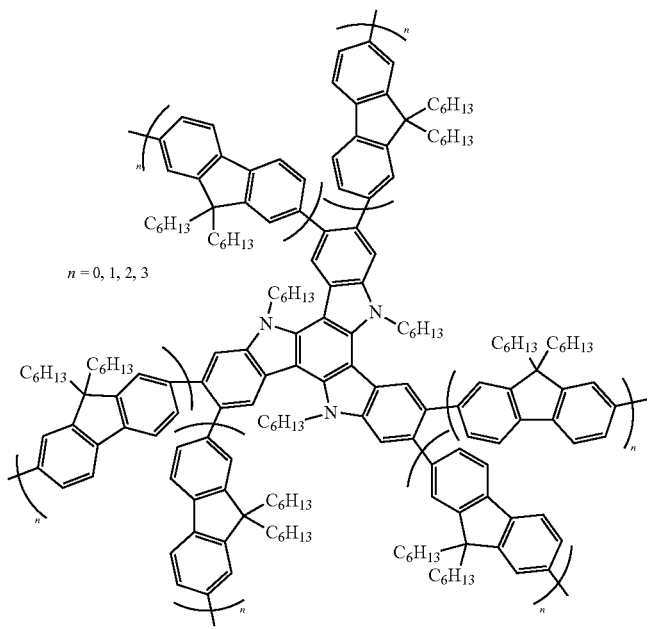

-continued
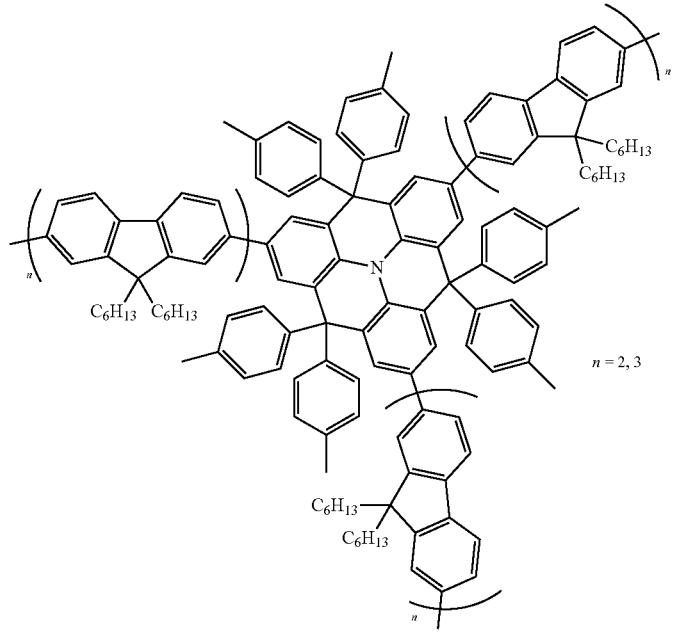
n = 2, 3
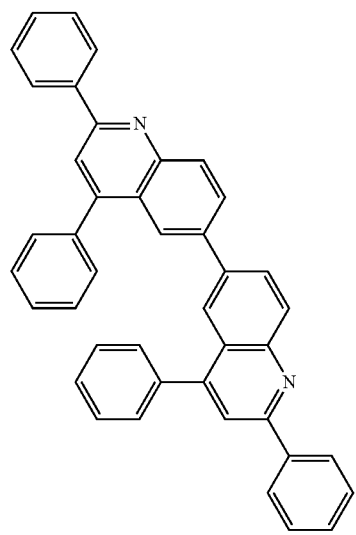
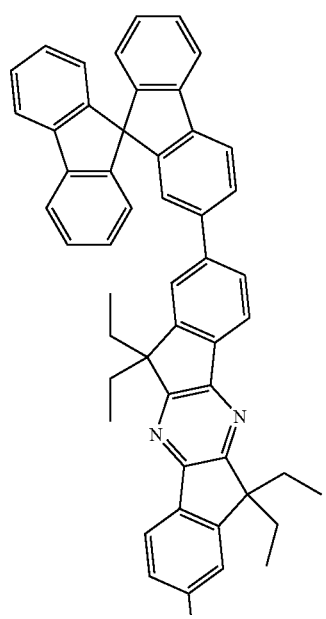
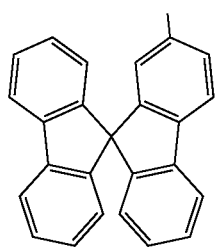

-continued
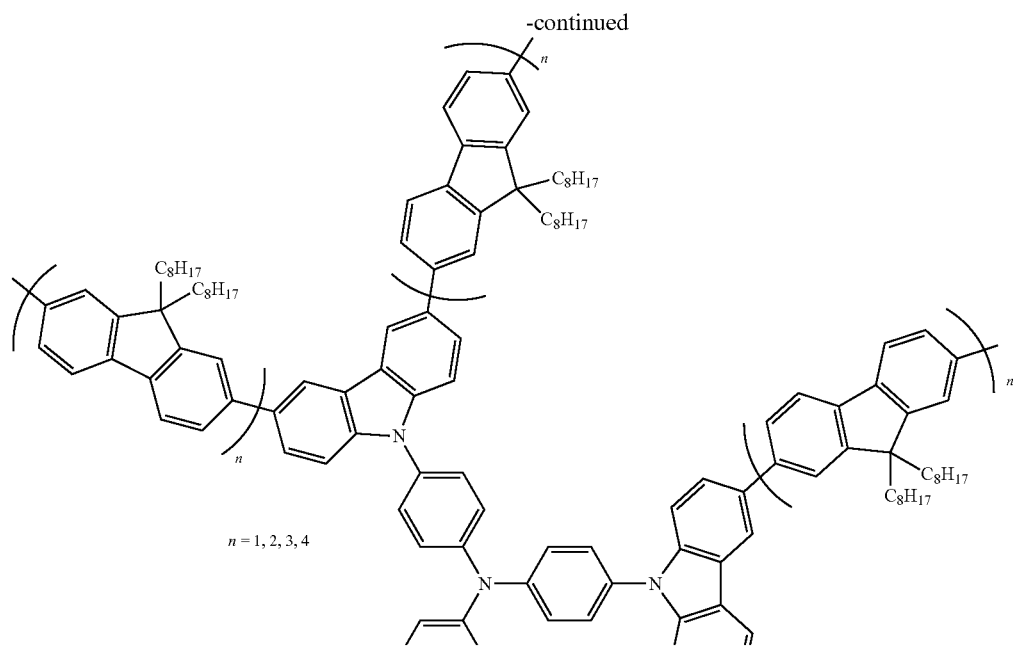
n = 1, 2, 3, 4
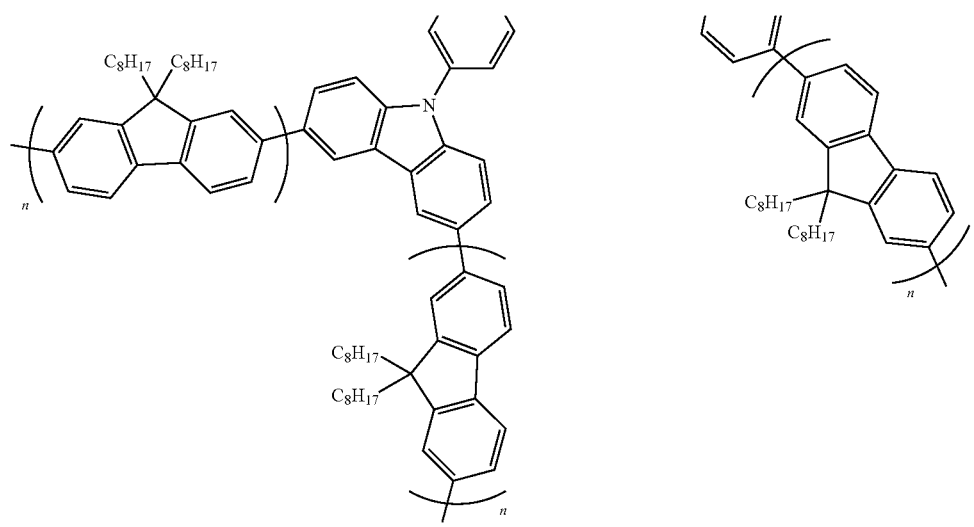
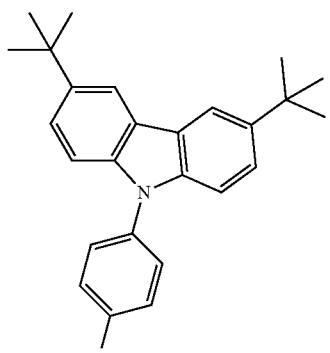

-continued
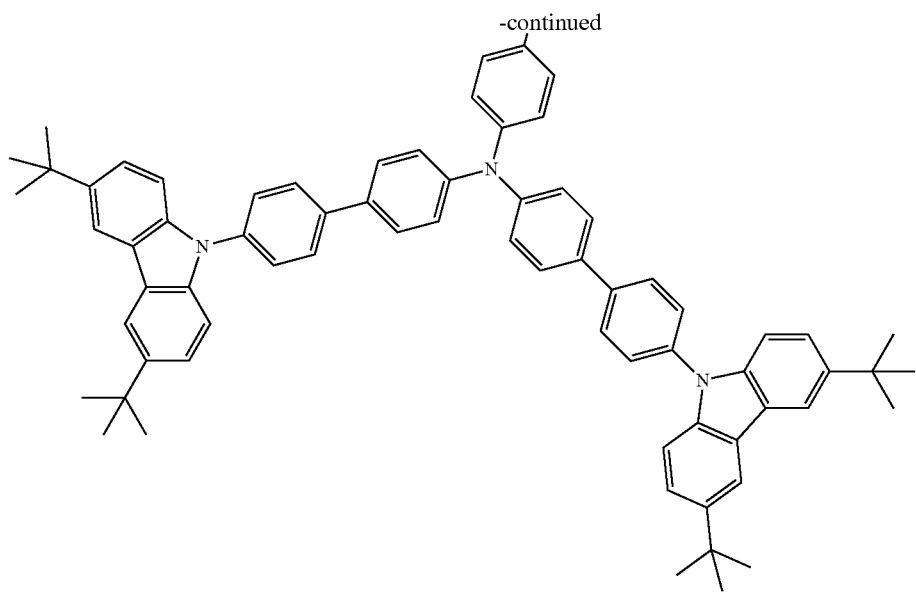
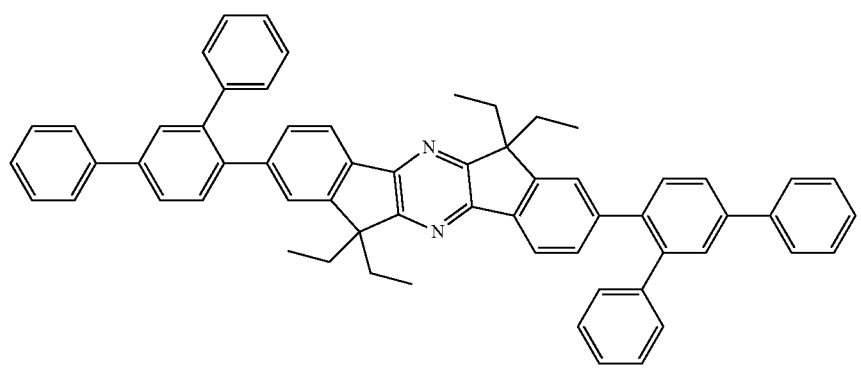
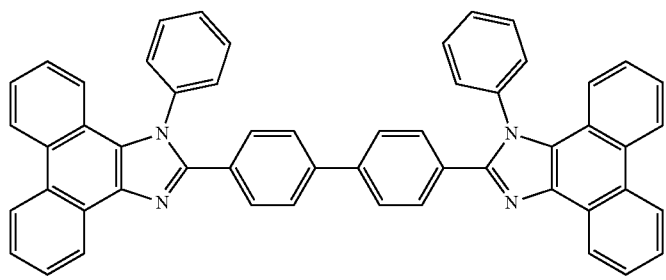
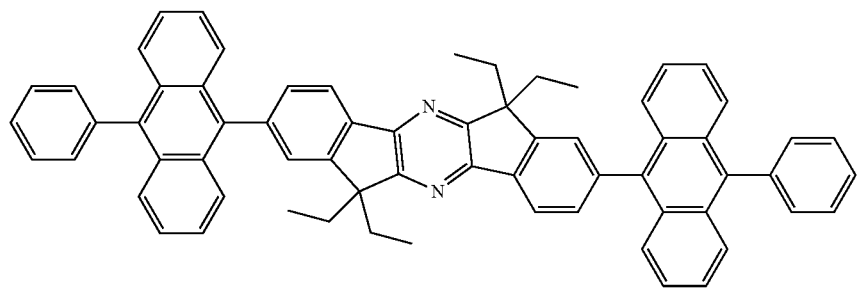

-continued
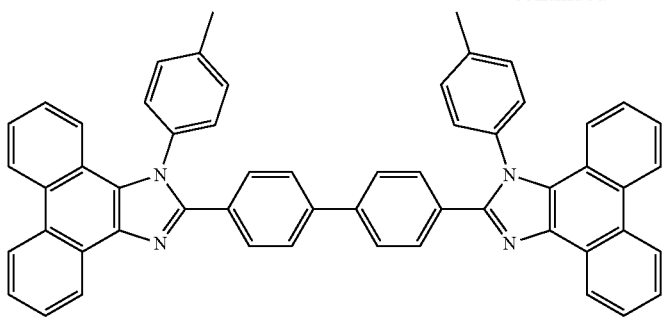
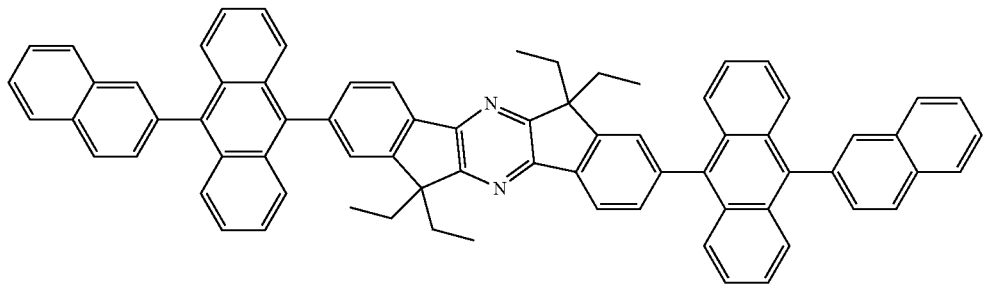
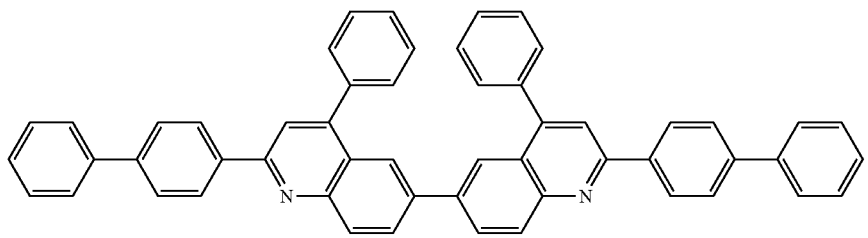
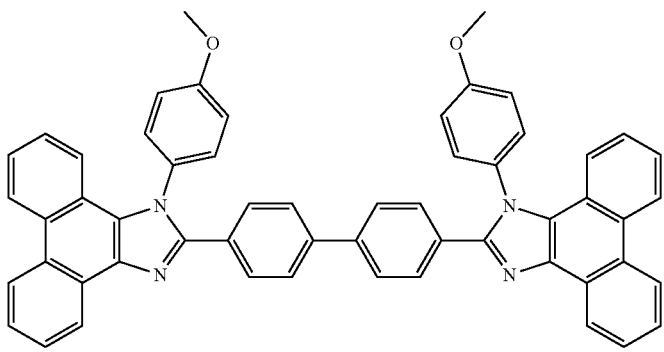
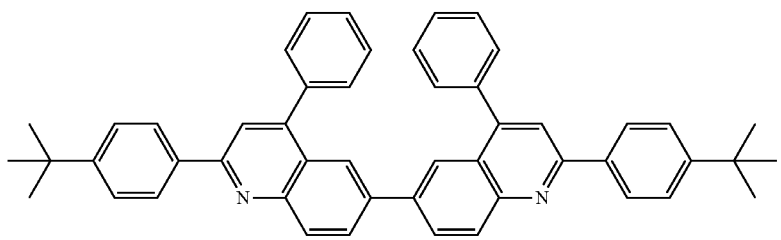
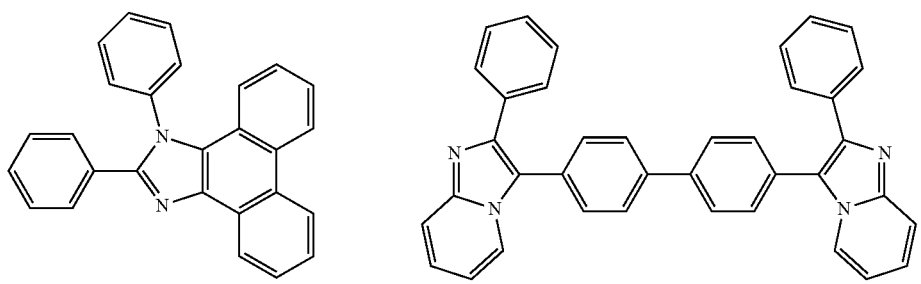

-continued
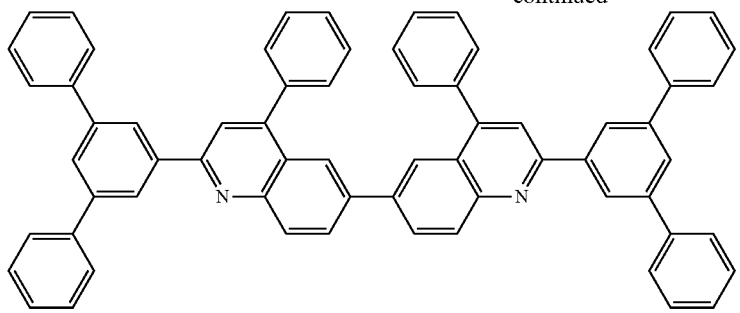
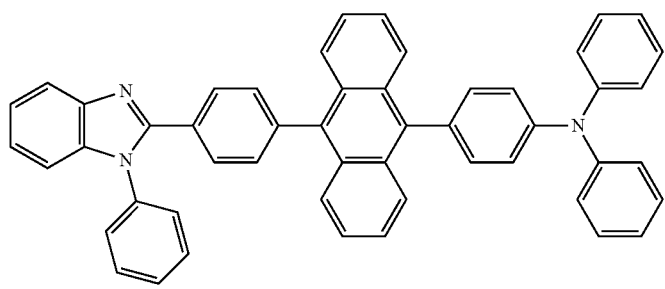
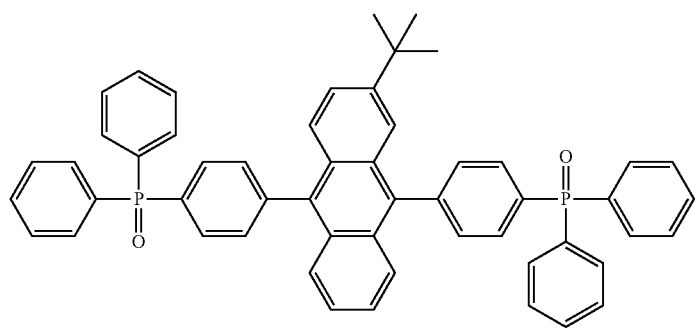
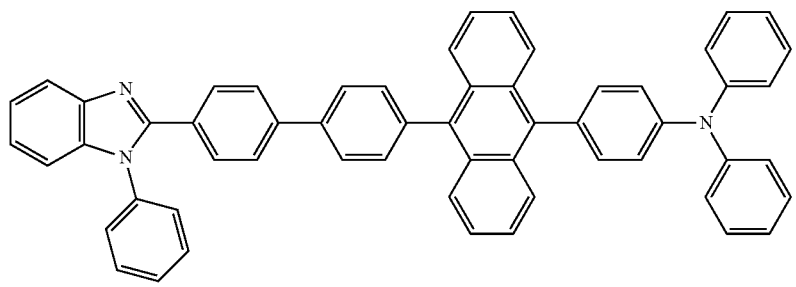
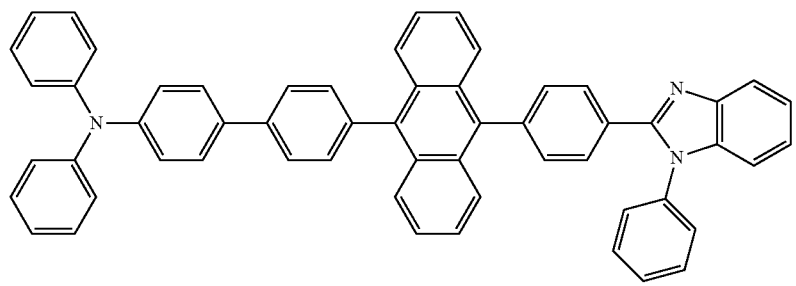

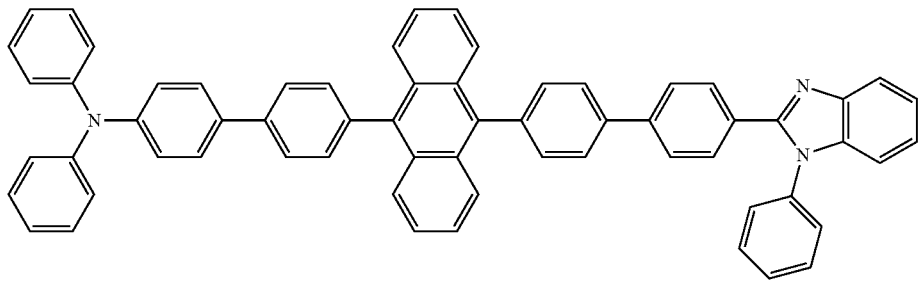
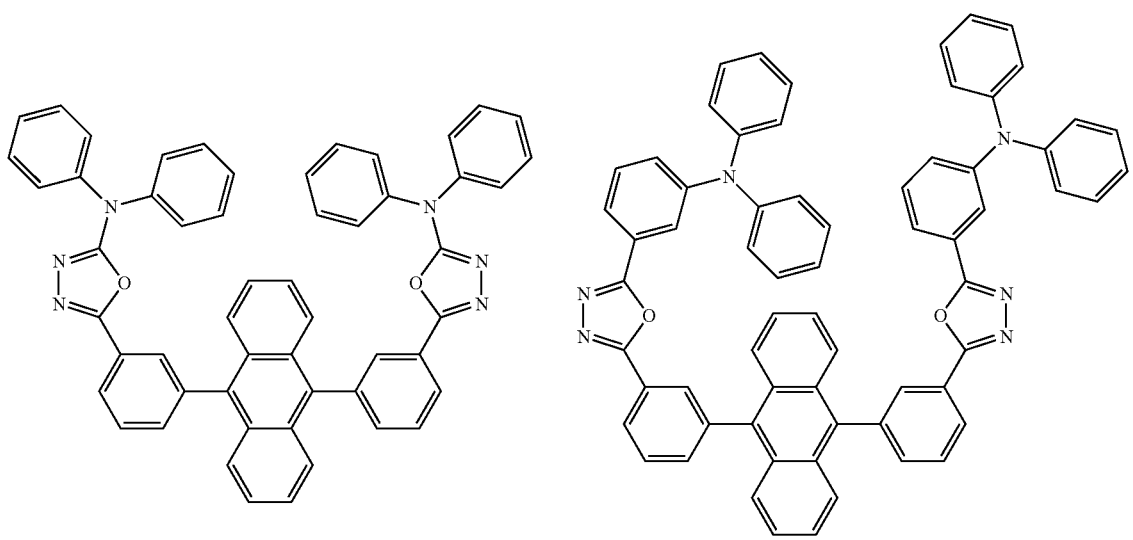
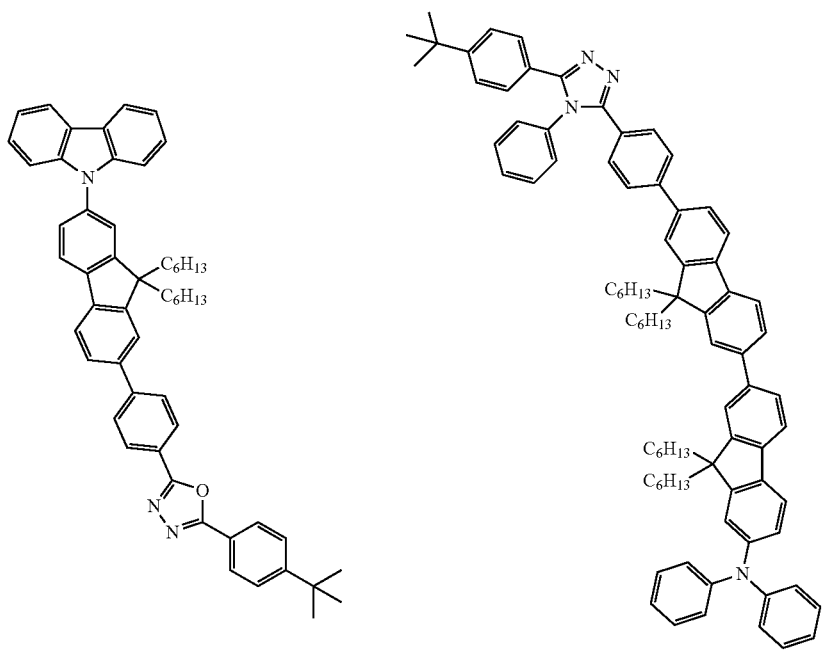

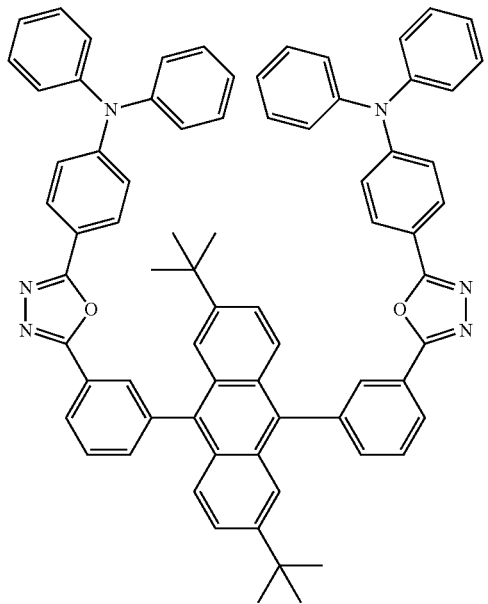
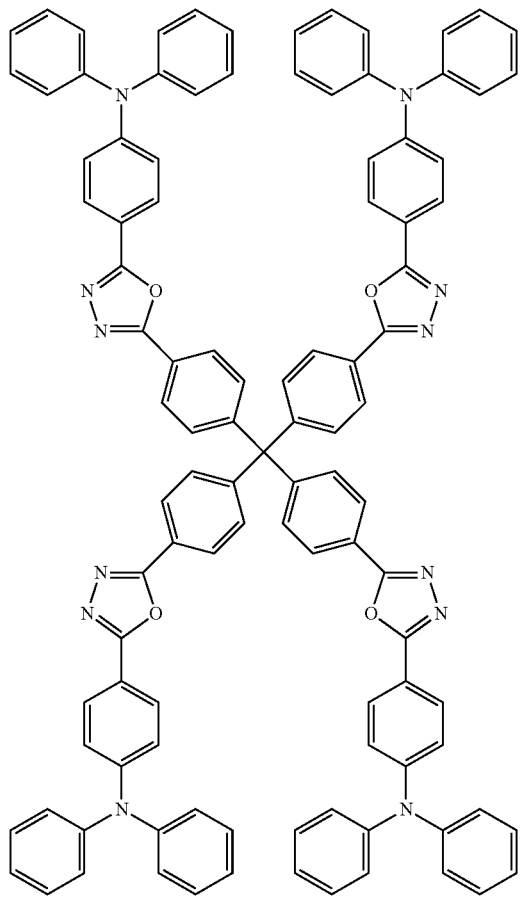
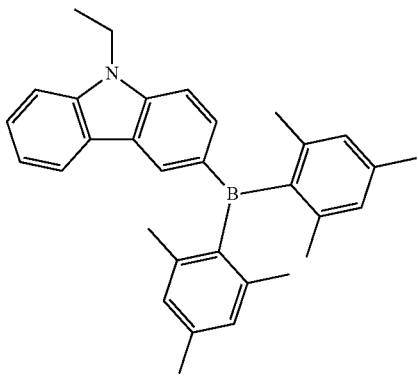

-continued
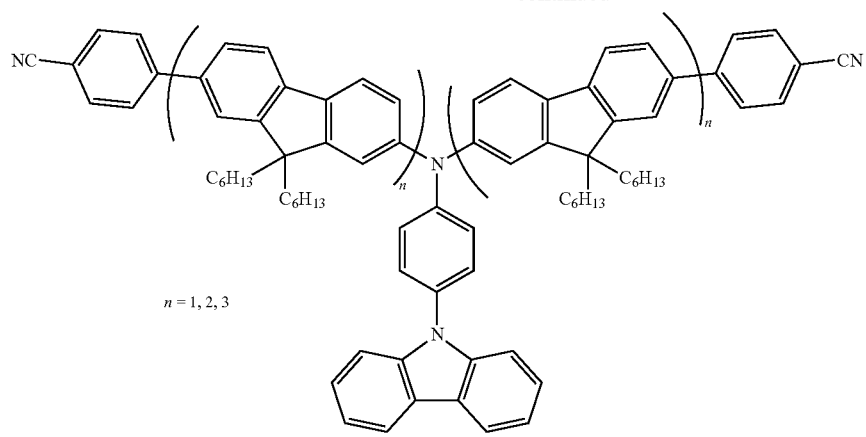
n = 1, 2, 3
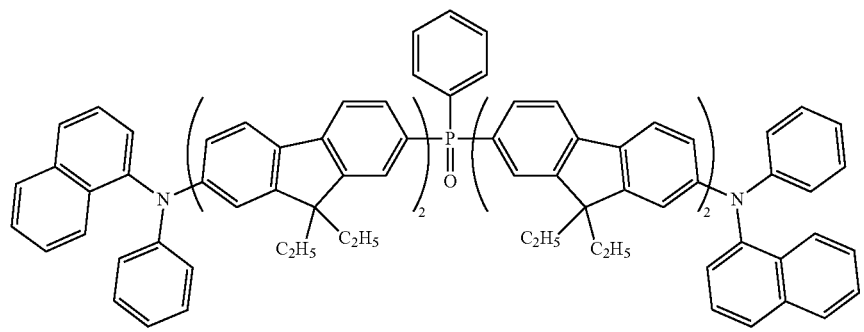
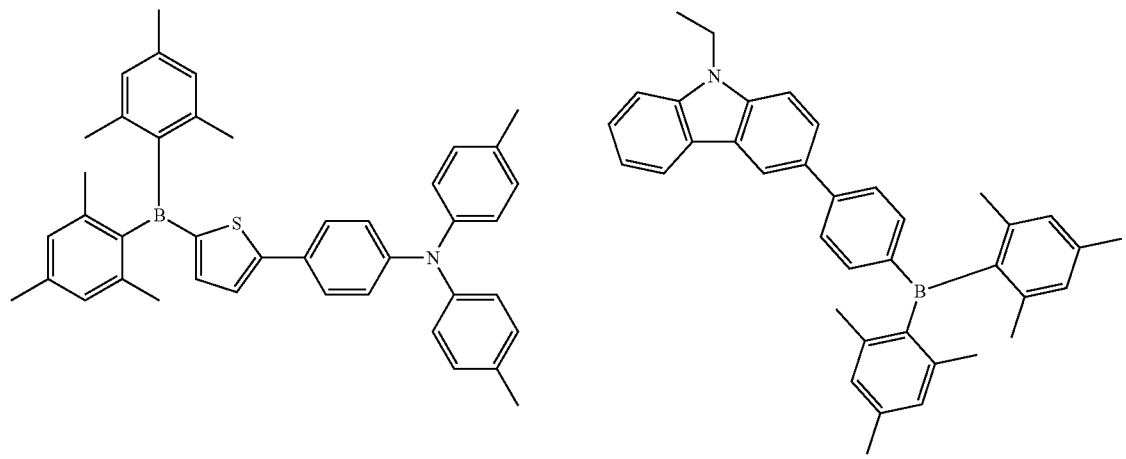
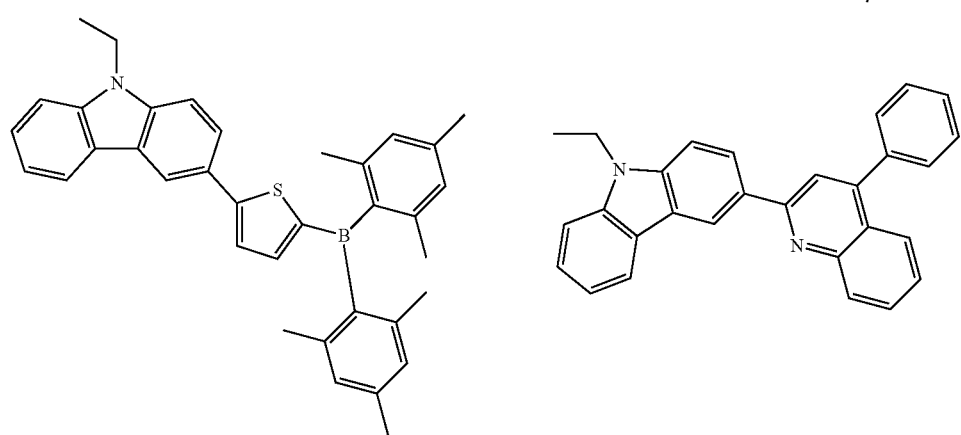

57
58
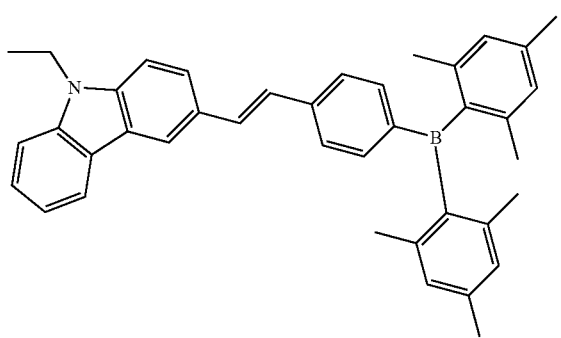
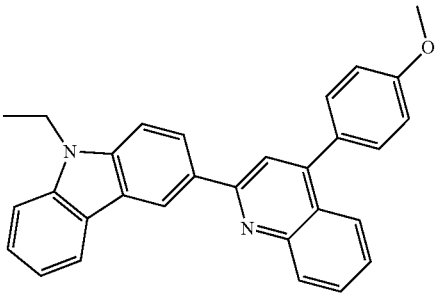
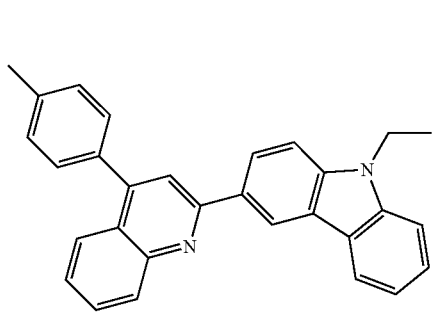
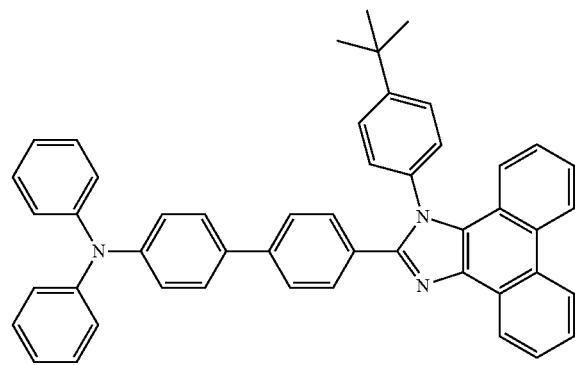
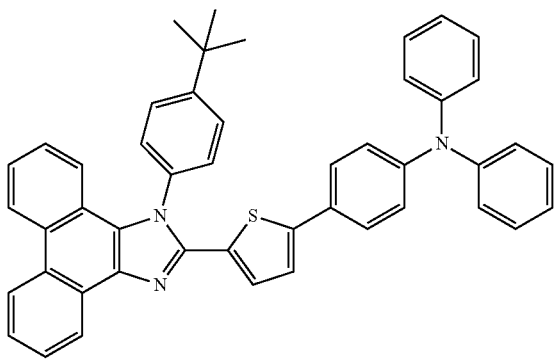
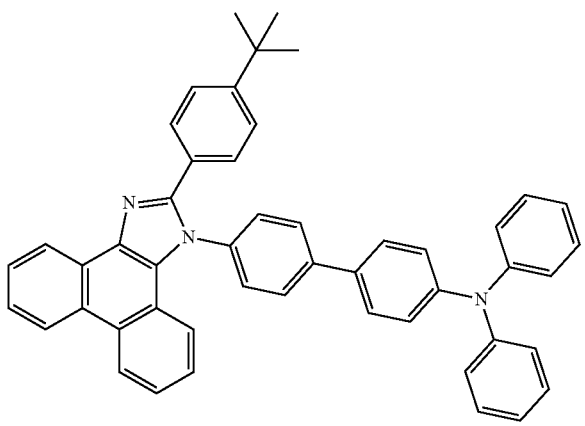
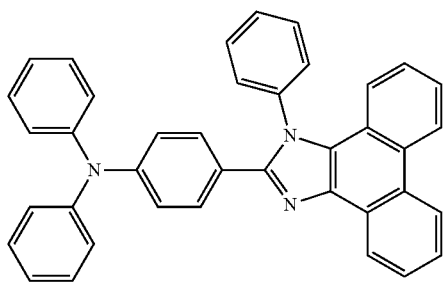

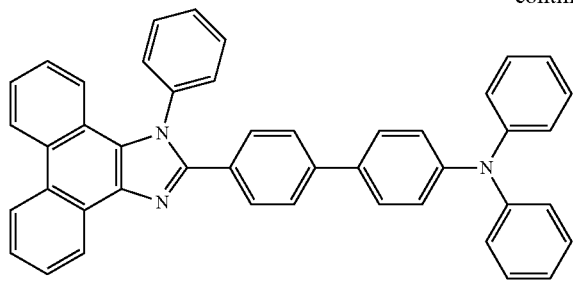
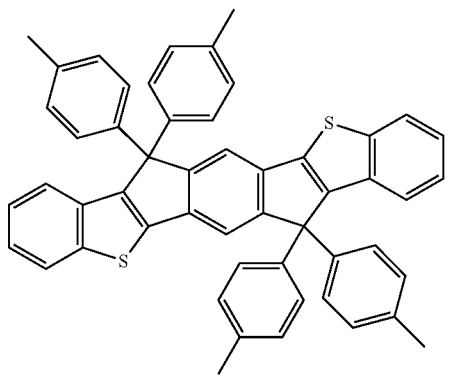
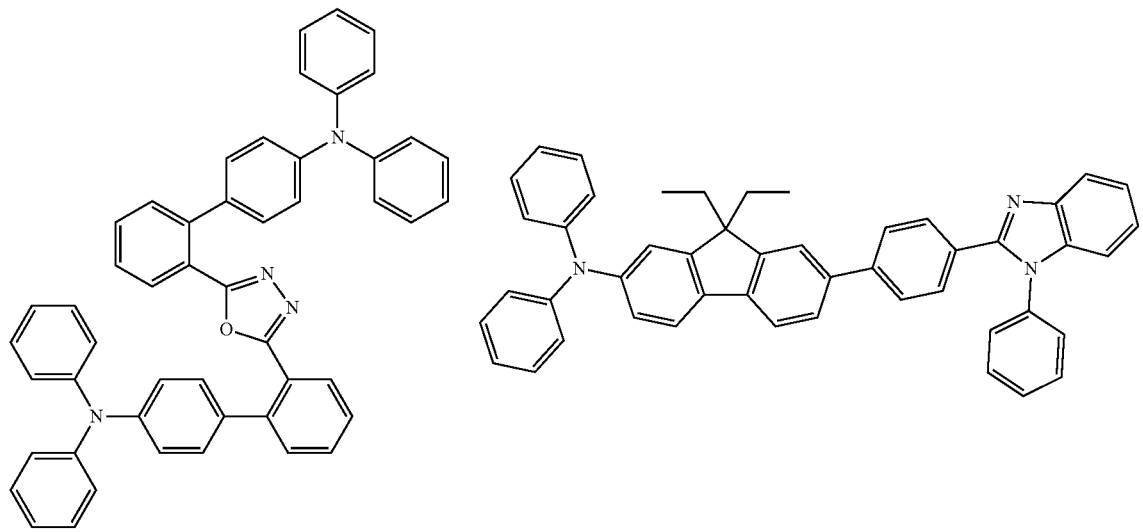
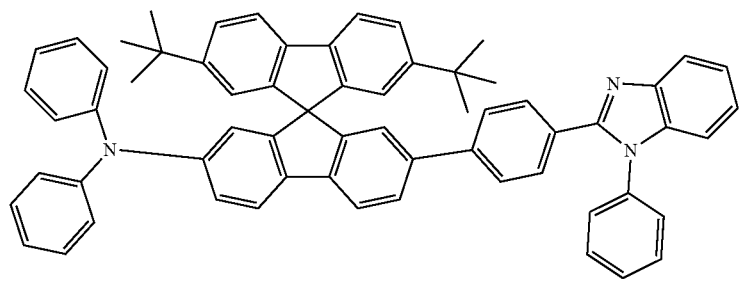
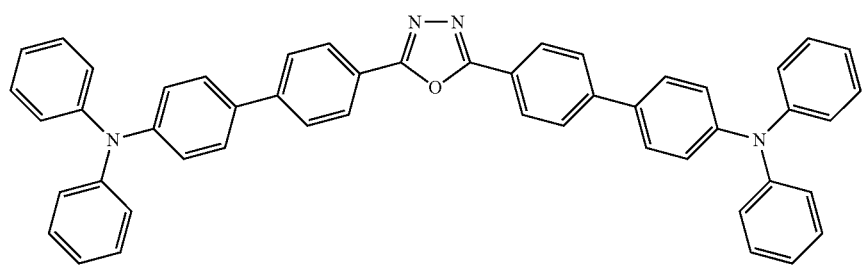

-continued
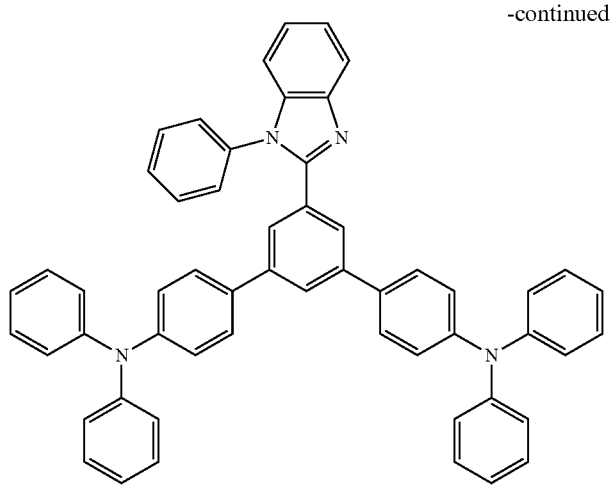
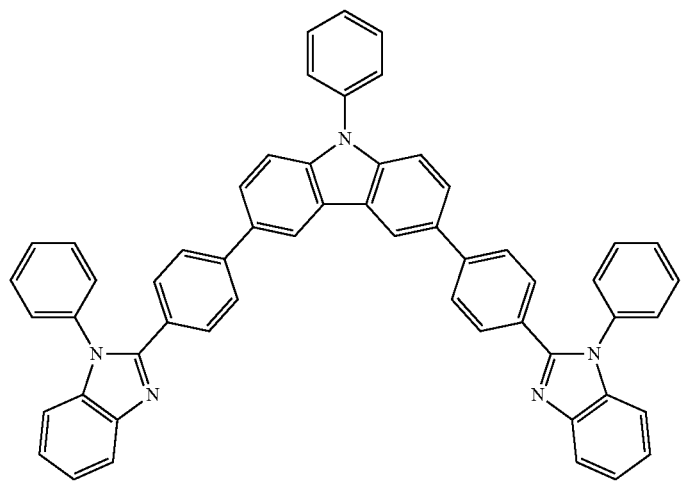
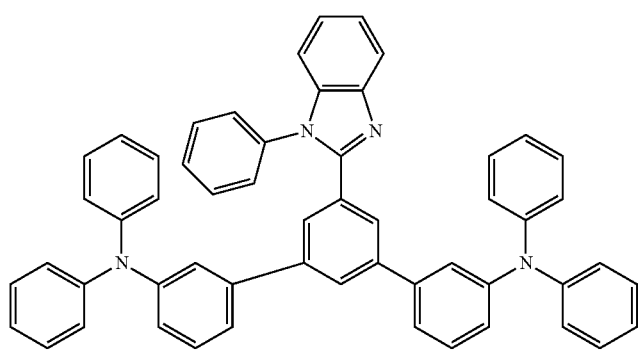

-continued
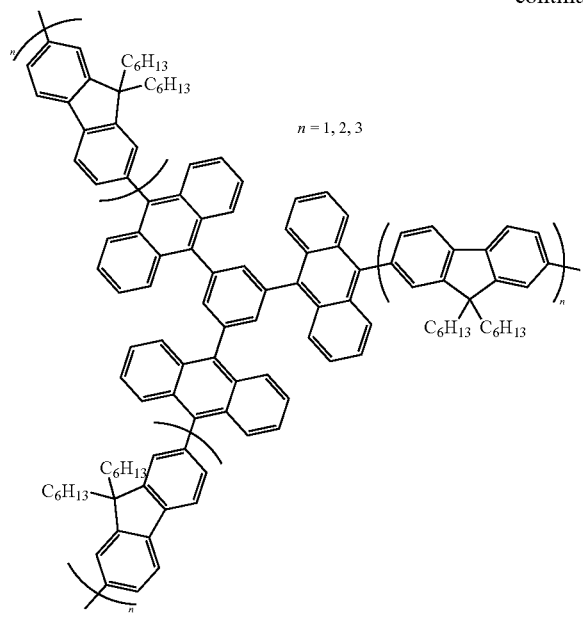
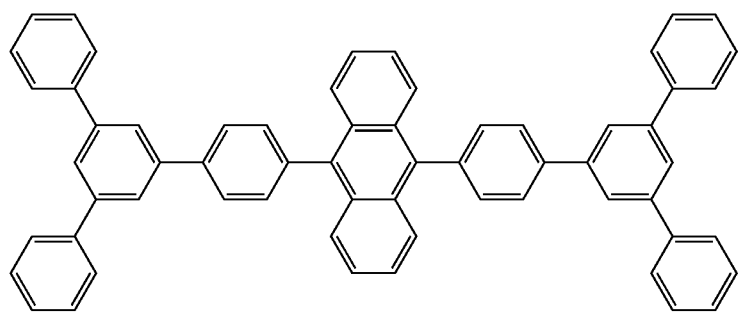
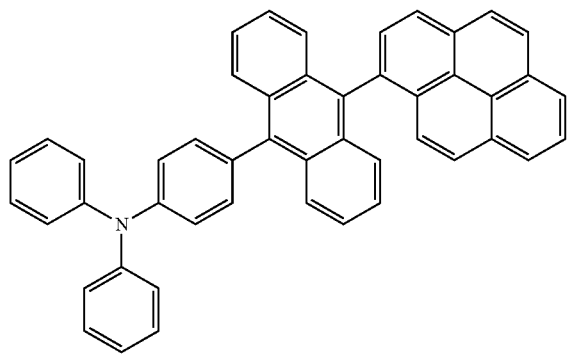

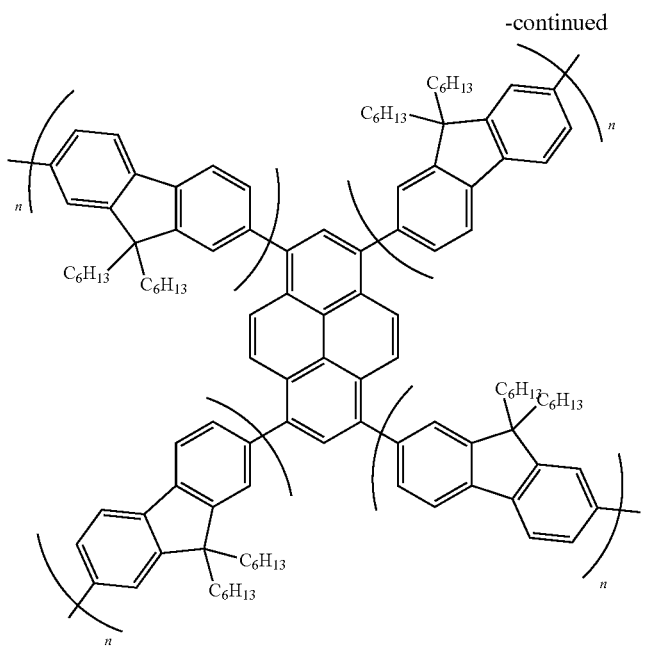
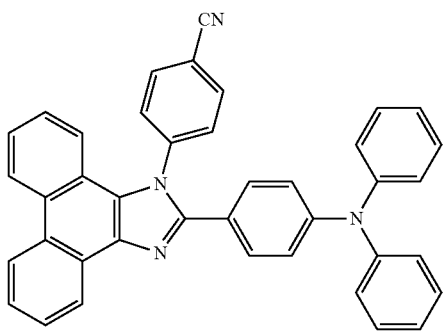
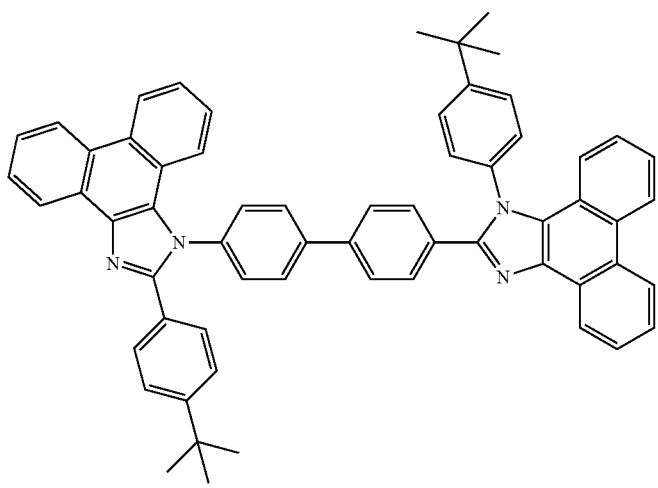
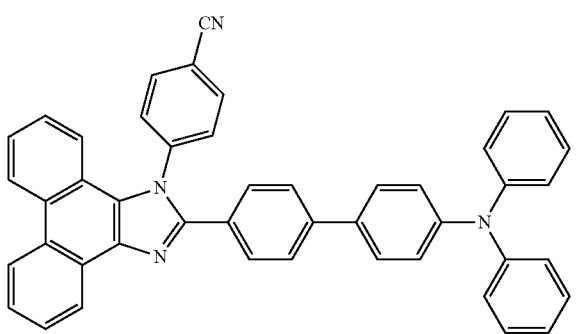

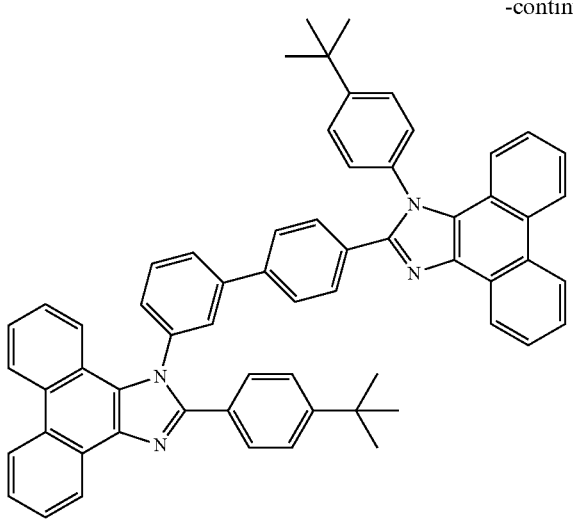
In a particularly preferred embodiment, $E^C$ is a fluorescence emitter selected from:
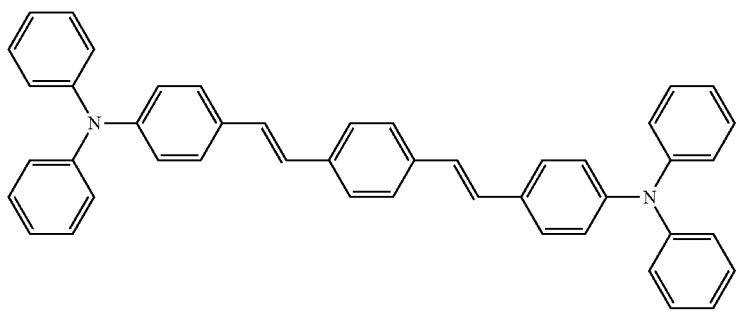
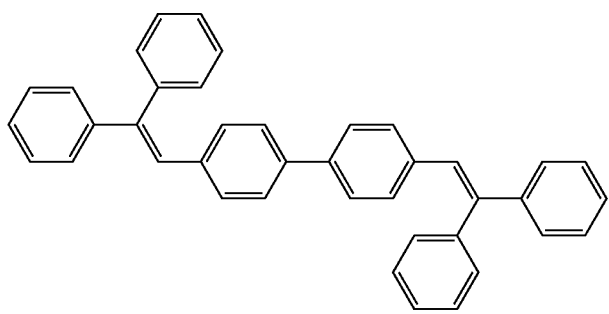
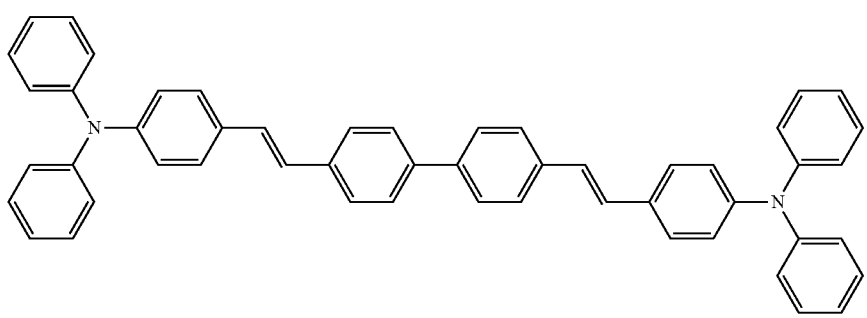

-continued
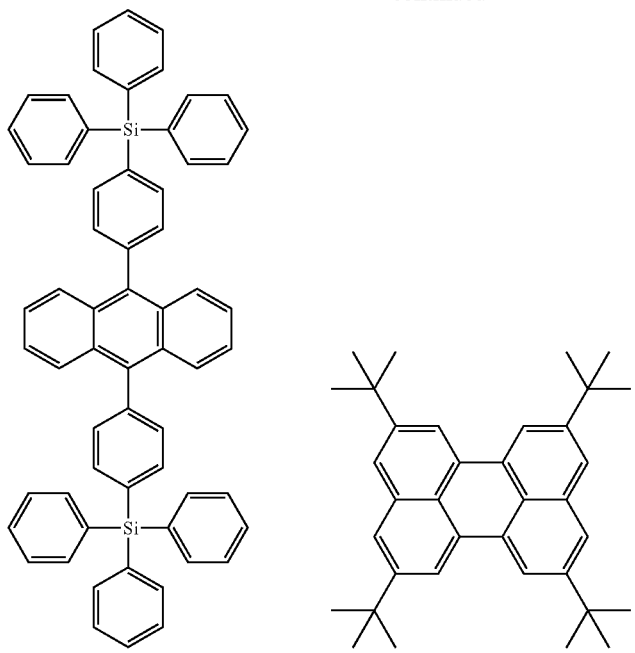
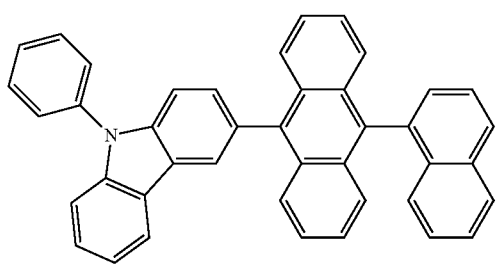
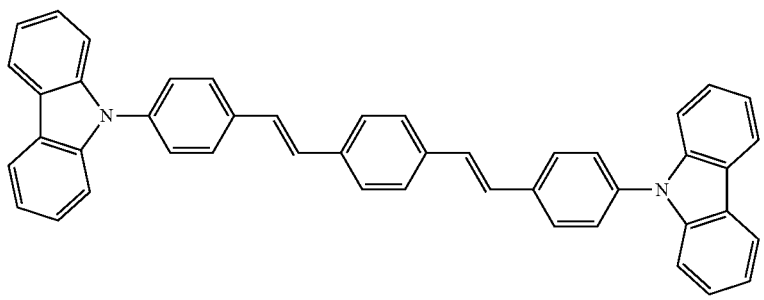
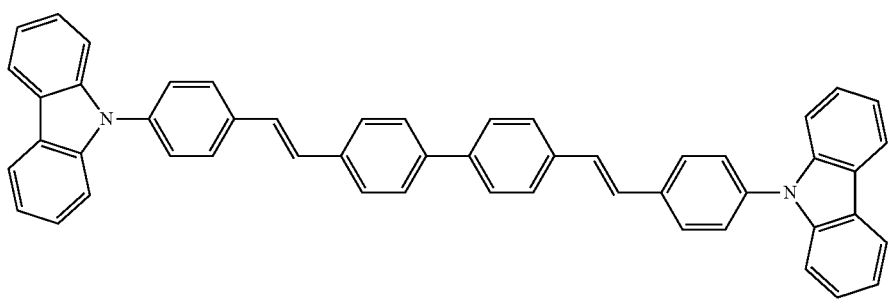

In another preferred embodiment, the at least one emitter compound $E^C$ is a triplet-triplet annihilation (TTA) emitter. Exemplarily, $E^C$ is a blue TTA emitter selected from:

(TADF) emitter. Exemplarily, $E^C$ is a blue TADF emitter selected from the group consisting of:

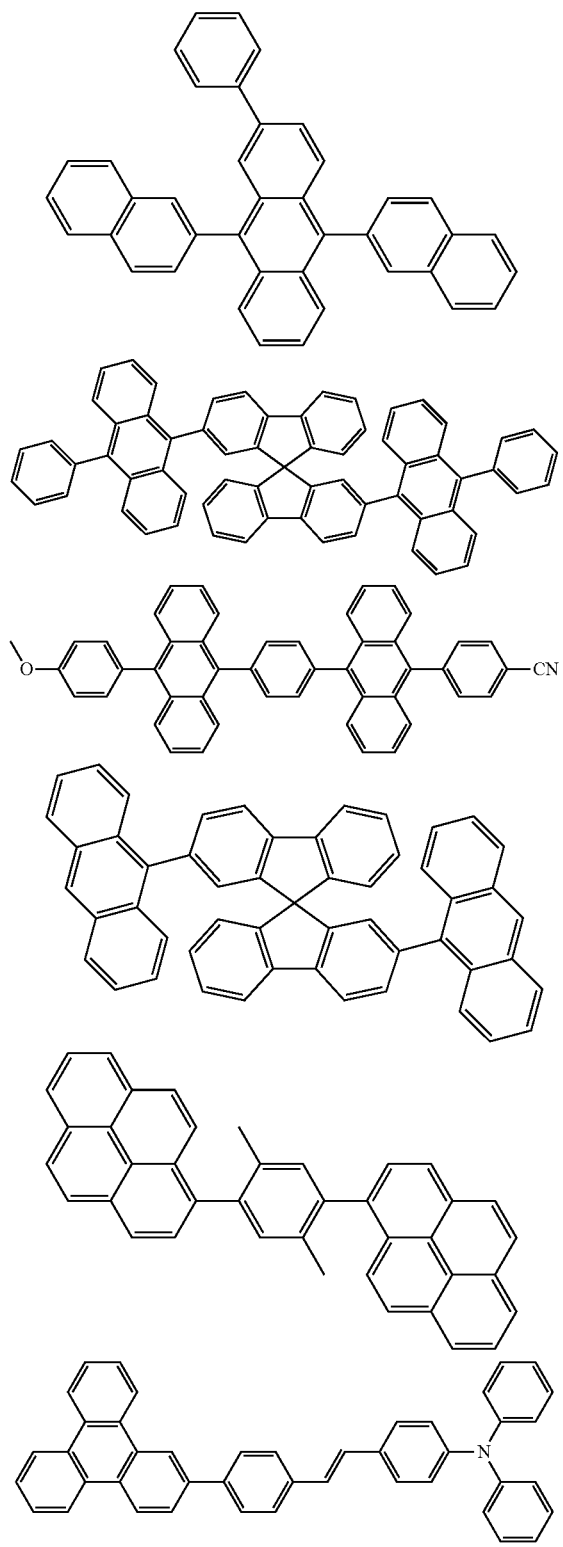

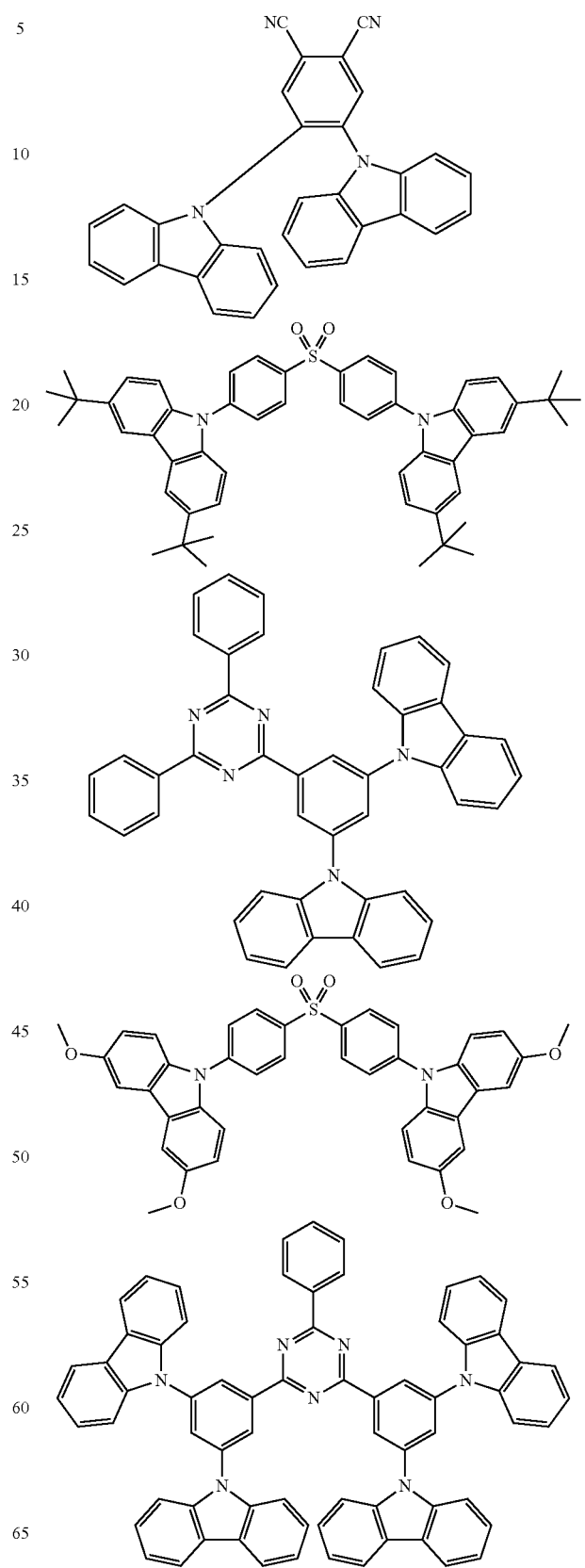

In a further preferred embodiment, the at least one emitter compound $E^C$ is a thermally activated delayed fluorescence 73
-continued
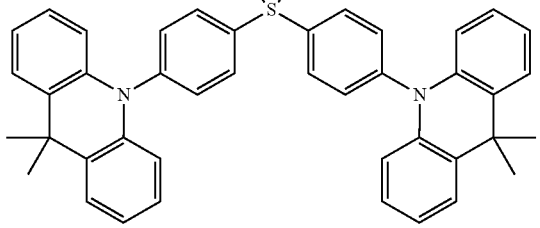
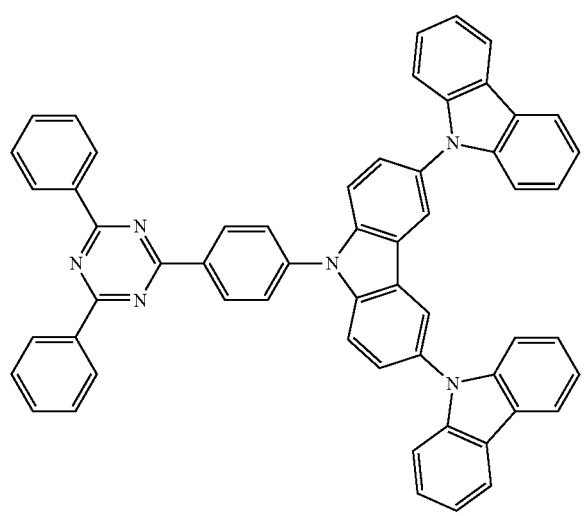
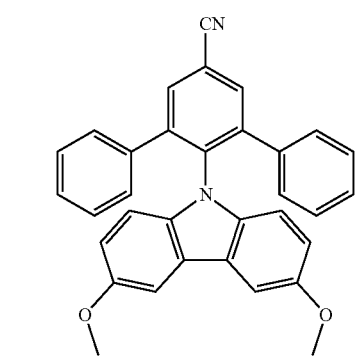
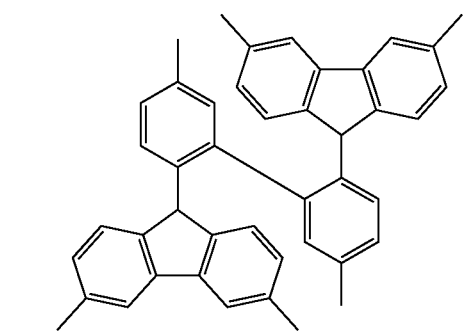
74
-continued
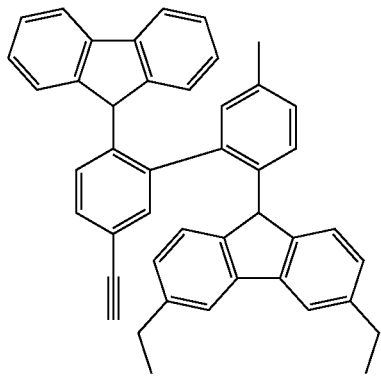
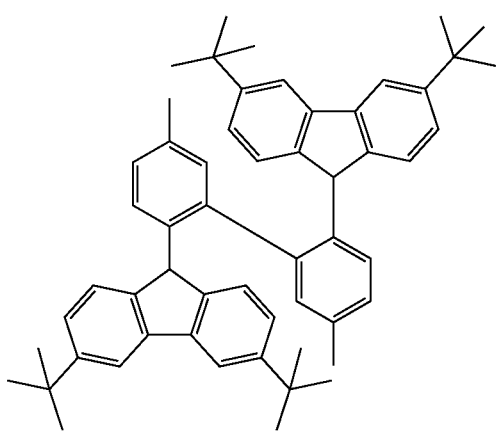
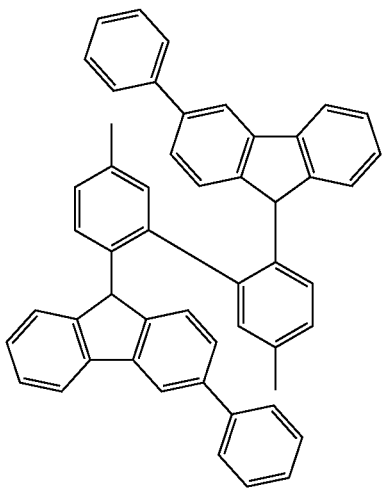
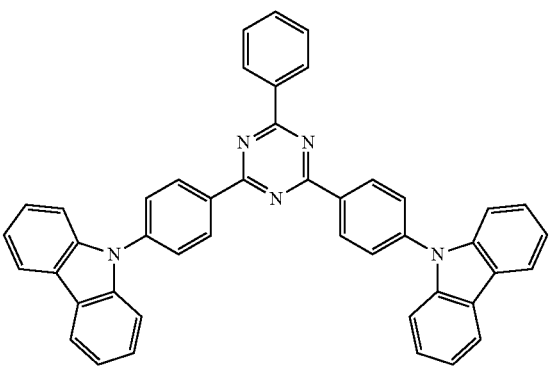

75
-continued
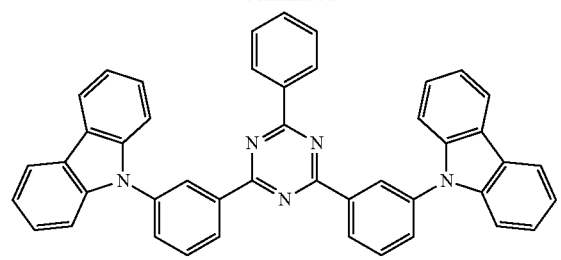
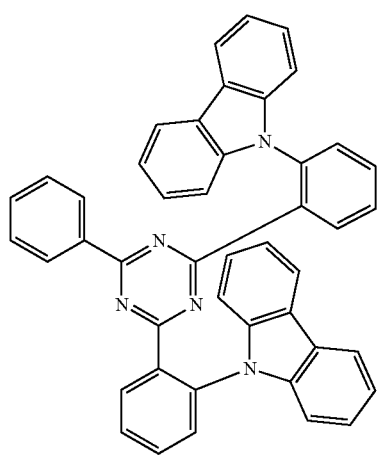
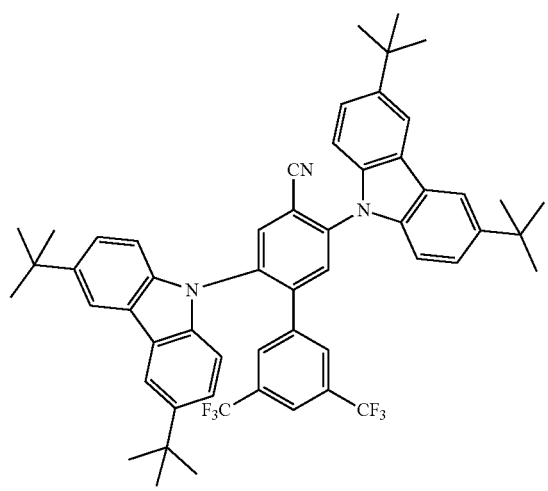
76
-continued
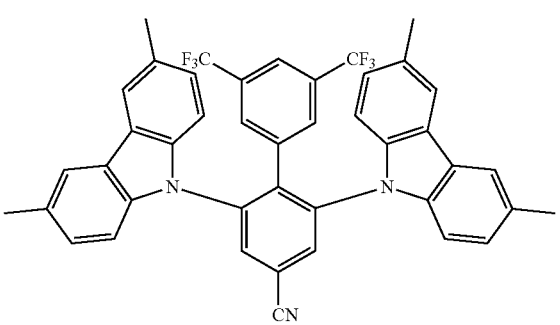
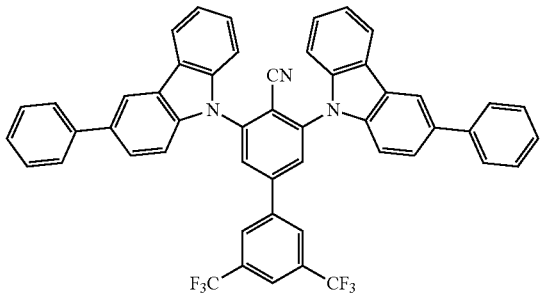
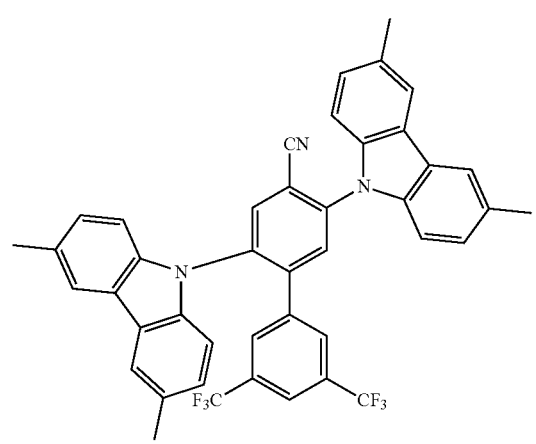
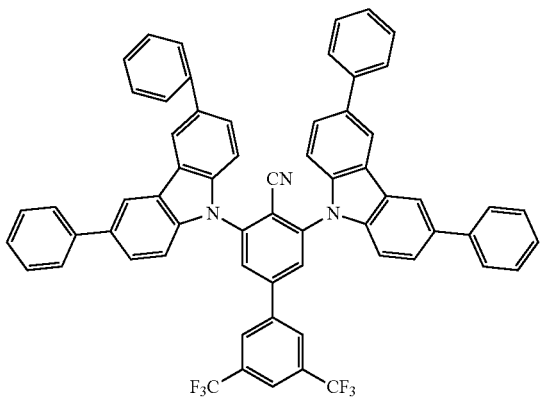

| 77 -continued | 78 -continued |
|---|---|
| 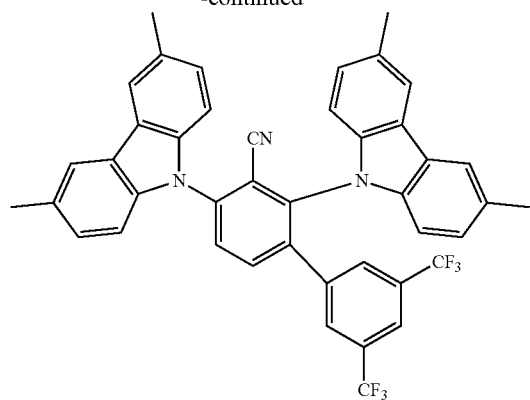 | 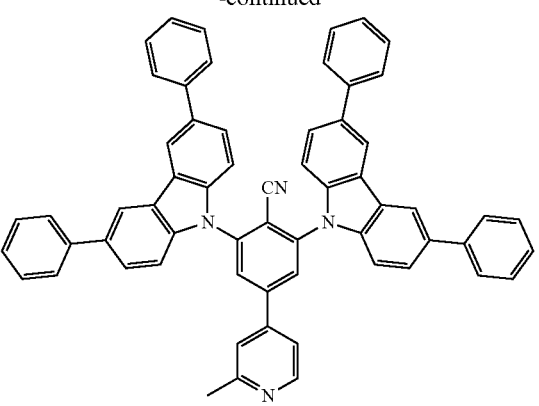 |
| 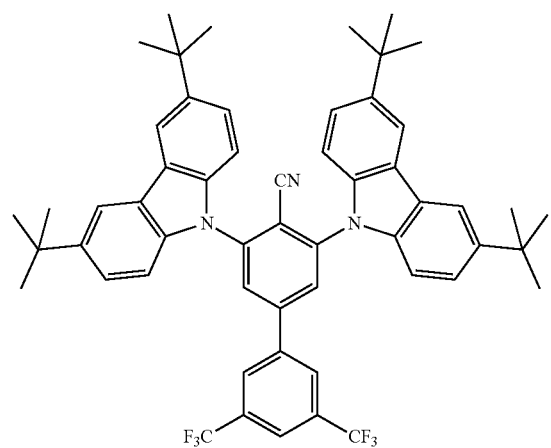 | 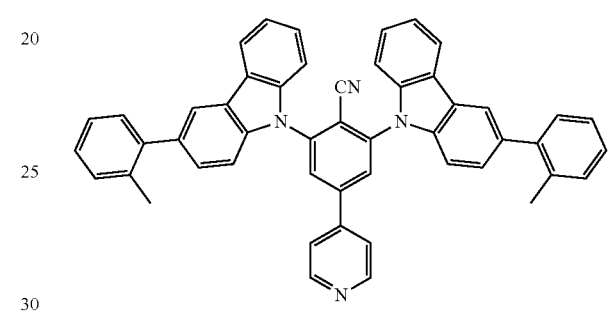 |
| 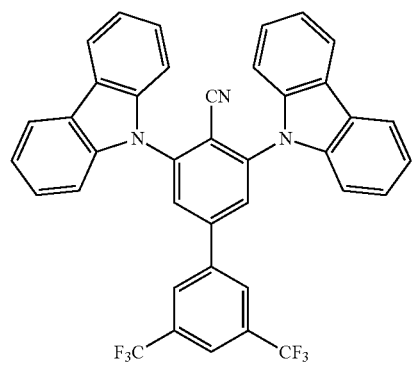 | 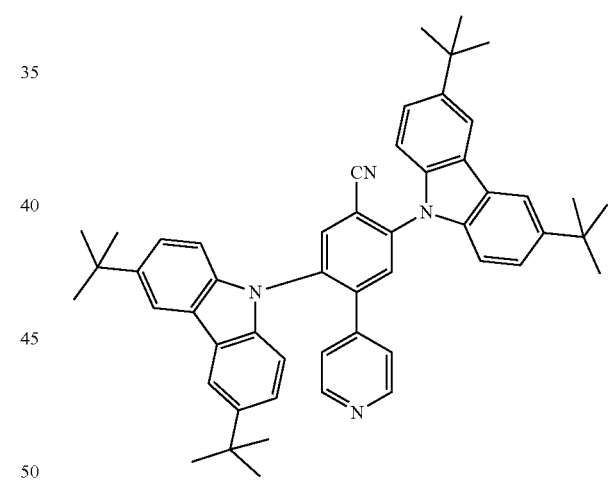 |
| 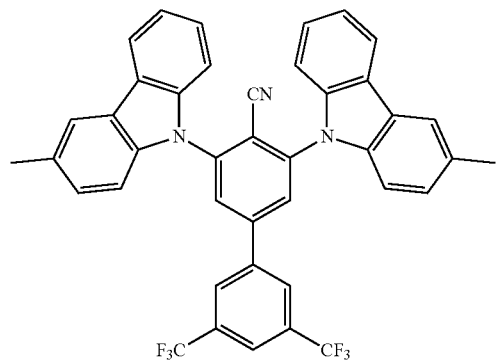 | 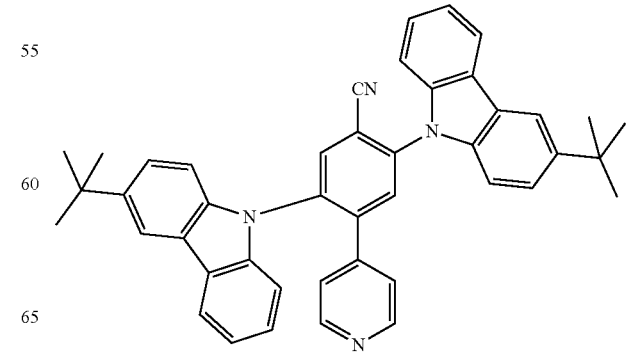 |

-continued
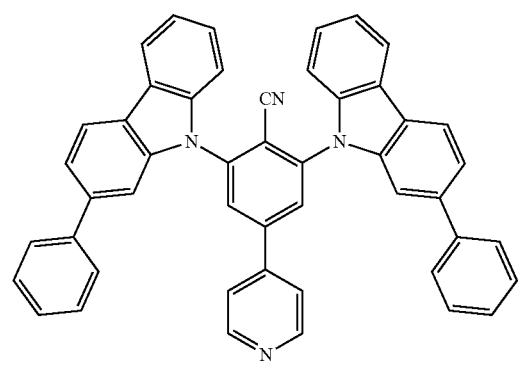
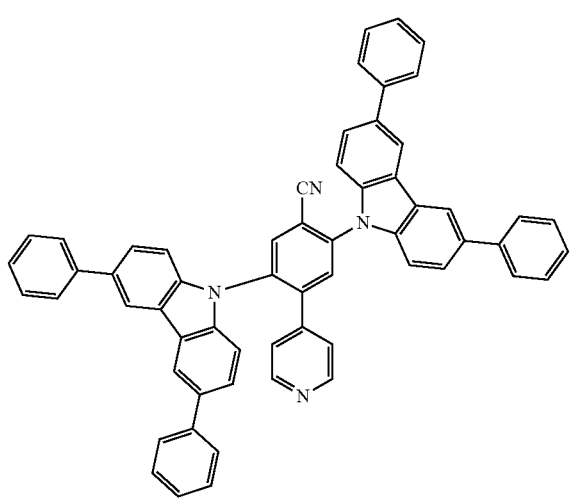
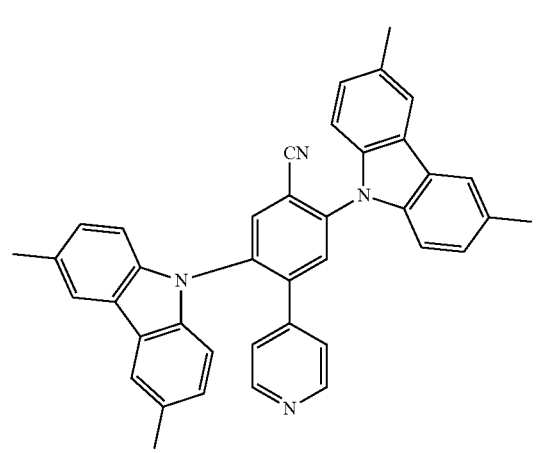
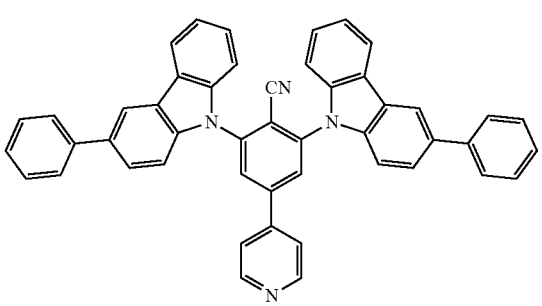
-continued
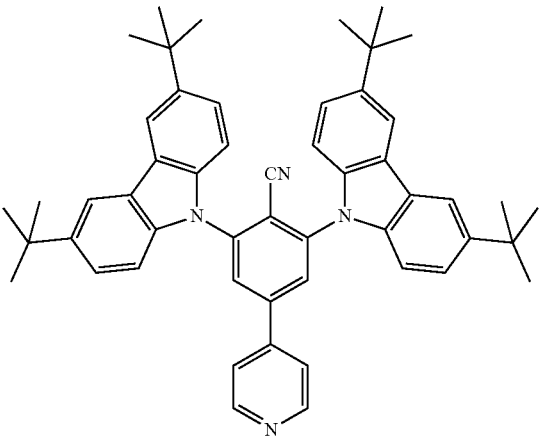
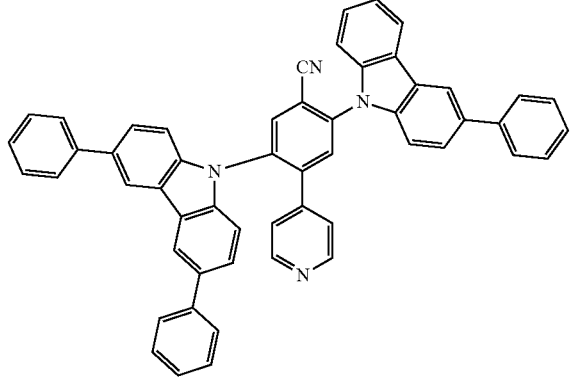
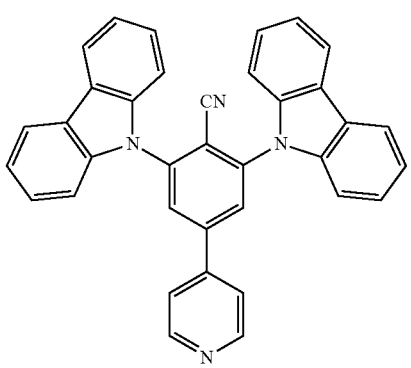
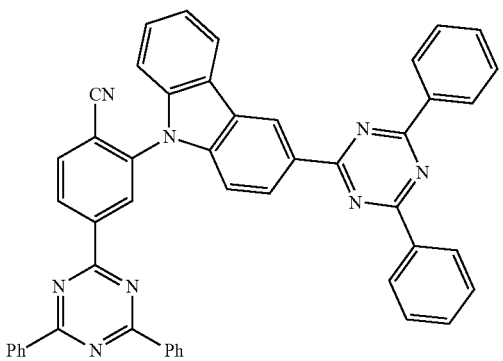
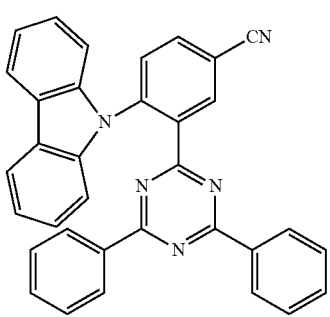

81
-continued
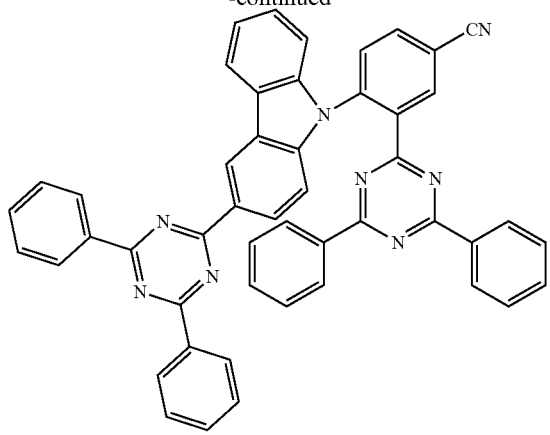
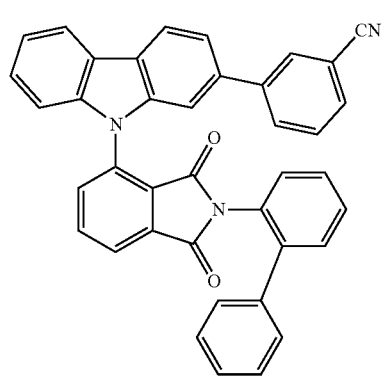
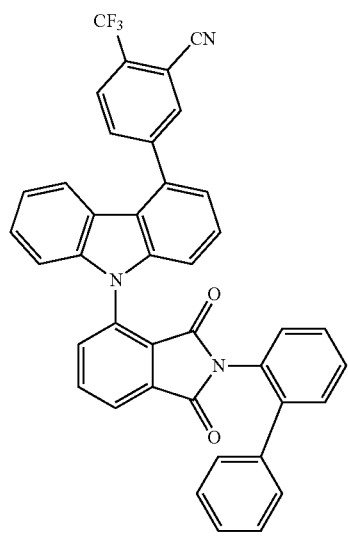
82
-continued
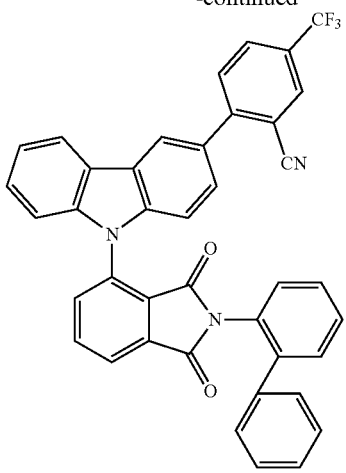
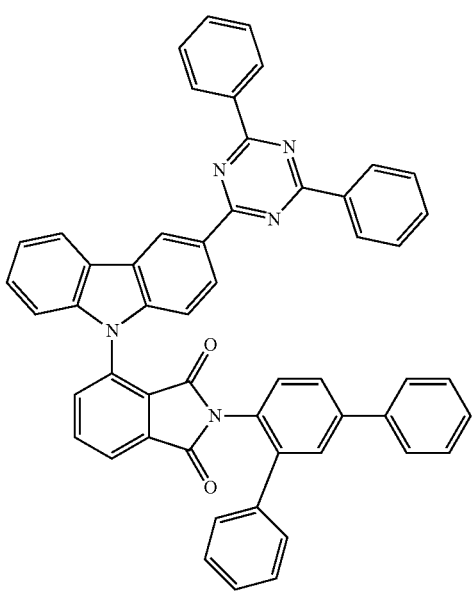
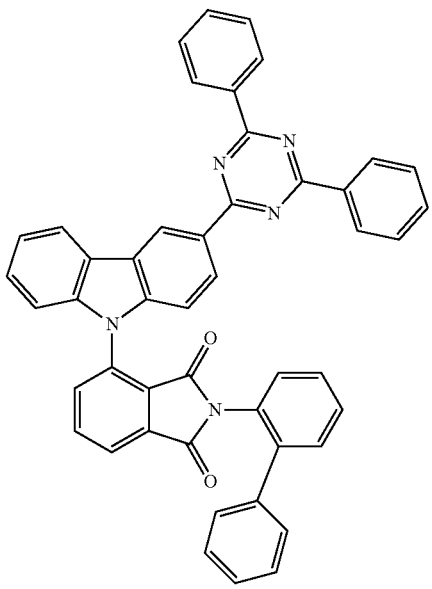

83
-continued
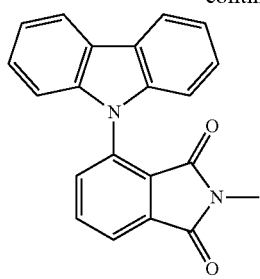
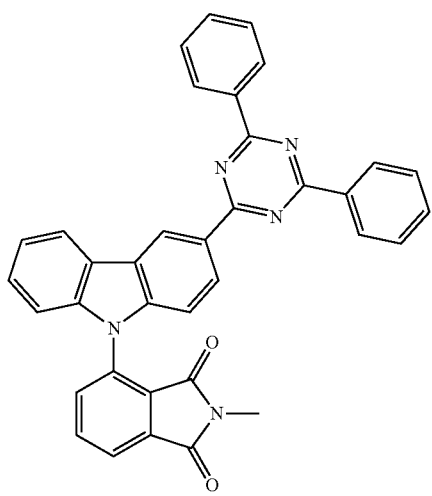
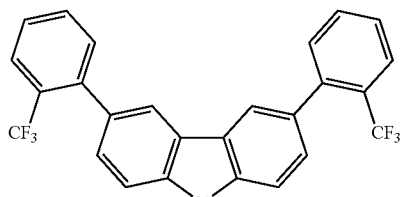
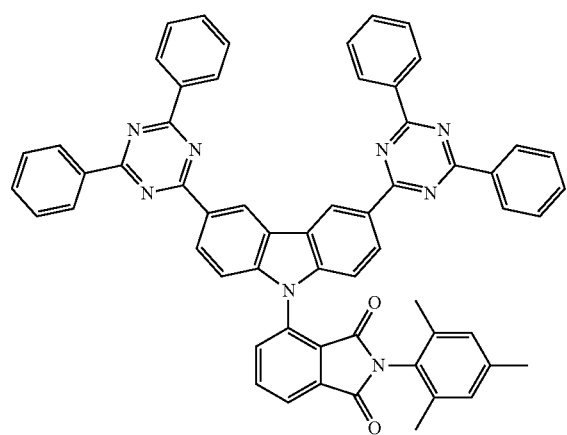
84
-continued
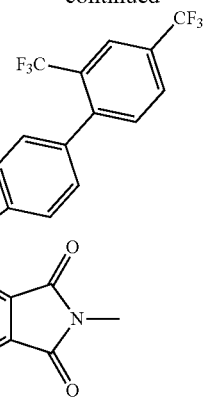
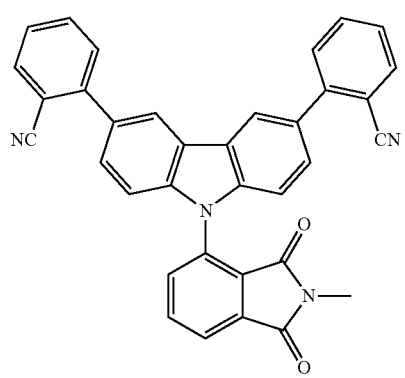
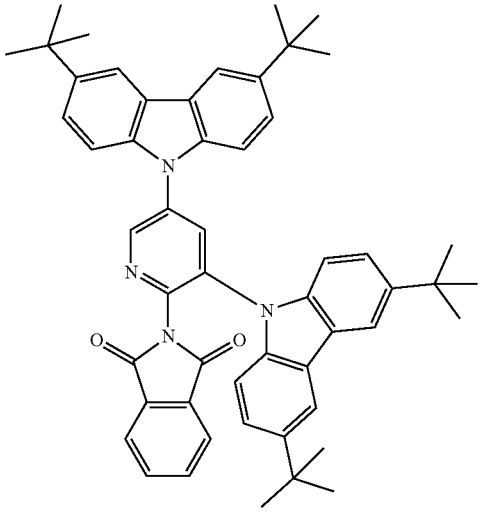

85
-continued
86
-continued
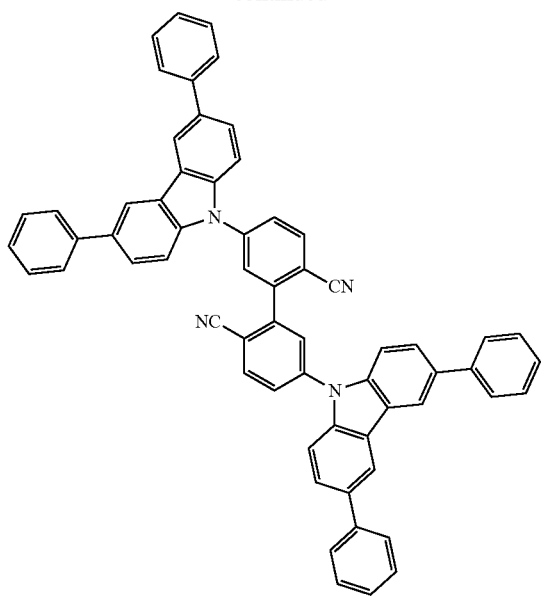
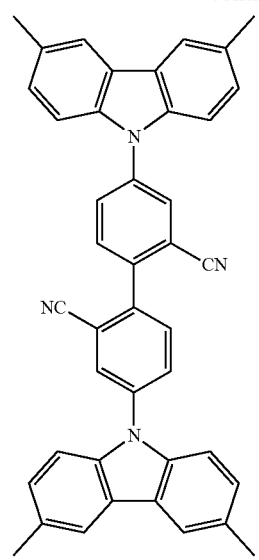
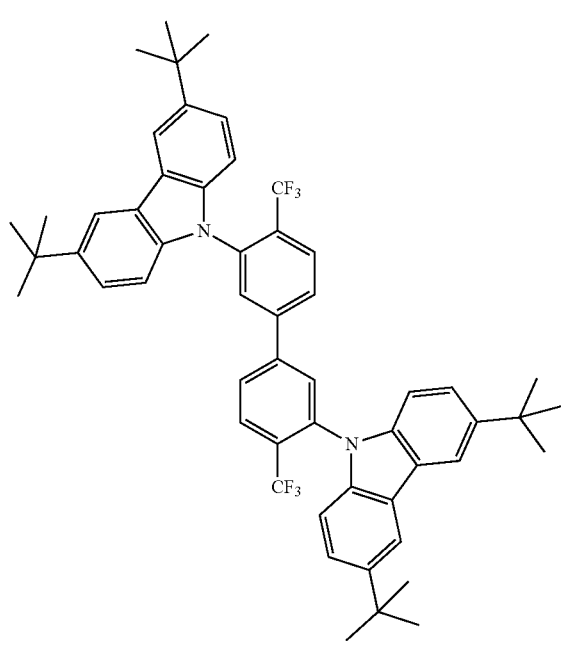
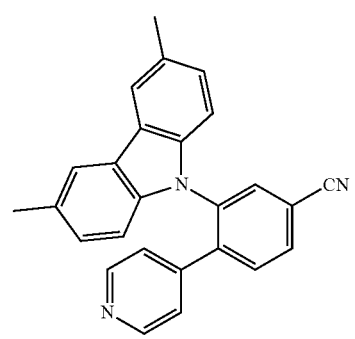
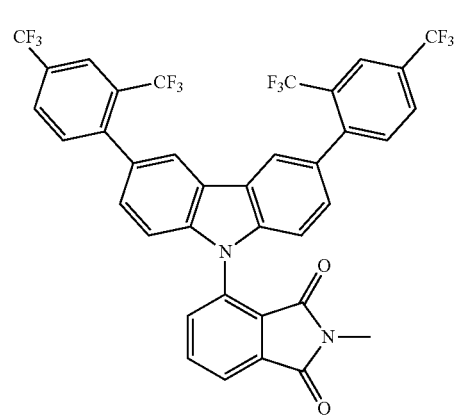
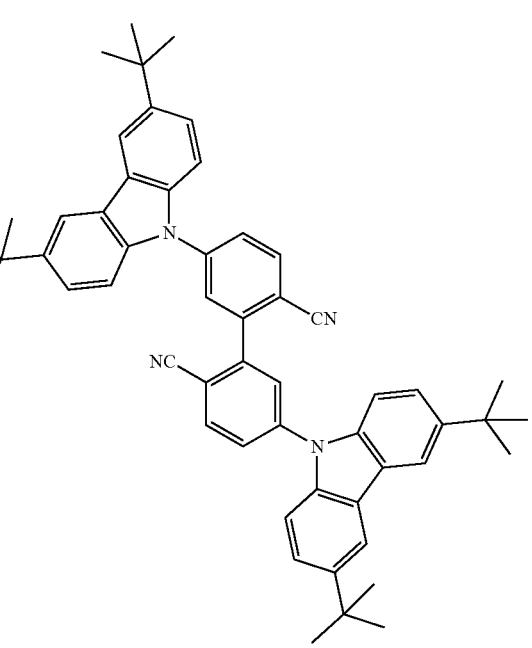

87
-continued
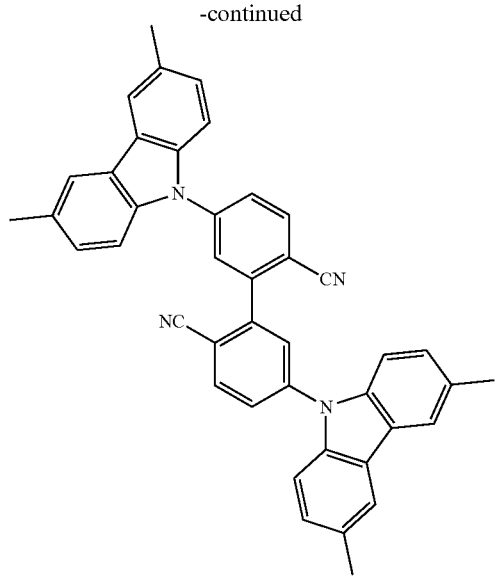
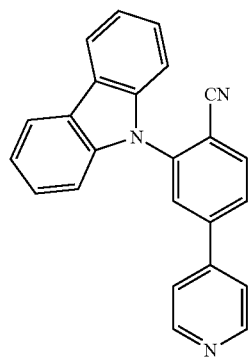
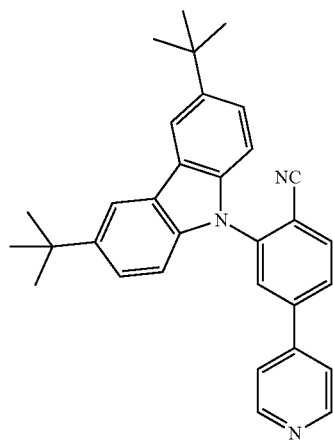
88
-continued
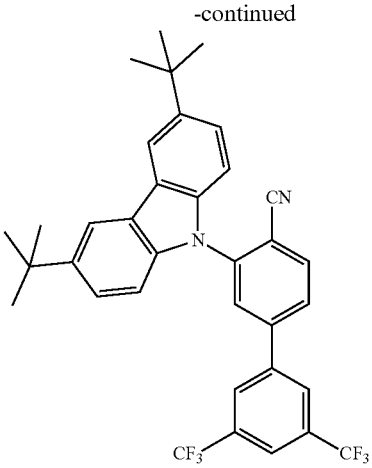
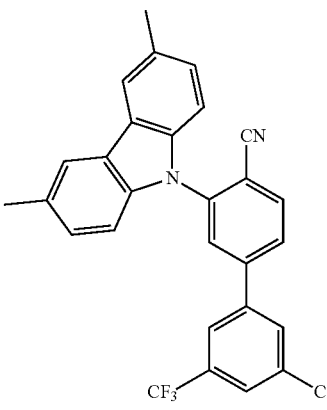
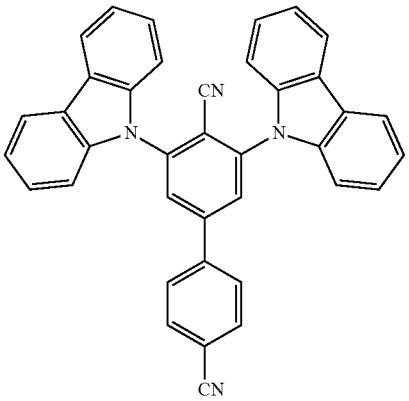

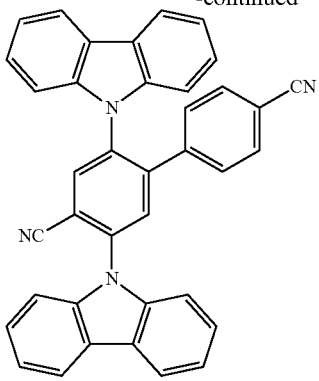
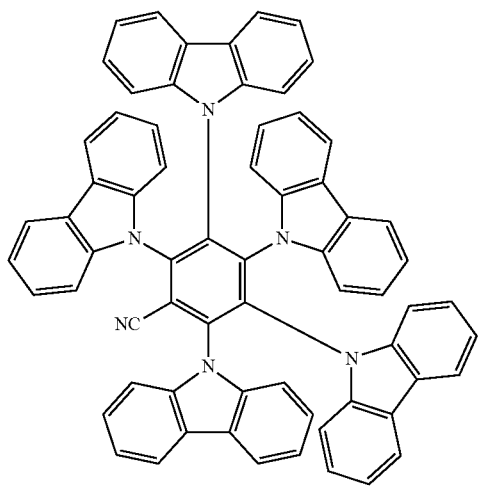
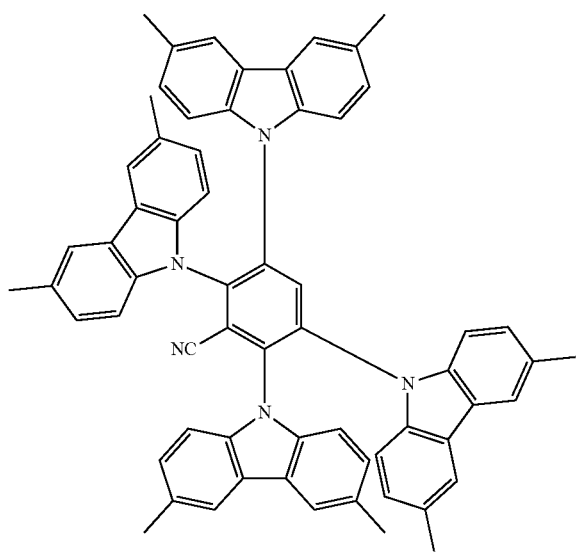

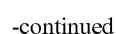
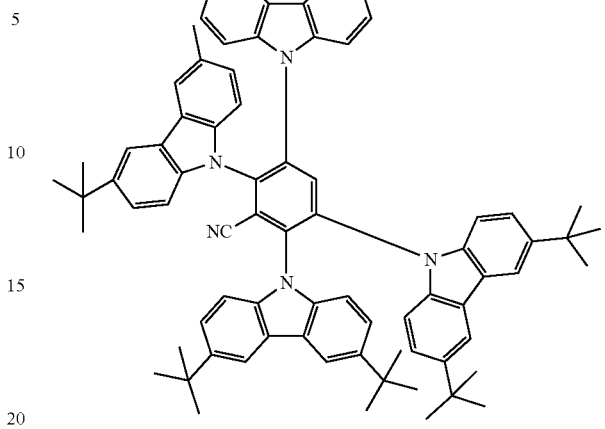

In a preferred embodiment, the $CIE_y$ coordinate is lowered due to emission of emitter compound $E^C$, which occurs at a shorter wavelength than the emission of emitter compound $E^B$. Preferably, the emission maximum of $E^C$ $\lambda_{max}(E^C)$ is close to the emission maximum of $E^B$ $\lambda_{max}(E^B)$. Particularly $\lambda_{max}(E^C)$ corresponds to a wavelength, at which the intensity of the emission of $E^B$ is non-zero due to the spectral shape of the emission peak.

Unless otherwise specified, any of the layers of the various embodiments may be deposited by any suitable method. The layers in the context of the present invention, including the light-emitting layer B, may optionally be prepared by means of liquid processing (also designated as "film processing", "fluid processing", "solution processing" or "solvent processing").

This means that the components comprised in the respective layer are applied to the surface of a part of a device in liquid state. Preferably, the layers in the context of the present invention, including the light-emitting layer B, may be prepared by means of spin-coating. This method well-known to those skilled in the art allows obtaining thin and (essentially) homogeneous layers.

Alternatively, the layers in the context of the present invention, including the light-emitting layer B, may be prepared by other methods based on liquid processing such as, e.g., casting (e.g., drop-casting) and rolling methods, and printing methods (e.g., inkjet printing, gravure printing, blade coating). This may optionally be carried out in an inert atmosphere (e.g., in a nitrogen atmosphere).

Alternatively, the layers in the context of the present invention may be prepared by any other method known in the art, including but not limited to vacuum processing methods well-known to those skilled in the art such as, e.g., thermal (co-)evaporation, organic vapor phase deposition (OVPD), and deposition by organic vapor jet printing (OVJP).

When preparing layers by means of liquid processing, the solutions including the components of the layers (i.e., with respect to the light-emitting layer B of the present invention, at least one host compound H and, typically, at least one emitter compound E and optionally one or more other host compounds D) may further comprise a volatile organic solvent. Such volatile organic solvent may optionally be one selected from the group consisting of tetrahydrofuran, dioxane, chlorobenzene, diethylene glycol diethyl ether, 2-(2- ethoxyethoxy)ethanol, gamma-butyrolactone, N-methyl pyrrolidinon, ethoxyethanol, xylene, toluene, anisole, phenetol, acetonitrile, tetrahydrothiophene, benzonitrile, pyridine, trihydrofuran, triarylamine, cyclohexanone, acetone, propylene carbonate, ethyl acetate, benzene and PGMEA (propylen glycol monoethyl ether acetate). Also a combination of two or more solvents may be used. After applied in liquid state, the layer may subsequently be dried and/or hardened by any means of the art, exemplarily at ambient conditions, at increased temperature (e.g., about 50° C. or about 60° C.) or at diminished pressure.

As used throughout the present application, the terms "aryl" and "aromatic" may be understood in the broadest sense as any mono-, bi- or polycyclic aromatic moieties. If not otherwise indicated, an aryl may also be optionally substituted by one or more substituents which are exemplified further throughout the present application. Accordingly, the term "arylene" refers to a divalent residue that bears two binding sites to other molecular structures and thereby serving as a linker structure. As used throughout the present application, the terms "heteroaryl" and "heteroaromatic" may be understood in the broadest sense as any mono-, bi- or polycyclic heteroaromatic moieties that include at least one heteroatom, in particular which bear from one to three heteroatoms per aromatic ring. Exemplarily, a heteroaromatic compound may be pyrrole, furan, thiophene, imidazole, oxazole, thiazole, triazole, pyrazole, pyridine, pyrazine and pyrimidine, and the like. If not otherwise indicated, a heteroaryl may also be optionally substituted by one or more substituents which are exemplified further throughout the present application. Accordingly, the term "heteroarylene" refers to a divalent residue that bears two binding sites to other molecular structures and thereby serving as a linker structure.

As used throughout the present application, the term "alkyl" may be understood in the broadest sense as both, linear or branched chain alkyl residue. Preferred alkyl residues are those containing from one to fifteen carbon atoms. Exemplarily, an alkyl residue may be methyl, ethyl, propyl, isopropyl, butyl, isobutyl, tert-butyl, and the like. If not otherwise indicated, an alkyl may also be optionally substituted by one or more substituents which are exemplified further throughout the present application. Accordingly, the term "alkylene" refers to a divalent residue that bears two binding sites to other molecular structures and thereby serving as a linker structure.

If not otherwise indicated, as used herein, in particular in the context of aryl, arylene, heteroaryl, alkyl and the like, the term "substituted" may be understood in the broadest sense. Preferably, such substitution means a residue selected from the group consisting of $C_1$-$C_{20}$-alkyl, $C_7$-$C_{19}$-alkaryl, and $C_6$-$C_{18}$-aryl. Accordingly, preferably, no charged moiety, more preferably no functional group is present in such substitution.

It will be noticed that hydrogen can, at each occurrence, be replaced by deuterium.

The organic electroluminescent device may be understood in the broadest sense as any device based on organic materials that is suitable for emitting light in the visible or nearest ultraviolet (UV) range, i.e., in the range of a wavelength of from 380 to 800 nm. More preferably, organic electroluminescent device may be able to emit light in the visible range, i.e., of from 400 to 800 nm.

In a preferred embodiment, the organic electroluminescent device is a device selected from the group consisting of an organic light emitting diode (OLED), a light emitting electrochemical cell (LEC), and a light-emitting transistor.

Particularly preferably, the organic electroluminescent device is an organic light emitting diode (OLED). Optionally, the OLED may be a phosphorescent organic light-emitting diode (PHOLED). Optionally, the OLED may include hyperfluorescence. Optionally, the organic electroluminescent device as a whole may be intransparent, semi-transparent or (essentially) transparent.

Preferably, the anode layer A contains at least one component selected from the group consisting of indium tin oxide, indium zinc oxide, PbO, SnO, graphite, doped silicium, doped germanium, doped GaAs, doped polyaniline, doped polypyrrole, doped polythiophene, and mixtures of two or more thereof.

Preferably, the cathode layer K contains at least one component selected from the group consisting of Al, Au, Ag, Pt, Cu, Zn, Ni, Fe, Pb, In, W, Pd, LiF, Ca, Ba, Mg, and mixtures or alloys of two or more thereof.

Furthermore, the organic electroluminescent device may optionally comprise one or more protective layers protecting the device from damaging exposure to harmful species in the environment including, exemplarily moisture, vapor and/or gases.

Preferably, the anode layer A is located on the surface of a substrate. The substrate may be formed by any material or composition of materials. Most frequently, glass slides are used as substrates. Alternatively, thin metal layers (e.g., copper, gold, silver or aluminum films) or plastic films or slides may be used. This may allow a higher degree of flexibility. The anode layer A is mostly composed of materials allowing to obtain an (essentially) transparent film. As at least one of both electrodes should be (essentially) transparent in order to allow light emission from the OLED, either the anode layer A or the cathode layer K transparent. Preferably, the anode layer A comprises a large content or even consists of transparent conductive oxides (TCOs). Such anode layer A may exemplarily comprise indium tin oxide, aluminum zinc oxide, fluor tin oxide, indium zinc oxide, PbO, SnO, zirconium oxide, molybdenum oxide, vanadium oxide, wolfram oxide, graphite, doped Si, doped Ge, doped GaAs, doped polyaniline, doped polypyrrol and/or doped polythiophene.

Particularly preferably, the anode layer A (essentially) consists of indium tin oxide (ITO) (e.g., $(InO_3)_{0.9}(SnO_2)_{0.1}$). The roughness of the anode layer A caused by the transparent conductive oxides (TCOs) may be compensated by using a hole injection layer (HIL). Further, the HIL may facilitate the injection of quasi charge carriers (i.e., holes) in that the transport of the quasi charge carriers from the TCO to the hole transport layer (HTL) is facilitated. The hole injection layer (HIL) may comprise poly-3,4-ethylendioxy thiophene (PEDOT), polystyrene sulfonate (PSS), $MoO_2$, $V_2O_5$, CuPC or CuI, in particular a mixture of PEDOT and PSS. The hole injection layer (HIL) may also prevent the diffusion of metals from the anode layer A into the hole transport layer (HTL). The HIL may exemplarily comprise PEDOT:PSS (poly-3,4-ethylendioxy thiophene: polystyrene sulfonate), PEDOT (poly-3,4-ethylendioxy thiophene), mMTDATA (4,4',4"-tris[phenyl(m-tolyl)amino]triphenylamine), Spiro-TAD (2,2',7,7'-tetrakis(n,n-diphenylamino)-9,9'-spirobifluorene), DNTPD (N1,N1'-(biphenyl-4,4'-diyl)bis(N1-phenyl-N4,N4-di-m-tolylbenzene-1,4-diamine), NPB (N,N'-nis-(1-naphthalenyl)-N,N'-bis-phenyl-(1,1'-biphenyl)-4,4'-diamine), NPNPB (N, N'-diphenyl-N, N'-di-[4-(N, N-diphenyl-amino)phenyl]benzidine), MeO-TPD (N,N,N', N'-tetrakis(4-methoxyphenyl)benzidine), HAT-CN (1,4,5,8, 9,11-hexaazatriphenylen-hexacarbonitrile) and/or Spiro-NPD (N,N'-diphenyl-N,N'-bis-(1-naphthyl)-9,9'-spirobifluorene-2,7-diamine).

Adjacent to the anode layer A or hole injection layer (HIL) typically a hole transport layer (HTL) is located. Herein, any hole transport compound may be used. Exemplarily, electron-rich heteroaromatic compounds such as triarylamines and/or carbazoles may be used as hole transport compound. The HTL may decrease the energy barrier between the anode layer A and the light-emitting layer B (serving as emitting layer (EML)). The hole transport layer (HTL) may also be an electron blocking layer (EBL). Preferably, hole transport compounds bear comparably high energy levels of their triplet states T1. Exemplarily the hole transport layer (HTL) may comprise a star-shaped heterocycle such as tris(4-carbazoyl-9-ylphenyl)amine (TCTA), poly-TPD (poly(4-butylphenyl-diphenyl-amine)), [alpha]-NPD (poly(4-butylphenyl-diphenyl-amine)), TAPC (4,4'-cyclohexyliden-bis[N,N-bis(4-methylphenyl)benzenamine]), 2-TNATA (4,4',4"-tris [2-naphthyl(phenyl)amino]triphenylamine), Spiro-TAD, DNTPD, NPB, NPNPB, MeO-TPD, HAT-CN and/or TrisPcz (9,9'-diphenyl-6-(9-phenyl-9H-carbazol-3-yl)-9H, 9'H-3,3'-bicarbazole). In addition, the HTL may comprise a p-doped layer, which may be composed of an inorganic or organic dopant in an organic hole-transporting matrix. Transition metal oxides such as vanadium oxide, molybdenum oxide or tungsten oxide may exemplarily be used as inorganic dopant. Tetrafluorotetracyanoquinodimethane (F4-TCNQ), copper-pentafluorobenzoate (Cu(I)pFBz) or transition metal complexes may exemplarily be used as organic dopant.

The EBL may exemplarily comprise mCP (1,3-bis(carbazol-9-yl)benzene), TCTA, 2-TNATA, mCBP (3,3-di(9H-carbazol-9-yl)biphenyl), 9-[3-(dibenzofuran-2-yl)phenyl]-9H-carbazole, 9-[3-(dibenzofuran-2-yl)phenyl]-9H-carbazole, 9-[3-(dibenzothiophen-2-yl)phenyl]-9H-carbazole, 9-[3,5-bis(2-dibenzofuranyl)phenyl]-9H-carbazole, 9-[3,5-bis(2-dibenzothiophenyl)phenyl]-9H-carbazole, tris-Pcz, CzSi (9-(4-tert-butylphenyl)-3,6-bis(triphenylsilyl)-9H-carbazole), and/or DCB (N,N'-dicarbazolyl-1,4-dimethylbenzene).

Adjacent to the hole transport layer (HTL), typically, the light-emitting layer B is located. Adjacent to the light-emitting layer B, the exciton quenching layer C is located. Adjacent to the exciton quenching layer C, the electron transport layer D is located.

The emission layer B comprises at least one host material $H^B$ and at least one emitter $E^B$. Exemplarily, the host material $H^B$ and/or the further host compound $H^{B2}$ are selected from the group consisting of CBP (4,4'-Bis-(N-carbazolyl)-biphenyl), mCP, mCBP Sif87 (dibenzo[b,d]thiophen-2-yltriphenylsilane), CzSi, Sif88 (dibenzo[b,d]thiophen-2-yl)diphenylsilane), DPEPO (bis[2-(diphenylphosphino)phenyl] ether oxide), 9-[3-(dibenzofuran-2-yl)phenyl]-9H-carbazole, 9-[3-(dibenzofuran-2-yl)phenyl]-9H-carbazole, 9-[3-(dibenzothiophen-2-yl)phenyl]-9H-carbazole, 9-[3,5-bis(2-dibenzofuranyl)phenyl]-9H-carbazole, 9-[3,5-bis(2-dibenzothiophenyl)phenyl]-9H-carbazole, T2T (2,4,6-tris (biphenyl-3-yl)-1,3,5-triazine), T3T (2,4,6-tris(triphenyl-3-yl)-1,3,5-triazine) and/or TST (2,4,6-tris(9,9'-spirobifluorene-2-yl)-1,3,5-triazine). In one embodiment of the invention, the emission layer B comprises a so-called mixed-host system with at least one hole-dominant host and one electron-dominant host.

If Sif88 (dibenzo[b,d]thiophen-2-yl)diphenylsilane) is intended to be used as electron transport material $ETM^D$, it is preferably not used as host material $H^B$.

In a particularly preferred embodiment, the emission layer B comprises exactly one emitter $E^B$ and a mixed-host system comprising T2T as electron-dominant host $H^B$ and a further host $H^{B2}$ selected from the group consisting of CBP, mCP, mCBP, 9-[3-(dibenzofuran-2-yl)phenyl]-9H-carbazole, 9-[3-(dibenzofuran-2-yl)phenyl]-9H-carbazole, 9-[3-(dibenzothiophen-2-yl)phenyl]-9H-carbazole, 9-[3,5-bis(2-dibenzofuranyl)phenyl]-9H-carbazole and 9-[3,5-bis(2-dibenzothiophenyl)phenyl]-9H-carbazole as hole-dominant host.

In a further preferred embodiment, the emission layer B comprises:
(i) 10-45% by weight, preferably 15-30% by weight of T2T as host $H^B$;
(ii) 5-40% by weight, preferably 10-30% by weight of the at least one emitter compound $E^B$; and
(ii) 50-85% by weight, preferably 60-75% by weight of a host $H^{B2}$ selected from the group consisting of CBP, mCP, mCBP, 9-[3-(dibenzofuran-2-yl)phenyl]-9H-carbazole, 9-[3-(dibenzofuran-2-yl)phenyl]-9H-carbazole, 9-[3-(dibenzothiophen-2-yl)phenyl]-9H-carbazole, 9-[3,5-bis(2-dibenzofuranyl)phenyl]-9H-carbazole and 9-[3,5-bis(2-dibenzothiophenyl)phenyl]-9H-carbazole.

In another embodiment, the host compound $H^B$ has a highest occupied molecular orbital HOMO($H^B$) having an energy $E^{HOMO}(H^B)$ in the range of from −5 to −6.5 eV and the at least one further host compound $H^{B2}$ has a highest occupied molecular orbital HOMO($H^{B2}$) having an energy $E^{HOMO}(H^{B2})$, wherein $E^{HOMO}(H^B) > E^{HOMO}(H^{B2})$.

In a further preferred embodiment, the host compound $H^B$ has a lowest unoccupied molecular orbital LUMO($H^B$) having an energy $E^{LUMO}(H^B)$ and the at least one further host compound $H^{B2}$ has a lowest unoccupied molecular orbital LUMO($H^{B2}$) having an energy $E^{LUMO}(H^{B2})$, wherein $E^{LUMO}(H^B) > E^{LUMO}(H^{B2})$.

In one embodiment, one host compound $H^B$ has a highest occupied molecular orbital HOMO($H^B$) having an energy $E^{HOMO}(H^B)$ and a lowest unoccupied molecular orbital LUMO($H^B$) having an energy $E^{LUMO}(H^B)$, and
the at least one further host compound $H^{B2}$ has a highest occupied molecular orbital HOMO($H^{B2}$) having an energy $E^{HOMO}(H^{B2})$) and a lowest unoccupied molecular orbital LUMO($H^{B2}$) having an energy $E^{LUMO}(H^{B2})$,
the at least one emitter compound $E^B$ has a highest occupied molecular orbital HOMO($E^B$) having an energy $E^{HOMO}(E^B)$ and a lowest unoccupied molecular orbital LUMO($E^B$) having an energy $E^{LUMO}(E^B)$,
wherein
$E^{HOMO}(H^B) > E^{HOMO}(H^{B2})$ and the difference between the energy level of the highest occupied molecular orbital HOMO(E) of the at least one emitter compound $E^B$ ($E^{HOMO}(E^B)$) and the energy level of the highest occupied molecular orbital HOMO($H^B$) of the host compound H ($E^{HOMO}(H^B)$) is between −0.5 eV and 0.5 eV, more preferably between −0.3 eV and 0.3 eV, even more preferably between −0.2 eV and 0.2 eV or even between −0.1 eV and 0.1 eV; and
$E^{LUMO}(H^B) > E^{LUMO}(H^{B2})$) and the difference between the energy level of the lowest unoccupied molecular orbital LUMO(E) of emitter compound $E^B$ ($E^{LUMO}(E^B)$) and the lowest unoccupied molecular orbital LUMO($H^{B2}$) of the at least one further host compound $H^{B2}$ ($E^{LUMO}(H^{B2})$) is between −0.5 eV and 0.5 eV, more preferably between −0.3 eV and 0.3 eV, even more preferably between −0.2 eV and 0.2 eV or even between −0.1 eV and 0.1 eV.

Orbital and excited state energies can be determined either by means of experimental methods known to the person skilled in the art.

Experimentally, the energy of the highest occupied molecular orbital $E^{HOMO}$ is determined by methods known to the person skilled in the art from cyclic voltammetry measurements with an accuracy of 0.1 eV. The energy of the lowest unoccupied molecular orbital $E^{LUMO}$ is calculated as $E^{HOMO}+E^{gap}$, where $E^{gap}$ is determined as follows: For host compounds, the onset of emission of a film with 10% by weight of host in PMMA is used as $E^{gap}$, unless stated otherwise. For emitter compounds, $E^{gap}$ is determined as the energy at which the excitation and emission spectra of a film with 10% by weight of emitter in PMMA cross.

The energy of the first excited triplet state T1 is determined from the onset of emission at low temperature, typically at 77 K. For host compounds, where the first excited singlet state and the lowest triplet state are energetically separated by >0.4 eV, the phosphorescence is usually visible in steady-state spectra in 2-Me-THF. The triplet energy can thus be determined as the onset of the phosphorescence spectra. For TADF emitter compounds, the energy of the first excited triplet state T1 is determined from the onset of the delayed emission spectrum at 77 K, if not otherwise stated measured in a film of poly(methyl methacrylate) (PMMA) with 10% by weight of emitter. Both for host and emitter compounds, the energy of the first excited singlet state S1 is determined from the onset of the emission spectrum, if not otherwise stated measured in a film of poly(methyl methacrylate) (PMMA) with 10% by weight of host or emitter compound.

Herein, any electron transporter may be used as electron transport material $ETM^D$. Exemplarily, compounds poor of electrons such as, e.g., benzimidazoles, pyridines, triazoles, oxadiazoles (e.g., 1,3,4-oxadiazole), phosphinoxides and sulfone, may be used. Exemplarily, an electron transporter $ETM^D$ may also be a star-shaped heterocycle such as 1,3,5-tri(1-phenyl-1H-benzo[d]imidazol-2-yl)phenyl (TPBi). The $ETM^D$ may exemplarily be NBphen (2,9-bis(naphthalen-2-yl)-4,7-diphenyl-1,10-phenanthroline), Alq3 (Aluminum-tris(8-hydroxyquinoline)), TSPO1 (diphenyl-4-triphenylsilylphenyl-phosphinoxide), BPyTP2 (2,7-di(2,2'-bipyridin-5-yl)triphenyle), Sif87 (dibenzo[b,d]thiophen-2-yltriphenylsilane), Sif88 (dibenzo[b,d]thiophen-2-yl) diphenylsilane), BmPyPhB (1,3-bis[3,5-di(pyridin-3-yl) phenyl]benzene) and/or BTB (4,4'-bis-[2-(4,6-diphenyl-1,3,5-triazinyl)]-1,1'-biphenyl). Optionally, the electron transport layer D may be doped with materials such as Liq (8-hydroxyquinolinolatolithium). Optionally, a second electron transport layer may be located between electron transport layer D and the cathode layer K.

Adjacent to the electron transport layer (ETL) D, a cathode layer K may be located. Exemplarily, the cathode layer K may comprise or may consist of a metal (e.g., Al, Au, Ag, Pt, Cu, Zn, Ni, Fe, Pb, LiF, Ca, Ba, Mg, In, W, or Pd) or a metal alloy. For practical reasons, the cathode layer K may also consist of (essentially) intransparent metals such as Mg, Ca or Al. Alternatively or additionally, the cathode layer K may also comprise graphite and or carbon nanotubes (CNTs). Alternatively, the cathode layer K may also consist of nanoscale silver wires.

In particularly preferred embodiment of the present invention, the organic electroluminescent device comprises (or consists (essentially) of), in the sequential order:

(0-1) optionally one or more protecting layers, exemplarily composed of light-transmitting polymers;
(0-2) optionally a light-transmitting substrate, in particular a glass substrate;
(A) an anode layer preferably of a thickness $d^A$ of 50 to 200 nm, exemplarily comprising or consisting of indium tin oxide (ITO);
(A-1) optionally one or more hole injection layers each preferably of a thickness $d^{A-1}$ of 2 to 100 nm, exemplarily each comprising or consisting of NPB (N,N'-nis-(1-naphthalenyl)-N,N'-bis-phenyl-(1,1'-biphenyl)-4,4'-diamine), and/or a star-shaped heterocycle such as tris(4-carbazoyl-9-ylphenyl)amine (TCTA),
(A-2) optionally one or more electron blocking layers preferably of a thickness $d^{A-2}$ of 1 to 10 nm, exemplarily comprising mCBP (3,3-di(9H-carbazol-9-yl)biphenyl),
(B) a light-emitting layer B preferably of a thickness $d^B$ of 5 to 180 nm comprising or (essentially) consisting of):
  (i) 5-99% by weight of at least one host compound $H^B$,
  (ii) 1-50% by weight of at least one TADF emitter compound $E^B$, and optionally
  (iii) 0-94% by weight of one or more further host compounds $H^{B2}$ differing from $H^B$, and optionally
  (iv) 0-94 by weight of one or more solvents,
  wherein the light-emitting layer B does not comprise more than 20% by weight of an electron transport material $ETM^D$, in particular does not comprise $ETM^D$;
(C) an exciton quenching layer C preferably of a thickness $d^C$ of 0.5 to 4 nm comprising or (essentially) consisting of):
  (i) 90-99.95% by weight of the at least one electron transport material $ETM^D$, and
  (ii) 0.05-10% by weight of the at least one fluorescence emitter compound $E^C$.
(D) an electron-transport layer D preferably of a thickness $d^B$ of 5 to 180 nm comprising (or (essentially) consisting of) the at least one electron transport material $ETM^D$; and
(D-1) optionally an electron blocking layer preferably of a thickness $d^{D-1}$ of 0.5 to 10 nm, exemplarily comprising or consisting of Liq (8-hydroxyquinolinolatolithium);
(E) a cathode layer K preferably of a thickness $d^K$ of 10 to 200 nm, exemplarily comprising or consisting of aluminum; and
(E-1) optionally one or more protecting layers, exemplarily composed of (optionally light-transmitting) polymers,
wherein the exciton quenching layer C is adjacent to both the light-emitting layer B and the electron-transport layer D, wherein preferably the at least one emitter compound $E^B$ exhibits an emission with an emission maximum $\lambda_{max}(E^B)$ and a full width at half maximum $FWHM(E^B)$ and the at least one emitter compound $E^C$ exhibits an emission with an emission maximum $\lambda_{max}(E^C)$ and a full width at half maximum $FWHM(E^C)$, wherein $\lambda_{max}(E^B) \geq \lambda_{max}(E^C)$.

An OLED may further, optionally, comprise a protection layer between the electron transport layer (ETL) D and the cathode layer K (which may be designated as electron injection layer (EIL)). This layer may comprise lithium fluoride, caesium fluoride, silver, Liq (8-hydroxyquinolinolatolithium), $Li_2O$, $BaF_2$, MgO and/or NaF.

Optionally, an organic electroluminescent device (e.g., an OLED) may exemplarily be an essentially white organic electroluminescent device. Exemplarily such white organic electroluminescent device may comprise at least one (deep) blue emitter compound and one or more emitter compounds emitting green and/or red light. Then, there may also optionally be energy transmittance between two or more compounds as described above.

The organic electroluminescent device as a whole may also form a thin layer of a thickness of not more than 5 mm, more than 2 mm, more than 1 mm, more than 0.5 mm, more than 0.25 mm, more than 100 µm, or more than 10 µm.

An organic electroluminescent device (e.g., an OLED) may be a small-sized (e.g., having a surface not larger than 5 mm$^2$, or even not larger than 1 mm$^2$), medium-sized (e.g., having a surface in the range of 0.5 to 20 cm$^2$), or a large-sized (e.g., having a surface larger than 20 cm$^2$). An organic electroluminescent device (e.g., an OLED) according to the present invention may optionally be used for generating screens, as large-area illuminating device, as luminescent wallpaper, luminescent window frame or glass, luminescent label, luminescent poser or flexible screen or display. Next to the common uses, an organic electroluminescent device (e.g., an OLED) may exemplarily also be used as luminescent films, "smart packaging" labels, or innovative design elements. Further they are usable for cell detection and examination (e.g., as bio labelling).

One of the main purposes of an organic electroluminescent device is the generation of light. Thus, the present invention further relates to a method for generating light of a desired wavelength range, comprising the step of providing an organic electroluminescent device according to any the present invention.

Accordingly, a further aspect of the present invention relates to a method for generating light of a desired wavelength range, comprising the steps of
(i) providing an organic electroluminescent device according to the present invention; and
(ii) applying an electrical current to said organic electroluminescent device.

Accordingly, the present invention also relates to a method for generating blue, green, yellow, orange and red light.

As used herein, if not defined more specifically in a particular context, the designation of the colors of emitted and/or absorbed is as follows:
violet: wavelength range of >380-420 nm;
deep blue: wavelength range of >420-470 nm;
sky blue: wavelength range of >470-500 nm;
green: wavelength range of >500-560 nm;
yellow: wavelength range of >560-580 nm;
orange: wavelength range of >580-620 nm;
red: wavelength range of >620-800 nm.

With respect to emitter compounds, such colors refer to the emission maximum. Therefore, exemplarily, a deep blue emitter has an emission maximum in the range of from 420 to 470 nm, a sky blue emitter has an emission maximum in the range of from 470 to 500 nm, a green emitter has an emission maximum in a range of from 500 to 560 nm, a red emitter has an emission maximum in a range of from 620 to 800 nm.

A deep blue emitter may preferably have an emission maximum of below 475 nm, more preferably below 470 nm, even more preferably below 465 nm or even below 460 nm. It will typically be above 420 nm, preferably above 430 nm, more preferably above 440 nm.

Accordingly, a further embodiment of the present invention relates to an OLED, which exhibits an external quantum efficiency at 1000 cd/m$^2$ of more than 5%, more preferably of more than 8%, more preferably of more than 10%, even more preferably of more than 13% or even more than 20% and/or exhibits an emission maximum between 420 nm and 500 nm, preferably between 430 nm and 490 nm, more preferably between 440 nm and 480 nm, even more preferably between 450 nm and 470 nm and/or exhibits a LT80 value at 500 cd/m$^2$ of more than 100 h, preferably more than 200 h, more preferably more than 400 h, even more preferably more than 750 h or even more than 1000 h.

A further embodiment of the present invention relates to an OLED, which emits light at a distinct color point. According to the present invention, the OLED emits light with a narrow emission band (small full width at half maximum (FWHM)). In one embodiment, the OLED according to the invention emits light with a FWHM of the main emission peak of below 0.50 eV, more preferably of below 0.46 eV, even more preferably of below 0.43 eV or even below 0.41 eV.

Accordingly, a further embodiment of the present invention relates to an OLED, whose emission exhibits a CIE$_y$ color coordinate of below 0.25, preferably below 0.20, more preferably below 0.15 or even more preferably below 0.13 or even below 0.1.

Cyclic Voltammetry

Cyclic voltammograms of solutions having concentration of 10-3 mol/l of the organic molecules in dichloromethane or a suitable solvent and a suitable supporting electrolyte (e.g. 0.1 mol/l of tetrabutylammonium hexafluorophosphate) are measured. The measurements are conducted at room temperature and under nitrogen atmosphere with a three-electrode assembly (Working and counter electrodes: Pt wire, reference electrode: Pt wire) and calibrated using FeCp$_2$/FeCp$_2^+$ as internal standard. HOMO data was corrected using ferrocene as internal standard against SCE.

Density Functional Theory Calculation

Molecular structures are optimized employing the BP86 functional and the resolution of identity approach (RI). Excitation energies are calculated using the (BP86) optimized structures employing Time-Dependent DFT (TD-DFT) methods. Orbital and excited state energies are calculated with the B3LYP functional. Def2-SVP basis sets (and a m4-grid for numerical integration were used. The Turbomole program package was used for all calculations.

Photophysical Measurements

Sample pretreatment: Spin-coating
Apparatus: Spin150, SPS euro.
The sample concentration is 10 mg/ml, dissolved in a suitable solvent.
Program: 1) 3 s at 400 U/min, 20 s at 1000 U/min at 1000 Upm/s. 3) 10 s at 4000 U/min at 1000 Upm/s. After coating, the films are tried at 70° C. for 1 min.

Photoluminescence Spectroscopy and TCSPC (Time-Correlated Single-Photon Counting)

Steady-state emission spectroscopy is recorded using a Horiba Scientific, Modell FluoroMax-4 equipped with a 150 W Xenon-Arc lamp, excitation- and emissions monochromators and a Hamamatsu R928 photomultiplier and a time-correlated single-photon counting option. Emissions and excitation spectra are corrected using standard correction fits.

Excited state lifetimes are determined employing the same system using the TCSPC method with FM-2013 equipment and a Horiba Yvon TCSPC hub.

Excitation Sources:
NanoLED 370 (wavelength: 371 nm, puls duration: 1.1 ns)
NanoLED 290 (wavelength: 294 nm, puls duration: <1 ns)
SpectraLED 310 (wavelength: 314 nm)
SpectraLED 355 (wavelength: 355 nm).

Data analysis (exponential fit) was done using the software suite DataStation and DAS6 analysis software. The fit is specified using the chi-squared-test.

Photoluminescence Quantum Yield Measurements

For photoluminescence quantum yield (PLQY) measurements an Absolute PL Quantum Yield Measurement C9920-

03G system (Hamamatsu Photonics) is used. Quantum yields and CIE coordinates were determined using the software U6039-05 version 3.6.0.

Emission maxima are given in nm, quantum yields φ in % and CIE coordinates as x,y values.

PLQY was determined using the following protocol:
1) Quality assurance: Anthracene in ethanol (known concentration) is used as reference
2) Excitation wavelength: the absorption maximum of the organic molecule is determined and the molecule is excited using this wavelength
3) Measurement Quantum yields are measured for sample of solutions or films under nitrogen atmosphere. The yield is calculated using the equation:

$$\Phi_{PL} = \frac{n_{photon}, \text{emited}}{n_{photon}, \text{absorbed}} = \frac{\int \frac{\lambda}{hc}[\text{Int}_{emitted}^{sample}(\lambda) - \text{Int}_{absorbed}^{sample}(\lambda)]d\lambda}{\int \frac{\lambda}{hc}[\text{Int}_{emitted}^{reference}(\lambda) - \text{Int}_{absorbed}^{reference}(\lambda)]d\lambda}$$

wherein $n_{photon}$ denotes the photon count and Int. the intensity.

Production and Characterization of Organic Electroluminescence Devices

Via vacuum-deposition methods OLED devices comprising organic molecules according to the invention can be produced. If a layer contains more than one compound, the weight-percentage of one or more compounds is given in %. The total weight-percentage values amount to 100%, thus if a value is not given, the fraction of this compound equals to the difference between the given values and 100%.

The not fully optimized OLEDs are characterized using standard methods and measuring electroluminescence spectra, the external quantum efficiency (in %) in dependency on the intensity, calculated using the light detected by the photodiode, and the current. The OLED device lifetime is extracted from the change of the luminance during operation at constant current density. The LT50 value corresponds to the time, where the measured luminance decreased to 50% of the initial luminance, analogously LT80 corresponds to the time point, at which the measured luminance decreased to 80% of the initial luminance, LT 95 to the time point, at which the measured luminance decreased to 95% of the initial luminance etc.

Accelerated lifetime measurements are performed (e.g. applying increased current densities). Exemplarily LT80 values at 500 cd/m$^2$ are determined using the following equation:

$$LT80\left(500\frac{cd^2}{m^2}\right) = LT80(L_0)\left(\frac{L_0}{500\frac{cd^2}{m^2}}\right)^{1.6}$$

wherein $L_0$ denotes the initial luminance at the applied current density.

The values correspond to the average of several pixels (typically two to eight), the standard deviation between these pixels is given. The data series for one OLED pixel are shown.

Examples D1 and D2

OLED device D1 and D2 can be prepared using the following layer structures.

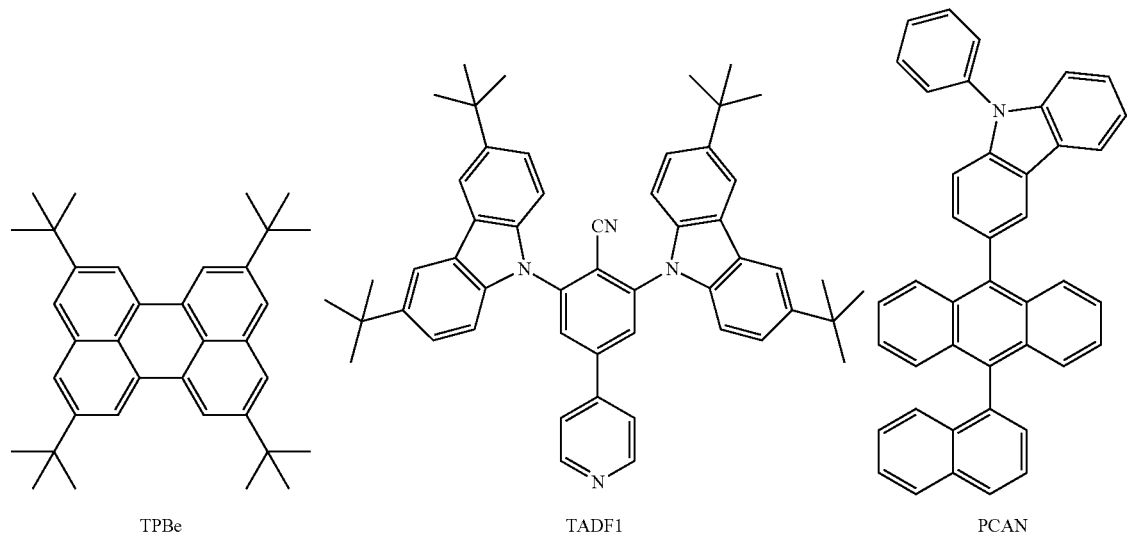

TPBe     TADF1     PCAN

| Layer | Thickness | D1 | D2 |
|---|---|---|---|
| 9 | 100 nm | Al | Al |
| 8 | 2 nm | Liq | Liq |
| 7 = D | 30 nm | NBPhen | NBPhen |
| 6 = C | 10 nm | NBPhen (97%): TPBe (3%) | NBPhen (97%): PCAN (3%) |
| 5 = B | 30 nm | mCBP (80%): TADF1 (20%) | mCBP (80%): TADF1 (20%) |
| 4 | 8 nm | mCBP | mCBP |
| 3 | 10 nm | TCTA | TCTA |
| 2 | 62 nm | NPB | NPB |
| 1 | 130 nm | ITO | ITO |
| Substrate | | glass | glass |

TABLE 1

Energies of the lowermost singlet state, the lowermost triplet states, the lowest unoccupied molecular orbital (LUMO) and highest occupied molecular orbital (HOMO).

|  | NBPhen | TPBe | PCAN | mCBP | TADF1 |
|---|---|---|---|---|---|
| $E^{LUMO}$ [eV] | −2.90 |  |  | −2.34 | −3.16 |
| $E^{HOMO}$ [eV] | −6.23 |  | −5.83 | −6.02 | −6.07 |
| S1 [eV] |  | 2.82 | 3.05 |  | 2.87 |
| T1 [eV] | 2.39 | 1.46 (DFT) | 1.61 (DFT) | 2.95 | 2.79 |

(DFT) indicates calculated values.

The invention claimed is:

1. An organic electroluminescent device comprising:
   (A) an anode layer A;
   (B) a light-emitting layer B comprising at least one host material $H^B$ and at least one emitter $E^B$, wherein the light-emitting layer B does not comprise more than 20% by weight of an electron transport material $ETM^D$;
   (C) an exciton quenching layer C comprising at least one emitter $E^C$ and at least 80% by weight of at least one electron transport material $ETM^D$;
   (D) an electron-transport layer D comprising at least one electron transport material $ETM^D$; and
   (E) a cathode layer K,
   wherein the layers are arranged in the sequential order in the following order (A)-(B)-(C)-(D)-(E), wherein optionally one or more additional layers may be present between the anode layer A and the light-emitting layer B, between electron-transport layer D and the cathode layer K, or each between the anode layer A and the light-emitting layer B and between electron-transport layer D and the cathode layer K, and
   wherein the exciton quenching layer C is adjacent to both the light-emitting layer B and the electron-transport layer D.

2. The organic electroluminescent device according to claim 1, wherein said organic electroluminescent device is a device selected from the group consisting of an organic light emitting diode, a light emitting electrochemical cell, and a light-emitting transistor.

3. The organic electroluminescent device according to claim 1, wherein the at least one emitter compound $E^B$ is a thermally activated delayed fluorescence (TADF) emitter.

4. The organic electroluminescent device according to claim 1, wherein the at least one emitter compound $E^C$ is a fluorescence emitter.

5. The organic electroluminescent device according to claim 1, wherein the exciton quenching layer C comprises:
   (i) 90-99.95% by weight of the at least one electron transport material $ETM^D$;
   (ii) 0.05-10% by weight of the at least one emitter compound $E^C$.

6. The organic electroluminescent device according to claim 1, wherein the light-emitting layer B comprises:
   (i) 5-99% by weight of at least one host compound $H^B$;
   (ii) 1-50% by weight of at least one emitter compound $E^B$; and optionally
   (iii) 0-94% by weight of one or more further host compounds $H^{B2}$ differing from $H^B$; and optionally
   (iv) 0-94 by weight of one or more solvents.

7. The organic electroluminescent device according to claim 1, wherein the electron-transport layer D comprises more than 89.9% by weight, referred to the electron transporting components, of at least one electron transport material $ETM^D$.

8. The organic electroluminescent device according to claim 1, wherein the at least one emitter compound $E^B$ exhibits an emission with an emission maximum $\lambda_{max}(E^B)$ and a full width at half maximum $FWHM(E^B)$ and the at least one emitter compound $E^C$ exhibits an emission with an emission maximum $\lambda_{max}(E^C)$ and a full width at half maximum $FWHM(E^C)$, wherein $$\lambda_{max}(E^B) \geq \lambda_{max}(E^C).$$

9. The organic electroluminescent device according to claim 8, wherein $$\lambda_{max}(E^B) \geq \lambda_{max}(E^C) \geq [\lambda_{max}(E^B) - FWHM(E^B)].$$

10. The organic electroluminescent device according to claim 9, wherein $$\lambda_{max}(E^B) \geq \lambda_{max}(E^C) \geq [\lambda_{max}(E^B) - FWHM(E^B)/2].$$

11. The organic electroluminescent device according to claim 1, wherein the at least one emitter compound $E^C$ has a lowest unoccupied molecular orbital $LUMO(E^C)$ having an energy $E^{LUMO}(E^C)$ and the at least one electron transport material $ETM^D$ has a lowest unoccupied molecular orbital $LUMO(ETM^D)$ having an energy $E^{LUMO}(ETM^D)$, wherein $$E^{LUMO}(E^C) \geq E^{LUMO}(ETM^D).$$

12. The organic electroluminescent device according to claim 11, wherein $$E^{LUMO}(E^C) - E^{LUMO}(ETM^D) \leq 0.3 \text{ eV}.$$

13. The organic electroluminescent device according to claim 1, wherein the at least one emitter compound $E^C$ has a highest occupied molecular orbital $HOMO(E^C)$ having an energy $E^{HOMO}(E^C)$ and the at least one electron transport material $ETM^D$ has a highest occupied molecular orbital $HOMO(ETM^D)$ having an energy $E^{HOMO}(ETM^D)$, wherein $$E^{HOMO}(E^C) \geq E^{HOMO}(ETM^D).$$

14. The organic electroluminescent device according to claim 1, wherein the at least one emitter compound $E^C$ has a highest occupied molecular orbital $HOMO(E^C)$ having an energy $E^{HOMO}(E^C)$ and the at least one emitter compound $E^B$ has a highest occupied molecular orbital $HOMO(E^B)$ having an energy $E^{HOMO}(E^B)$, wherein $$E^{HOMO}(E^C) \geq E^{HOMO}(E^B).$$

15. The organic electroluminescent device according to claim 1, wherein the at least one emitter compound $E^C$ has a lowest excited singlet state energy level $S1(E^C)$ and the at least one electron transport material $ETM^D$ has a lowest excited singlet state energy level $S1(ETM^D)$, wherein $$S1(ETM^D) \geq S1(E^C).$$

16. The organic electroluminescent device according to claim 1, wherein the at least one emitter compound $E^C$ has a lowest excited triplet state energy level $T1(E^C)$ and has a lowest excited singlet state energy level $S1(E^C)$ and the at least one electron transport material $ETM^D$ has a lowest excited triplet state energy level $T1(ETM^D)$, wherein $$T1(ETM^D) \geq T1(E^C),$$

and $$S1(E^C) > T1(E^C) \geq S1(E^C)/2.$$

17. The organic electroluminescent device according to claim 1, wherein the at least one electron transport material $ETM^D$ is NBPhen.

18. The organic electroluminescent device according to claim 1, wherein the light-emitting layer B has a thickness $d^B$ and the exciton quenching layer C has a thickness $d^C$ and wherein $d^B > d^C$.

19. The organic electroluminescent device according to claim 18, wherein the light-emitting layer B has a thickness $d^B$ between 5 and 180 nm and the exciton quenching layer C has a thickness $d^C$ between 0.5 and 4 nm.

* * * * *